(12) United States Patent
Kawakubo

(10) Patent No.: US 6,242,298 B1
(45) Date of Patent: Jun. 5, 2001

(54) SEMICONDUCTOR MEMORY DEVICE HAVING EPITAXIAL PLANAR CAPACITOR AND METHOD FOR MANUFACTURING THE SAME

(75) Inventor: Takashi Kawakubo, Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/143,400

(22) Filed: Aug. 28, 1998

(30) Foreign Application Priority Data

Aug. 29, 1997 (JP) .................................. 9-234991
Jan. 30, 1998 (JP) ................................. 10-019578

(51) Int. Cl.$^7$ .............................................. H01L 21/8242
(52) U.S. Cl. ......................... 438/239; 438/250; 438/253; 438/393
(58) Field of Search .................................... 438/239, 241, 438/243, 244, 245, 248, 249, 250, 253, 254, 256, 393, 455, 458, 459, 462, 464; 257/299, 304, 295; 365/145, 149

(56) References Cited

U.S. PATENT DOCUMENTS

| | | | |
|---|---|---|---|
| 5,418,177 | * 5/1995 | Choi ...................................... | 438/155 |
| 5,427,973 | * 6/1995 | Satoh et al. .......................... | 438/155 |
| 5,602,052 | * 2/1997 | Beasom .............................. | 438/384 |
| 5,612,082 | * 3/1997 | Azuma et al. ...................... | 427/96 |
| 5,796,648 | 8/1998 | Kawakubo et al. . | |
| 5,940,676 | * 8/1999 | Fazan et al. ............................ | 438/3 |
| 5,985,739 | * 11/1999 | Plettner et al. ........................ | 438/455 |
| 5,986,301 | * 11/1999 | Fukushima et al. ................. | 257/306 |

FOREIGN PATENT DOCUMENTS 4-216667  8/1992  (JP) .
4-291956  10/1992  (JP) .

OTHER PUBLICATIONS

Toshiyuki Nishihara, et al., "A Buried Capacitor DRAM Cell With Bonded SOI for 256M and 1GBIT DRAMS", IEEE International Electron Device Meeting Technical Digest, Dec. 1992, pp. 803–806.

* cited by examiner

Primary Examiner—Carl Whitehead, Jr.
Assistant Examiner—Toniae M. Thomas
(74) Attorney, Agent, or Firm—Oblon, Spivak, McClelland, Maier & Neustadt, P.C.

(57) ABSTRACT

A semiconductor memory device includes a memory cell constructed from an epitaxial planar capacitor and a switching transistor. The epitaxial planar capacitor includes a first and a second electrode layers and a dielectric thin film composed of ferroelectric or high dielectric material sandwiched between the first and the second electrode layers. Each of the constituent films of the epitaxial planar capacitors is epitaxial grown on a first main surface of a thin film semiconductor layer. And the switching transistor is formed in a second main surface of the thin film semiconductor layer. The second main surface faces to the first main surface. The memory cells are arranged in a matrix form to construct FRAM, DRAM or another semiconductor memory device. Employing perovskite crystal thin film serving as the dielectric thin film, a memory cell having a large capacity per unit area and high reliability is obtained. Then an ultrahigh density integration of semiconductor memory device is provided. The perovskite crystal is represented by a general formula $ABO_3$, wherein A is at least one selected from the group consisting of Ba, Sr and Ca, and B is at least one selected from the group consisting of Ti, Zr, Hf, Sn, $(Mg_{1/3}Nb_{2/3})$, $(Mg_{1/3}Ta_{2/3})$, $(Zn_{1/3}Nb_{2/3})$, $(Zn_{1/3}Ta_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Nb_{1/2})$, $(Mn_{1/2}Nb_{1/2})$, $(Sc_{1/2}Ta_{1/2})$, $(Fe_{1/2}Nb_{1/2})$, $(In_{1/2}Nb_{1/2})$, $(Fe_{1/2}Ta_{1/2})$, $(Cd_{1/3}Nb_{2/3})$, $(Co_{1/3}Nb_{2/3})$, $(Ni_{1/3}Nb_{2/3})$, $(Co_{1/3}Ta_{2/3})$, $(Ni_{1/3}Ta_{2/3})$.

15 Claims, 59 Drawing Sheets

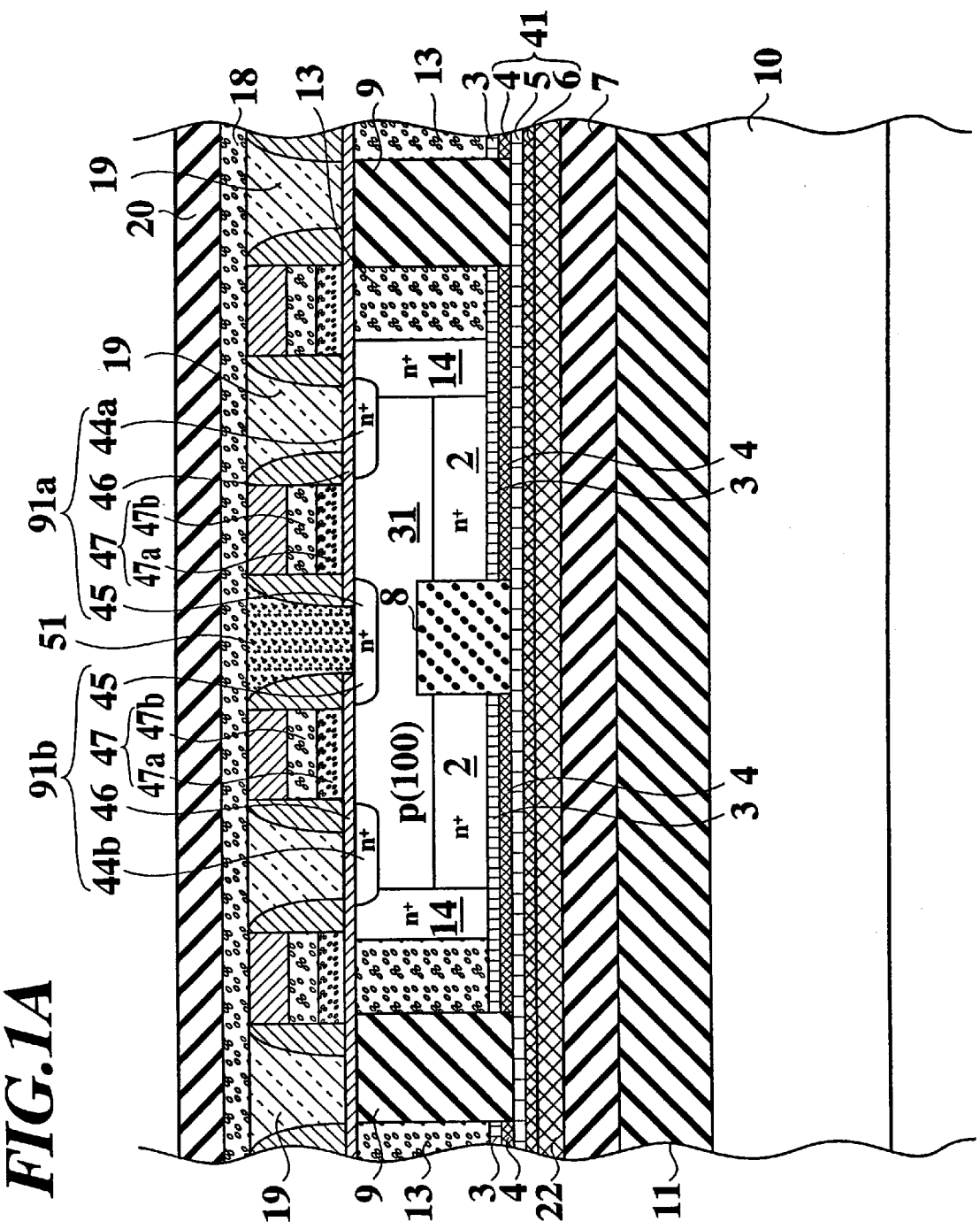

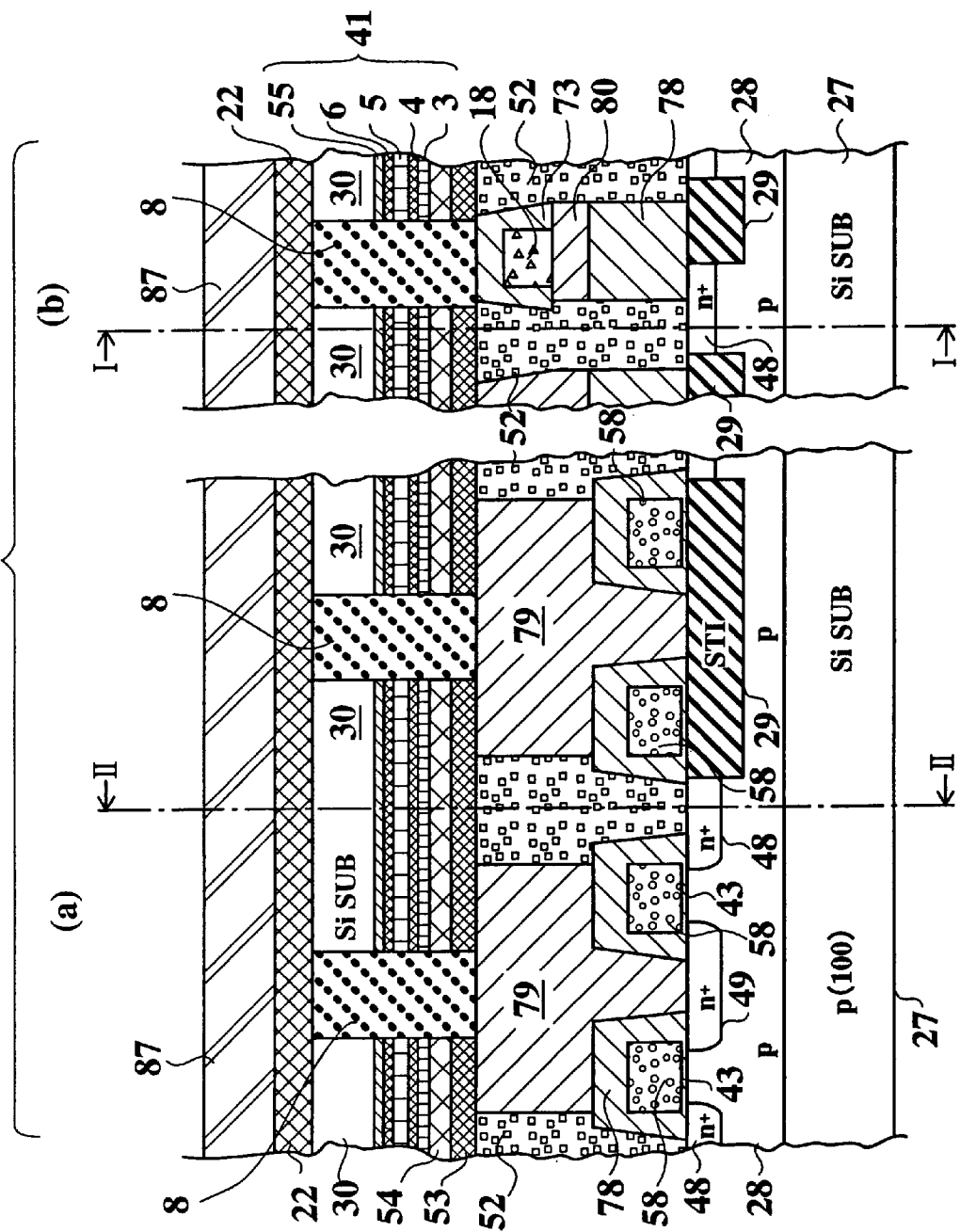

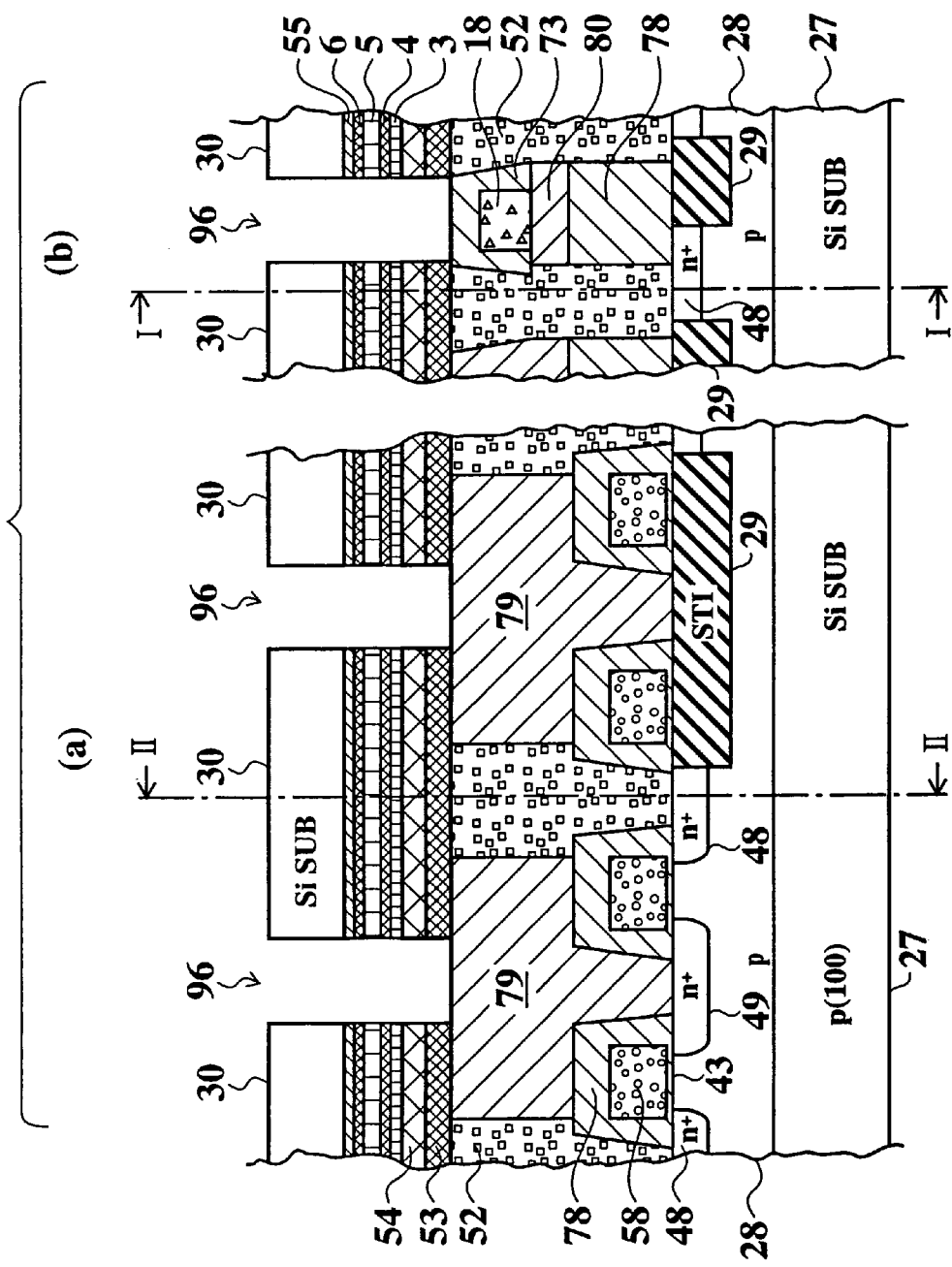

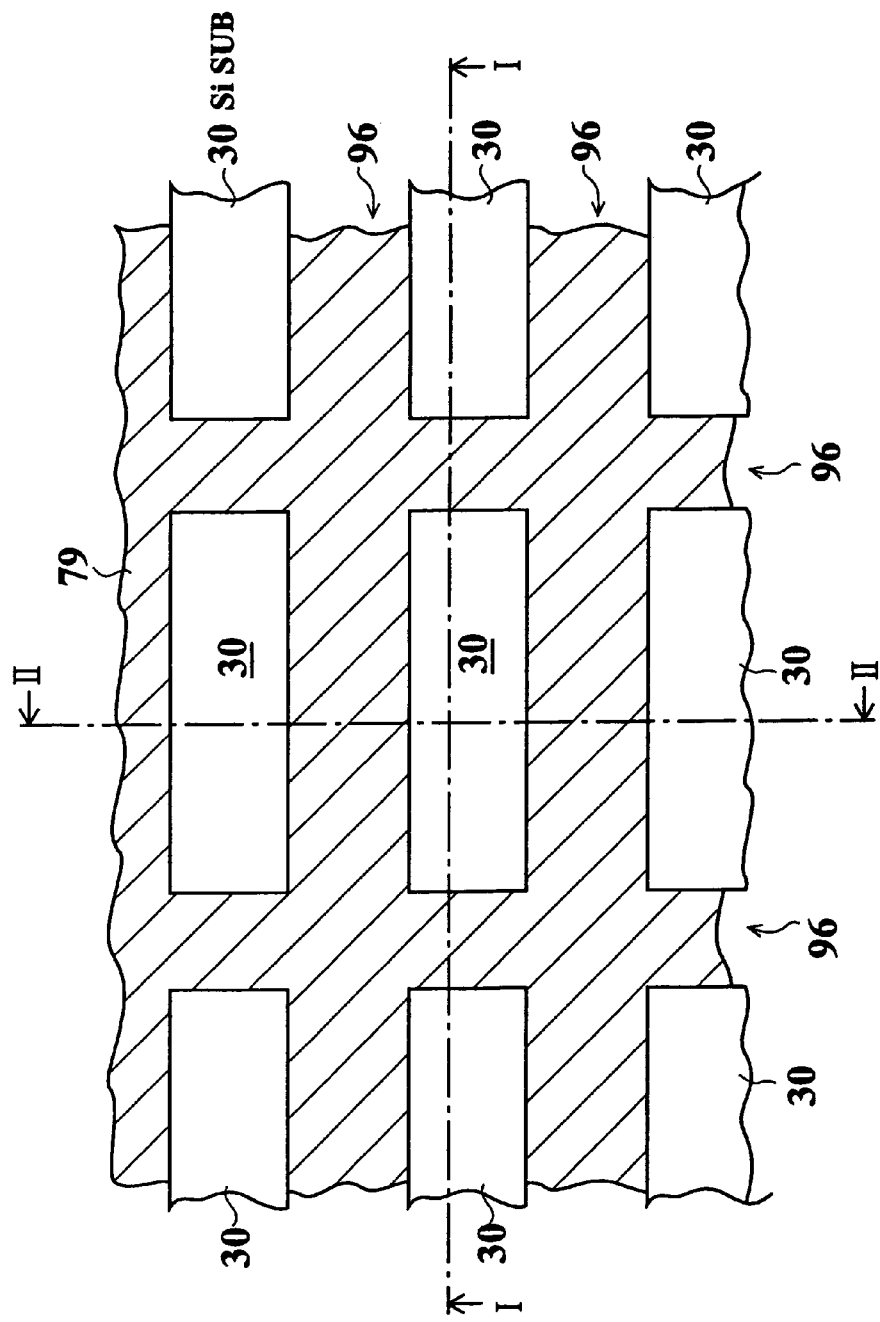

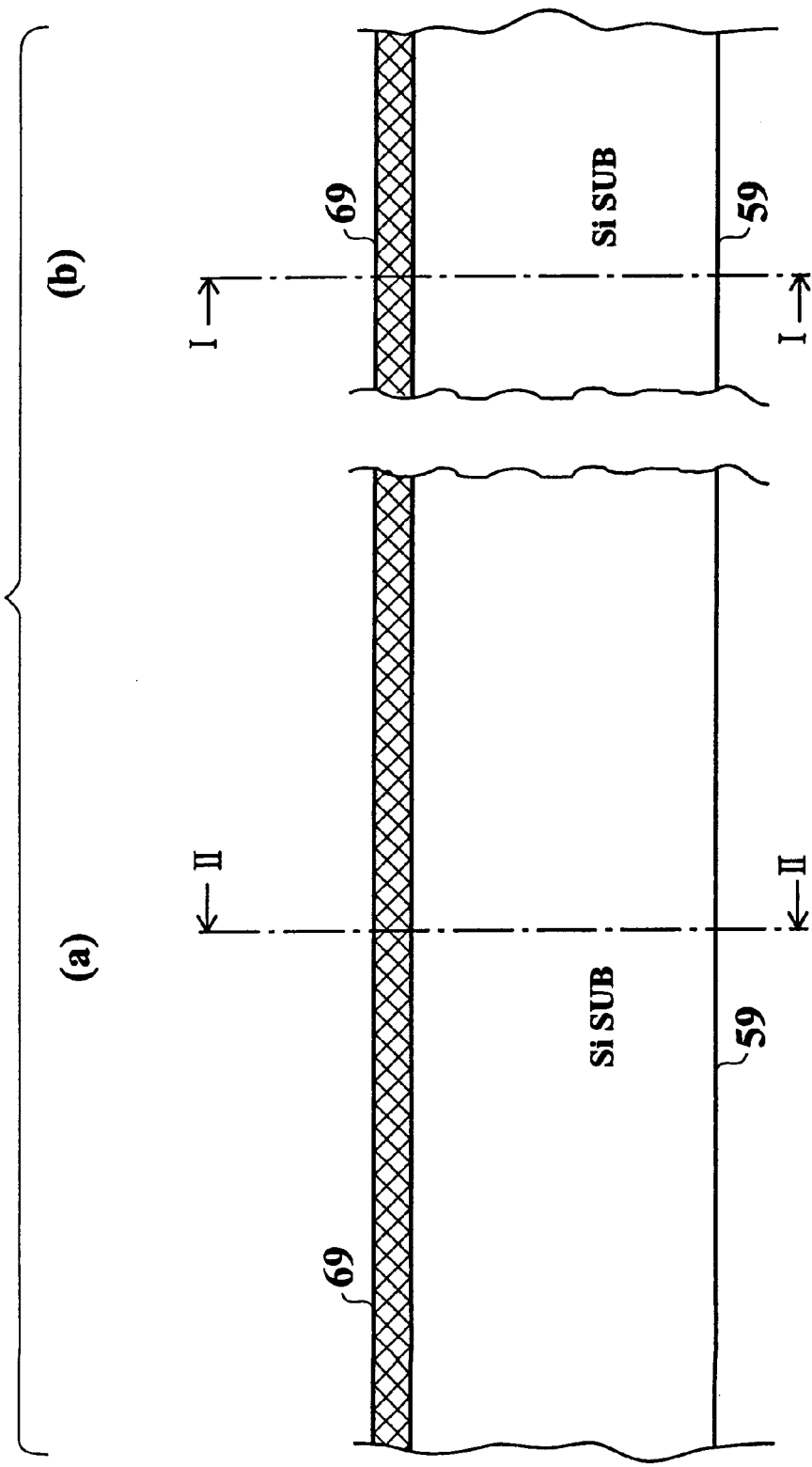

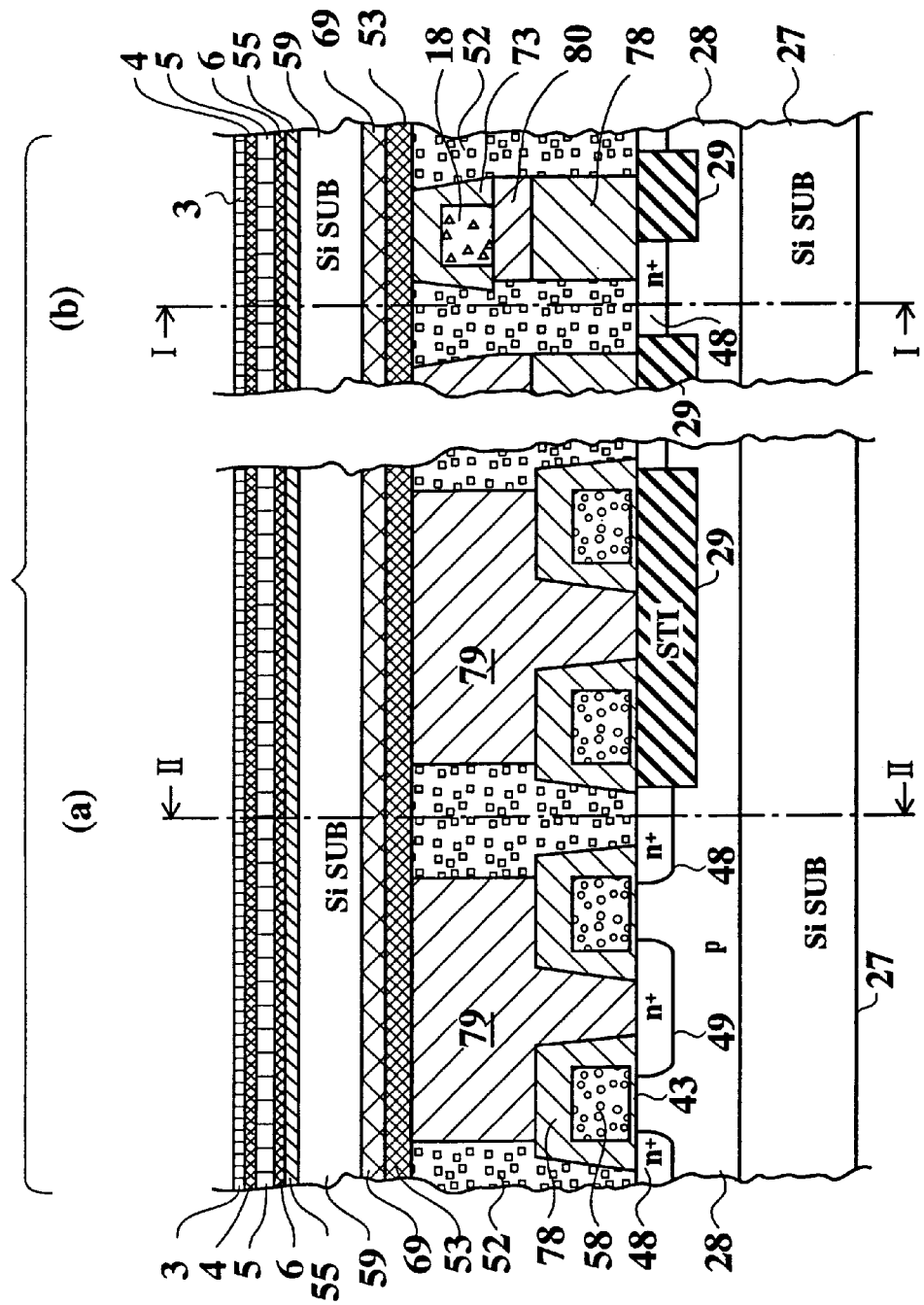

SEMICONDUCTOR MEMORY DEVICE HAVING EPITAXIAL PLANAR CAPACITOR AND METHOD FOR MANUFACTURING THE SAME

BACKGROUND OF THE INVENTION

1. Field of the Invention

The present invention relates to a semiconductor memory device having an ultrahigh density of integration above 1 gigabit, and more particularly to a semiconductor memory device using an epitaxial planar capacitor possessing a dielectric thin film made of dielectric material having a perovskite-type structure or another crystal structure.

2. Description of the Related Art

Recently, memory devices (FRAM: Ferroelectric Random Access Memory) using ferroelectric thin films for storage capacitors are developed and some of them have practical application. Ferroelectric random access memory (FRAM) is a nonvolatile memory and has a feature that the contents of memory are not lost even after cutting off the electric power supply. Furthermore, it has a feature that high speed accessing as fast as DRAM are possible, owing to fast reversion of the spontaneous polarization, if the ferroelectric film is sufficiently thin. FRAM is also suitable to growing up of the capacitance because one unit memory cell can be formed by one switching transistor (1–T) and one ferroelectric capacitor.

A ferroelectric thin film suitable to a ferroelectric memory is required to have a large remnant polarization and low temperature dependence thereof and to be capable of retention of the remnant polarization for a long time. Lead zirconate titanate (PZT) is now mainly used as a ferroelectric material. PZT is a solid solution of lead zirconate (PbZrO$_3$) and lead titanate (PbTiO$_3$) in which mole fraction of near 1:1 is considered to produce good memory medium owing to large spontaneous polarization and possibility of reversion even at low electric field. PZT has a relatively high transition temperature between ferroelectric and paraelectric phases(Curie temperature) of above 300° C. and so it is rare to lose the memorized information by heat in the temperature range in which the conventional electronic circuits are used.

However, it is known that formation of high quality thin films of PZT is difficult. The reason is, first, accurate control of the stoichiometric composition is difficult because lead which is a main component of PZT is vaporized above 500° C. and second, though the ferroelectricity appears when PZT forms a perovskite-type structure, the structure called "pyrochlore" is more easily obtained than perovskite structure. In addition, preventing diffusion of the main component, lead, into silicon is difficult when a PZT thin film is applied to a silicon device.

Besides PZT, barium titanate (BaTiO$_3$) is known to be a representative ferroelectric substance. It is known that similarly to PZT, barium titanate has a perovskite-type structure the Curie temperature of which is about 120° C. Control of the stoichiometric composition is relatively easy in the formation of barium titanate thin films because Ba is harder to vaporize than Pb. Further, barium titanate rarely crystallizes into a crystal structure other than perovskite-type structure. In spite of these advantages, epitaxial planar capacitor of barium titanate is not so much investigated as a storage capacitor for ferroelectric memory device. The reason is the weak remnant polarization and the large temperature dependence thereof, compared with PZT. A cause of these facts is the low Curie temperature (120° C.) of barium titanate resulting in the possibility of losing the memory contents when the ferroelectric memory is exposed to high temperatures above 100° C. Additionally, barium titanate shows large temperature dependence of the remnant polarization even in the temperature range (below 85° C.) usually used for electronic circuits, resulting in an unstable operation. Hence, the epitaxial planar capacitor using ferroelectric thin film composed of barium titanate is usually considered to be unsuitable to use for the memory medium of a ferroelectric memory device.

In order to solve the above-mentioned problems, the present inventors studied the structure of epitaxial planar capacitors and investigated various materials. And as a result the present inventors selected a single crystal substrate such as strontium titanate (STO) or magnesium oxide (MgO), a bottom electrode such as strontium ruthenate (SrRuO$_3$, hereafter denote simply as SRO), and a dielectric material (for example, barium strontium titanate, Ba$_x$Sr$_{1-x}$TiO$_3$, hereafter denoted simply as BST) having a lattice constant near and a little larger than that of (100) plane of the bottom electrode layer, as a ferroelectric thin film used for an epitaxial planar capacitor. Then BST was grown epitaxially in the direction of c-axis which is a polarization axis, using a RF magnetron sputtering method. Misfit dislocations are relatively hard to be generated in the growing process of thin films by the RF magnetron sputtering method. As a result, it was found that even in the dielectric thin film having relatively large film thickness above 200 nm, the lattice constant can be retained in such a state as elongating in the direction of thickness (c-axis direction) and shrinking in the direction of lattice plane (a-axis direction) relative to an original one. Consequently, it was ascertained by the present inventors that a ferroelectric thin film such that the Curie temperature is shifted to higher temperature, remnant polarization near room temperature is large and sufficiently large remnant polarization can be kept at temperatures up to about 85° C. is realizable. For example, it was ascertained experimentally that desirable ferroelectric properties in practical application are realizable by using for example, a conductive perovskite crystal, SRO, (lattice constant a=0.393 nm) as the bottom electrode layer of epitaxial planar capacitor and using Ba$_x$Sr$_{1-x}$TiO$_3$ in the compositional region of x=0.30–0.90 as a dielectric substance, owing to an appearance of ferroelectricity even in a compositional region (x≦0.7) in which the ferroelectricity is not usually expected to appear at room temperature and further owing to further increase of the Curie temperature which is originally above room temperature, in the compositional region showing ferroelectricity (x>0.7) at room temperature. In the same way, it was ascertained by the present inventors that a capacitor having a large dielectric constant reaching to for example, more than 800 and a film thickness of 20 nm, by using a conductive perovskite crystal, SRO, as a bottom electrode layer and Ba$_x$Sr$_{1-x}$TiO$_3$ in the compositional region x=0.10–0.40 as a dielectric substance. The dielectric constant is several times larger than the value of about 200 in the capacitor with the same film thickness made by polycrystalline film. Such a large dielectric constant is very desirable on the formation of DRAM.

In any case, a three-dimensional bonded structure, wherein a miniaturized transistor and a capacitor capable of offering a fixed capacitance even with a small area are three-dimensionally bonded, is essential for accomplishing a semiconductor memory device with ultrahigh integration density of over 1 gigabit. As already explained, an epitaxial planar capacitor is promising as a capacitor capable of offering a required capacitance even with a small area. A structure wherein a switching transistor, formed on a semiconductor substrate, is bonded with an epitaxial planar capacitor, deposited on an oxide substrate such as magnesium oxide (MgO) or strontium titanate(STO) is known as a method of three-dimensionally stacking a switching transistor and an epitaxial planar capacitor. For instance, Japanese Patent Laid-Open Application Publication No. 8-139292 (see FIG. 19G of this publication) and Japanese Patent Laid-Open Publication No. 8-227980 (see FIGS. 1 and 2) disclosed a structure for a semiconductor device wherein a semiconductor substrate was bonded to an oxide substrate such as MgO or STO. By growing on the oxide substrate, the conventional semiconductor memory device using the oxide substrate utilized stress, caused by mismatch between the lattice constants of the oxide substrate and the dielectric thin film, to shift the ferroelectric Curie temperature toward the high temperature side, thereby obtaining ferroelectric properties at room temperature. In other words, an oxide substrate was essential in order to artificially control the c axis length of BSTO, with BSTO as warped lattice using "epitaxial effect".

However, this phenomenon lead to the following disadvantages of the semiconductor memory device using an oxide substrate:

(1) Although a silicon wafer (semiconductor substrate) with a diameter greater than 8 inches can easily be obtained commercially, it is extremely difficult to obtain an oxide substrate, such as an MgO substrate or an STO substrate, with a diameter greater than 3 inches even at the research level. If a wafer with a diameter less than 3 inches is used as a base substrate, mass production of the semiconductor will be difficult. Therefore, a semiconductor memory device using an oxide substrate has a high production cost per chip.

(2) A semiconductor substrate has a thermal expansion coefficient of 2.5 ppm/° C., but an MgO substrate and an STO substrate have a thermal expansion coefficient of 9 ppm/° C. Therefore, after bonding at for instance 500° C., the oxide substrate would suffer a tensile stress of greater than several kg/mm$^2$ when cooled to room temperature and would consequently split. Even when the oxide substrate did not actually split, very considerable bending would be caused. Since semiconductor memory devices of the gigabit generation require ultrafine processing at the submicrometer to nanometer levels, when bending of the substrate occurs, subsequent lithography becomes impossible.

Furthermore, in addition to these inherent disadvantages when using an oxide substrate, the semiconductor memory device disclosed in Japanese Patent Laid-Open Publication Nos. 8-139292 and 8-227980 have the following disadvantages:

(3) The surface of the semiconductor substrate comprises a metal electrode layer portion (first bonding layer) and an insulating portion. Similarly, the surface of the oxide substrate which faces the semiconductor substrate comprises a metal electrode layer portion (second bonding layer) and an insulating portion. Conditions for connecting metal electrode layer portions are generally different from conditions for connecting insulating portions. Therefore, it is difficult to evenly stick the two substrates under same bonding conditions for these metal electrode layer portions and insulating portions.

(4) The pattern of the electrode layer portion (source region) of a switching transistor formed on the semiconductor substrate and the pattern of the electrode layer portion (first electrode layer, upper first barrier metal layer) of a capacitor formed on the oxide substrate must be aligned and connected in a one-to-one arrangement. However, as described above, it is virtually impossible to match patterns, which have been formed on substrates having different thermal expansion coefficients, with submicrometer precision over the entire wafer surfaces at high temperature.

On the other hand, use of a dielectric planar capacitor grown epitaxially for semiconductor memory such as FRAM and DRAM or another device is attempted and examined. A typical known example is a method as follows: on a semiconductor substrate wherein a switching transistor is formed previously, an opening portion (contact hole) is formed on the electrode layer of a switching transistor through an interlayer insulating film covering the switching transistor and a single crystalline silicon plug is formed in the contact hole by selective epitaxial growth from vapor phase or solid phase epitaxial growth from amorphous state and an epitaxial planar capacitor is formed thereon (U.S. Pat. No. 5,739,563) (hereafter denoted "a first technique"). It is capable of forming a stacked epitaxial planar capacitor just above an electrode layer of a switching transistor by this method. Hence, it can be said that this structure is basically one of the most suitable structures to high density integration.

As another fabrication method, the method using SOI substrate is proposed. This is such a method(hereafter denote "a second technique") that a second semiconductor substrate is stuck on a first semiconductor substrate whereon an epitaxial planar capacitor is formed previously and a thin film is made by polishing. And a contact plug for connecting an electrode layer of a capacitor on a first silicon plug to an electrode layer on a second semiconductor substrate is formed. Further, a switching transistor is formed on a second semiconductor substrate. In this second technique, the formation is easy as an epitaxial planar capacitor and a switching transistor are formed on separate substrates and the structure is suitable to high density integration as a switching transistor can be stacked just upon an epitaxial planar capacitor.

Semiconductor memory devices for gigabit levels are now becoming important. However, in a semiconductor memory device with high density of integration of 4, 16 or 64 gigabits, an aspect ratio of depth to width of the contact hole formed in the insulating film on the electrode layer of a switching transistor is necessarily becoming large. On the above-mentioned first technique, a process window for selective epitaxial growth, or solid phase epitaxial growth of a single crystal silicon plug only from the bottom surface of a contact hole with large aspect ratio becomes narrow, and consequently, yield of fabricating more than tens of millions of plugs in a memory device is low and it is difficult to apply to a mass production line.

According to the above-mentioned second technique, it is necessary to make interconnection between the capacitor and the switching transistor through bonding interface. Hence, perfect bonding is required in order to avoid formation of voids at the bonding interface which leads to faulty products. In addition, there is a problem of difficulty in precisely fitting and aligning the positions of capacitor and switching transistor owing to their separate formation processes.

As above-mentioned, there are many technical problems to be solved in the first and the second techniques.

SUMMARY OF THE INVENTION

In consideration of the above-mentioned technical problems, the present invention aims to provide a semiconductor memory device capable of achieving high density integration and of easy fabrication, comprising a ferroelectric thin film with ferroelectricity appearing by an effect of epitaxial growth or a capacitor using a thin film with a dielectric constant increased by the effect of epitaxial growth and further aims to provide a method of fabricating the same.

Specifically speaking, the present invention provides a semiconductor memory device having epitaxially grown electrode layers and dielectric thin films which can endure elevated temperatures.

It is another object of the present invention to provide a semiconductor memory device wherein a single crystal silicon contact plug formed by complicated processes is not used in the connecting portion between epitaxial planar capacitor and switching transistor.

It is another object of the present invention to provide a semiconductor memory device more insensitive to defects located around the bonding interface and can be made by a more simple bonding method compared with the semiconductor device made by forming epitaxial planar capacitor and switching transistor in separate substrates and bonding these substrates.

It is another object of the present invention to provide a semiconductor memory device with high reliability such as FRAM and DRAM, wherein epitaxial planar capacitors and switching transistors using properties such as ferroelectricity and high dielectric constant paraelectricity induced by strain generated during crystal growth can be integrated in high density.

It is another object of the present invention to provide a semiconductor memory having high integration density of greater than 1 gigabit and a cheap product unit price.

It is another object of the present invention to provide a semiconductor memory device which uses a ferroelectric thin film layer or a high-dielectric constant paraelectric thin film layer and can be mass-produced easily.

It is another object of the present invention to provide a new structure for a semiconductor memory device wherein a semiconductor substrate, which can easily be made large-diameter, can be used as a base substrate when epitaxially growing a single crystalline dielectric material.

It is another object of the present invention to provide a semiconductor memory device having an epitaxial planar capacitor which can easily be miniaturized to the deep submicrometer level, or further to the nanometer level.

It is another object of the present invention to provide a semiconductor memory device wherein an excellent bonding interface with no open failure is obtained between bonded layers.

It is another object of the present invention to provide a semiconductor memory device wherein there is no risk of current leakage and short failures between adjacent memory cells.

It is another object of the present invention to provide a method for manufacturing a semiconductor memory device having epitaxially grown electrode layers and dielectric thin films which can endure elevated processing temperatures.

It is another object of the present invention to provide a method for manufacturing a semiconductor memory device wherein required steps can be simplified, eliminating complicated processes such as the single crystal silicon contact plug formation process.

It is another object of the present invention to provide a method for manufacturing a semiconductor memory device, which can be made by a more simple and easier bonding method relaxing the requirement for severe position alignment.

It is another object of the present invention to provide a method for manufacturing a semiconductor memory device suitable to ultrahigh density of integration above gigabit levels wherein isolation of the elements for switching transistors and for epitaxial planar capacitors can be performed in the same step.

It is another object of the present invention to provide a method for manufacturing a semiconductor memory device with high reliability, wherein epitaxial planar capacitors using ferroelectricity and high dielectric constant paraelectricity induced by strain can be integrated in high density.

It is another object of the present invention to provide a method for manufacturing a semiconductor memory device with a cheap product unit price.

It is another object of the present invention to provide a method for manufacturing a semiconductor memory device which can be mass-produced easily.

It is another object of the present invention to provide a method for manufacturing a semiconductor memory device wherein a semiconductor substrate having a large-diameter can be used as a base substrate for epitaxial growth of a single crystalline dielectric material.

It is another object of the present invention to provide a method for manufacturing a semiconductor memory device at the subquarter micrometer level to the nanometer level having a epitaxial planar capacitor, which can easily be processed.

It is another object of the present invention to provide a method for manufacturing a semiconductor memory device wherein an excellent bonding interface with no open failure is obtained between bonded layers.

Yet another object of the present invention is to provide a method for manufacturing a semiconductor memory device wherein there is no risk of current leakage and short failures between adjacent memory cells.

Based on above-mentioned experimental results, the present invention is characterized by a semiconductor memory device having a memory cell portion at least comprising a thin film semiconductor layer with first and second main surfaces opposing each other and a plane-shaped epitaxial planar capacitor disposed under the first main surface and a switching transistor formed in the second main surface. "The epitaxial planar capacitor" indicates that the first electrode layer, the dielectric thin film and the second electrode layer are all thin films grown by epitaxy. It is an important point in the first feature of the present invention that the first electrode layer, dielectric thin film and the second electrode layer are on planes of the same level, respectively.

Specifically speaking, the first feature of the present invention lies in a semiconductor memory device characterized by an array of memory cells composed of a switching transistor and a storage capacitor (epitaxial planar capacitor) wherein the cells are arranged in the form of a two dimensional matrix and by using a high dielectric constant material grown by epitaxial or oriented growth as a dielectric thin film of an epitaxial planar capacitor. The first feature of the present invention is also characterized by having a memory cell wherein an epitaxial planar capacitor constructed from a first electrode layer, dielectric thin film and a second electrode layer grown epitaxially is disposed under a first main surface and a switching transistor is disposed in a second main surface of a thin film semiconductor layer formed from a silicon (100) substrate. The epitaxial planar capacitor can be connected to a source region of the switching transistor through a contact plug.

According to the first feature of the present invention, the epitaxial planar capacitor and the switching transistor are formed in both surfaces of one thin film semiconductor layer so that direct bonding can be made easily since connection of electrode layers through the direct bonding layer is unnecessary. The switching transistor and the first electrode layer of the epitaxial planar capacitor can be separated by self-alignment processing. Furthermore, ultrahigh density of integration is possible owing to stacked configuration of epitaxial planar capacitor and switching transistor.

In the first feature of the present invention, the thin film semiconductor layer is desirable to be bound to a supporting substrate through the epitaxial planar capacitor and a certain bonding layer. At this time, the drive line of FRAM or plate electrode layer of DRAM can be formed between the epitaxial planar capacitor and the bonding layer.

In the first feature of the present invention, at least a part of the first or the second electrode layers is desirable to be formed by (100) plane of a cubic crystal or (001) plane of a tetragonal crystal. Furthermore, at least a part of the dielectric layer of the epitaxial planar capacitor is desirable to be formed by (100) plane of a cubic perovskite crystal or (001) plane of layered perovskite crystal.

The dielectric thin film is desirable to be a perovskite-type crystal represented by a general formula $ABO_3$. Here, A is at least one selected from a group of Ba, Sr and Ca and B is at least one selected from the following group: Ti, Zr, Hf, Sn, $(Mg_{1/3}Nb_{2/3})$, $(Mg_{1/3}Ta_{2/3})$, $(Zn_{1/3}Nb_{2/3})$, $(Zn_{1/3}Ta_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Nb_{1/2})$, $(Mn_{1/2}Nb_{1/2})$, $(Sc_{1/2}Ta_{1/2})$, $(Fe_{1/2}Nb_{1/2})$, $(In_{1/2}Nb_{1/2})$, $(Fe_{1/2}Ta_{1/2})$, $(Cd_{1/3}Nb_{2/3})$, $(Co_{1/3}Nb_{2/3})$, $(Co_{1/3}Nb_{2/3})$, $(Ni_{1/3}Nb_{2/3})$, $(Co_{1/3}Ta_{2/3})$, $(Ni_{1/3}Ta_{2/3})$.

The second feature of the present invention is a method of fabricating a semiconductor memory device comprising at least the steps of: growing epitaxially a first electrode layer of capacitor above a first main surface of a semiconductor substrate having first and second main surfaces facing each other; growing epitaxially a dielectric thin film on the first electrode layer; forming a second electrode layer of a capacitor on the dielectric thin film; preparing a supporting substrate and bonding the semiconductor substrate with the supporting substrate through a bonding layer; adjusting thickness of the semiconductor substrate by removing a part of the second main surface of the semiconductor substrate; and forming a switching transistor in the second main surface of the semiconductor substrate. The second electrode layer of the capacitor can also be formed by epitaxial growth. The direct bonding between the semiconductor substrate and supporting substrate can be made by forming a first bonding layer on an upper portion of the second electrode layer of the capacitor of semiconductor substrate and a second one and on the supporting substrate, respectively and mating the surfaces of the first and the second insulating layers for direct bonding each other.

In the second feature of the present invention, it is desirable that after the step of epitaxial growth of the first electrode layer, first and second grooves are formed through the first electrode layer by removing selectively a part of the first main surface of the semiconductor substrate, and then the first groove is buried with a first insulating film to form the capacitor isolation region and the second groove is buried with a second insulating film to form the element isolation region. The first insulating film and the second insulating film may be same material such as an oxide film ($SiO_2$ film). Then the first and second insulating films can be deposited simultaneously by CVD method.

In the second feature of the present invention, it is desirable that after the step of formation of the second electrode layer by epitaxial growth or another method, first and second grooves are formed through the second electrode layer, dielectric thin film and the first electrode layer, by removing selectively a part of the first main surface of the semiconductor substrate and then the insulating layers for capacitor isolation and element isolation are buried into the first and the second grooves, respectively. The above-mentioned first groove is desirable to be formed more shallowly than the second groove to allow self-alignment processing of the contact between capacitor and switching transistor. More specific description is as follows.

First, an epitaxial planar capacitor is formed by successive epitaxial growth of a first electrode layer, a dielectric thin film and a second electrode layer on a first main surface of an Si (100) substrate. First and second grooves reaching to the Si (100) substrate are formed. And a capacitor isolation region and an element isolation region are formed in each groove and then the first main surface of Si is stuck to a supporting substrate prepared previously. Thereafter, a thin film semiconductor layer is formed by polishing the Si (100) substrate from the second main surface using the element isolation region as a stopping layer of polishing until the stopping layer is exposed. Transistor, bit line and wiring are formed at, in, and on the second main surface of the thin film semiconductor layer.

By the above-mentioned steps, a semiconductor memory device of the present invention is completed. The first electrode layer of the capacitor in each memory cell at the first main surface side of thin film semiconductor layer and one of the source regions of each switching transistor are electrically interconnected through contact plug. Here, a source region of switching transistor should be interpreted as one of the main electrode regions of the transistor because source and drain regions which are main electrode regions in MOSFET serving as a switching transistor are formed symmetrically each other and which main electrode region should be called source or drain electrode layers is simply a problem of definition. If a main electrode region connected to the epitaxial planar capacitor is called a source region, that connected to the bit line is a drain region and vice versa. In the second feature of the present invention, it is possible to form a groove from the second main surface, reaching the dielectric layer and bury the element isolation regions into the groove, after the step of adjusting the thickness of semiconductor substrate.

According to the second feature of the present invention, an epitaxial planar capacitor can be formed before the fabrication steps of switching transistors. Then, relatively high temperature processes for depositing the epitaxial electrode layer and the epitaxial dielectric thin film are allowed, without taking into consideration of enlargement of junction depth of source/drain regions of the switching transistors due to heat treatments.

According to the second feature of the present invention, since it is not necessary to use a single crystal Si plug, fabrication steps thereof are complicated, but sufficient by use of a polycrystalline Si plug for interconnection of the epitaxial planar capacitor and the switching transistor, the steps of fabrication can be simplified.

According to the second feature of the present invention, since the epitaxial planar capacitor and the switching transistor are formed in both main surface sides of thin film semiconductor layer, the device is insensitive to defects in the direct bonding portion and the fabricating technique is remarkably simple compared with the method wherein the capacitor and the switching transistor are formed firstly in separate substrates and then stuck together.

According to the second feature of the present invention, since the epitaxial planar capacitor and the switching transistor are formed in both surface sides of thin film semiconductor layer, the element isolations in the switching transistor and the epitaxial planar capacitor can be performed in one step and limitation to the accuracy of position fitting is removed so that the device is suitable to ultrahigh density integration above gigabit class.

Furthermore, contact to each of the adjacent cells in the direction of bit line can be made with one window pattern at the same time by disposing the contact windows pattern for formation of the contact plug to overlap with the region on the element isolation regions, the fabricating steps are simplified.

A third feature of the present invention lies in a semiconductor memory device comprising at least: a first semiconductor substrate wherein a plurality of switching transistors are provided in a matrix form; a second semiconductor substrate having a plurality of perovskite epitaxial planar capacitors corresponding to the plurality of switching transistors; and a connector for electrically connecting the main electrode regions of the switching transistors to their corresponding epitaxial planar capacitors in a one-to-one arrangement. "The connector" in the third feature of the present invention is a connector having at least a capacitor contact plug connected to the main electrode region of the switching transistor and the first bonding layer and the second bonding layer connected to this capacitor contact plug.

According to the third feature, it is possible to use a silicon wafer (semiconductor substrate) with a diameter greater than 200 mm (8 inches) to 300 mm (12 inches). Therefore, a semiconductor memory device (semiconductor memory) having high storage density of greater than 1 gigabit can be realized with a cheap product unit price.

A fourth feature of the present invention comprises a method for manufacturing a semiconductor memory device comprising at least the steps of: fabricating a switching transistor in and on a first semiconductor substrate, planarizing a topmost surface thereof and preparing the topmost surface as a substrate surface; forming a flat first bonding layer, connected to the main electrode region of the switching transistor, over the entire surface of the substrate; forming a multilayered structure for capacitor, comprising at least a first electrode layer and a dielectric thin film and a second electrode layer, on a second semiconductor substrate by epitaxial growth; forming a flat second bonding layer over the entire upper surface of the multilayered structure for capacitor; aligning the second bonding layer with the first bonding layer; bonding the first semiconductor substrate and the second semiconductor substrate together; and separating the multilayered structure, the first and second bonding layers into a plurality of patterns and creating a capacitor for each cell. Here, a substrate with high conductivity is preferable as the "second semiconductor substrate".

In the fourth feature of the invention, the first bonding layer disposed on the first semiconductor substrate and the second bonding layer disposed on the second semiconductor substrate are both formed as flat even films across the entire surface of a wafer. Therefore, the first and second bonding layers can be bonded evenly across the entire surface of wafer, making it possible to achieve a highly reliable direct bonding. The main electrode regions of the switching transistors are electrically connected to the capacitors of the memory cells in a one-to-one arrangement. In order to achieve this electrical connection, a connector should preferably comprise a capacitor contact plug, which is connected to the main electrode region of the switching transistor, and the first bonding layer and the second bonding layer which connect to this capacitor contact plug. Therefore, these bonding layers must comprise metal or low-resistivity conductors. Alternatively, the first bonding layer can comprise silicon and the second bonding layer can comprise metal (or vice versa) so as to form metal suicide after bonding. In either case, it is a minimum requirement that, after bonding, the first and second bonded layers should become a conductor.

In comparison with a technique of photolithography, which comprises a sequence of standard steps of optical aligning, exposing, developing, rinsing and the like, it is considerably more difficult to achieve precise position alignment in the silicon wafer direct bonding (SDB)technique, which comprises the steps of separately holding two substrates, mechanically aligning them together, pressing and annealing them. It is extremely difficult to execute the SDB technique: patterning beforehand of a first flange (first bonding layer) connected to the main electrode region of the switching transistors and a second flange (second bonding layer) connected to the electrode layer of the capacitor of each memory cell, and mechanically bonding the first and second semiconductor substrates while taking care that these flanges are precisely aligned with a precision of submicrometer to nanometer levels along the entire surface of the wafer. In the fourth feature of the present invention, the first and second bonding layers are formed evenly along the entire surface of the wafers before aligning them, and then, the SDB technique is conducted to bond the first and second semiconductor substrates together. Thereafter, the multilayered structure for capacitor and the first and second bonding layers are separated by etching so as to provide capacitors for each of the memory cells. Consequently, alignment accuracy at the submicrometer to nanometer levels in the SDB technique is unnecessary. In other words, the execution of the photolithography technique is easier because masks on higher levels can be aligned to the lower level pattern, or the pattern on the first semiconductor substrate on which the switching transistor is formed, and the pattern delineation for separating the capacitors can be performed after the first and second bonding layers have been bonded together. This is due to the fact that, technologically, the photolithography technique is far developed and refined to higher technical levels, and the art with a higher degree of precision is established, than the SDB technique. Furthermore, since the position of the capacitors of each of the memory cells are defined relative to the position of the main electrode regions of the switching transistor after the first and second bonding layers have been bonded together, a slight deviation in the alignment can be adjusted in the subsequent step of photolithography.

In the fourth feature of the method for manufacturing a semiconductor memory device of the present invention, the first step is the step of fabricating the switching transistor in and on the first semiconductor substrate. Taking a semiconductor substrate as an example, the processing temperature in the steps of fabricating the switching transistor—for example, the diffusion temperature for forming well and source/drain regions—is approximately 1000° C., which is much higher than those in the other steps. The step of fabricating the multilayered structure for capacitor, the step of aligning the first and second bonding layers, and the step of bonding together the first and second semiconductor substrates follow this step of fabricating the switching transistor. Consequently, no excess thermal energy is applied to the multilayered structure for capacitor, allowing the overall processing temperature to be low.

According to the fourth embodiment of the present invention, it is possible to use semiconductor substrates such as large-diameter silicon wafers. This is suitable for mass production and reduces the manufacturing price per chip.

A fifth feature of the present invention lies in a method for manufacturing a semiconductor memory device comprising at least the steps of: fabricating a switching transistor on a first semiconductor substrate, planarizing a topmost surface thereof and preparing the topmost surface as a substrate surface; forming a flat first bonding layer, connected to the main electrode region of the switching transistor, over the entire surface of the substrate; forming a flat second bonding layer over the entire surface of a second semiconductor substrate; aligning the second bonding layer with the first bonding layer; bonding the first semiconductor substrate and the second semiconductor substrate together; after the step of bonding, adjusting thickness of the second semiconductor substrate to a predetermined thickness; forming a multilayered structure for capacitor, comprising at least a first electrode layer, a dielectric thin film and a second electrode layer, on the second semiconductor substrate by epitaxial growth; and separating the first, second bonding layers and the at least one part of the multilayered structure into a plurality of patterns so that a separate capacitor is available for each memory cell. Here, "forming at least one part of the multilayered structure" signifies, for instance, forming only the first electrode layer, or forming all of the first electrode layer, the dielectric thin film and the second electrode layer. In whichever case, the multilayered structure for capacitor eventually comprises at least a first electrode layer, a dielectric thin film and a second electrode layer. Please note that there is no need to separate all the layers of the multilayered structure in order to provide electrically separate capacitors for each memory cell. As long as at least either one of the first or the second electrode layer is provided separately for each memory cell, the capacitor will be able to electrically function independently. Therefore, "step of separating at least one part of the multilayered structure" should be interpreted as signifying a step of separating either one of the first and the second electrode layer. In the fifth feature of the method for manufacturing a semiconductor memory device of the present invention, the multilayered structure for capacitor can be completed by various ways, for example, in a time sequence wherein the first electrode layer is epitaxially grown and separated by etching, then the dielectric thin film and the second electrode layer are epitaxially grown. In other words, when forming the multilayered structure comprising the first electrode layer, the dielectric thin film and the second electrode layer, the epitaxial growth does not necessarily have to comprise an unbroken sequence of steps; the epitaxial growth can be divided into two steps and other steps may be performed between the two steps of epitaxial growth. Furthermore, the top electrode layer does not necessarily have to be formed by epitaxial growth. The top electrode layer may be either the first or second electrode layer.

A comparison of the processing temperatures among the step of fabricating the switching transistor, the step of forming the multilayered structure for capacitor and the step of bonding shows that processing temperature is highest in the step of fabricating the switching transistor. Taking a silicon substrate as an example, the processing temperature for the step of fabricating the switching transistor is approximately 1000° C. Therefore, preferable sequences for manufacturing the semiconductor memory device are:

fabricating the switching transistor in the first semiconductor substrate, epitaxially growing the multilayered structure for capacitor on the second semiconductor substrate and then aligning the first and second semiconductor substrates as illustrated in the fourth feature; or, fabricating the switching transistor in the first semiconductor substrate, aligning and polishing the first and second semiconductor substrates and then epitaxially growing the multilayered structure for capacitor as illustrated in the fifth feature.

In the fifth feature, the first bonding layer formed on the first semiconductor substrate and the second bonding layer formed on the second semiconductor substrate are both accomplished by depositing flat materials evenly across the entire surface of the semiconductor substrates (wafers). Therefore, the first and second bonding layers can be bonded evenly across the entire surface of the wafer, making it possible to achieve a highly reliable direct bonding. A connector, for electrically connecting the main electrode regions of the switching transistor to the capacitors of the memory cells in a one-to-one arrangement, comprises a capacitor contact plug which is connected to the main electrode region of the switching transistor, the first bonding layer and the second bonding layer which connect to this capacitor contact plug. Therefore, these bonding layers must comprise metal or low resistivity conductors. Alternatively, the first bonding layer can comprise silicon and the second bonding layer can comprise metal (or vice versa) so as to form metal silicide after bonding.

In the fifth feature, after the first and second bonding layers have been evenly formed on the entire surface of a wafer, the first and second bonding layers are aligned and the first and second semiconductor substrates are bonded together; thereafter, at least one part of the multilayered structure for capacitor is formed, and etching is used to separate at least one part of the multilayered structure for capacitor and the first and second bonding layers in order to provide capacitors for each of the memory cells. Therefore, there is no need for precise alignment at the submicrometer to nanometer levels when carrying out aligning the first and second bonding layers. This is because the relative positions of the capacitor of each cell and the main electrode region of the switching transistor are defined after the first and second semiconductor substrates have been bonded together. In other words, position alignment when aligning the bonding layers is made easier because, in the photolithography technique, mask alignment can be performed based on the pattern on the first semiconductor substrate on which the switching transistor is formed, and the patterning for separating the capacitors can be performed after the first and second bonding layers have been bonded together. This is due to the fact that, technologically, the photolithography technique is far developed and refined to higher technical levels than the SDB technique. Namely, the position control methodology with a higher degree of precision is established in the photolithography technique. Furthermore, since the position of the capacitors of each of the memory cells are defined relative to the position of the main electrode regions of the switching transistor after the first and second bonding layers have been bonded together, a slight deviation in the alignment can be adjusted in the subsequent step of photolithography.

According to the fifth embodiment of the present invention, it is possible to use a substrate such as a large-diameter silicon wafer. This is suitable for mass production and reduces the manufacturing unit price per chip. Furthermore, while the fifth feature of the present invention shares many of the advantages of the fourth embodiment, it also has an additional advantages that a single-body capacitor cell can be created using a U-shaped or V-shaped groove, further reducing the occupation area of the capacitor. The step sequence in this case may, for instance, comprise: forming a U-shaped or V-shaped groove after the first and second semiconductor substrates have been bonded and epitaxially growing a first electrode layer in this groove. Then, the first electrode layer is separated, and a dielectric thin film and a second electrode layer are epitaxially grown.

In the third to fifth features, "first semiconductor substrate" and "second semiconductor substrate" signify semiconductor substrates obtained by a bulk single-crystal growth method using the Czochralski method (CZ method), floating zone method (FZ method) or magnetic field application Czochralski method (MCZ). In other words, "the first semiconductor substrate" and "the second semiconductor substrate" refer to the semiconductor substrates that can be commercially obtained in the form of silicon wafer or gallium arsenide (GaAs) wafer or the like. From the viewpoint of large diameter, silicon wafer is particularly preferable. The semiconductor substrates in the third to fifth features of the present invention are acceptable if these semiconductor substrates are silicon wafers or the like that exist by having a predetermined size of 8-inch $\Phi$ to 12-inch $\Phi$ diameter at the time of starting the manufacturing of a semiconductor memory unit. In the definition of "semiconductor substrates", these materials such as either amorphous or polycrystalline at the time of starting the manufacturing process, and have been single crystallized by electron beam (EB) annealing, laser annealing or any other thermal processing thereafter are excluded. Also the semiconductor materials that have been recrystallized by any method after starting the manufacturing process are not included in the definition of "semiconductor substrates" in the present invention. It is needless to mention that the epitaxial wafers epitaxially grown on the CZ wafers, FZ wafers or MCZ wafers and SOI substrates using these silicon wafers also fall under "the first semiconductor substrate" and "the second semiconductor substrate" of the present invention. The "main electrode regions of the switching transistors" in the third to fifth features of the present invention means either one of the source region and the drain region of the switching transistors. As the source region and the drain region of a switching transistor are usually formed in symmetry, which one of them should be called a source region of the switching transistor or a drain region of the switching transistor simply depends on a practice and has no special meaning.

As the dielectric material of an epitaxial planar capacitor of a perovskite type structure used in the third to fifth features of the present invention, a thermally stable $BaTiO_3$ single crystalline material including no low melting-point metal such as Pb or Bi is suitable as the component. In other words, in the composition expression given by $ABO_3$, A mainly consists of Ba, a part of which may be substituted by at least one kind of element of Sr and Ca. For B, there may be used Ti, Sn, Zr, Hf and their solid solution, or further a complex compound such as $Mg_{1/3}Ta_{2/3}$, $Mg_{1/3}Nb_{2/3}$, $Zn_{1/3}Nb_{2/3}$, and $Zn_{1/3}Ta_{2/3}$ and their solid solution.

Further, as the "the bottom electrode layer (which is defined as a lower one of the first and the second electrode layers at the epitaxial growth)" of the epitaxial planar capacitor of a perovskite type structure used in the third to fifth features of the present invention, a perovskite type conductive oxide such as thermally stable single crystalline SRO or single crystalline molybdenum ruthenate ($MoRuO_3$) is most suitable. Further, it is also possible to use noble metals such as silver, gold, palladium, iridium, rhodium, rhenium, ruthenium, etc., or their alloy or their oxide. The bottom electrode layer may also be grown epitaxially after suitably forming a barrier metal layer or the like on the semiconductor substrate. It is desirable to select a component by arranging such that the bottom electrode layer is a single crystalline thin film and the lattice constants in the a axis and b axis directions of the bottom electrode layer become smaller than those of the perovskite type dielectric thin film, with the c axis of the bottom electrode layer set to be perpendicular to a film surface. With this arrangement, it becomes possible to obtain ferroelectric characteristics at room temperature and to obtain paraelectric characteristics having high dielectric constant, by shifting the ferroelectric Curie temperature to a high-temperature side utilizing stress attributable to a mismatching of the lattice constants between the bottom electrode layer and the dielectric thin film. The reason why "the top electrode layer does not necessarily require to be formed by epitaxial growth" in the fifth feature of the present invention is that desirable ferroelectric characteristics and paraelectric characteristics having high dielectric constant can be obtained when the lattice constants in the a axis and b axis directions of the bottom electrode layer become sufficiently smaller than those of the dielectric thin film and when there have been grown a mismatching of the lattice constants between the bottom electrode layer and the dielectric thin film. Accordingly, either FRAM or DRAM can be obtained depending upon the election of the ferroelectric or the paraelectric thin film, which can be freely selected as the material of the dielectric thin film. For example, FRAM can be obtained by using a single crystalline BSTO of a Ba component of 0.6 to 1.0, preferably a Ba-rich component of about 0.6 to 0.9, and DRAM can be obtained by using a single crystalline BSTO of a Sr-rich component of about 0.6 to 0.9.

In order to bond the first semiconductor substrate and the second semiconductor substrate at as low temperature as possible in the fourth to fifth features of the present invention, it is necessary to investigate proper materials for the first and second bonding layers, and contrive the bonding method using the selected materials. For example, by selecting a system in which the material of the first bonding layer and the material of the second bonding layer are alloyed, reaction energy at the time of alloying is utilized for bonding. By selecting a system in which the first and second bonding layers consist of different metals or semiconductors and an alloy layer is formed between both bonding layers on a equilibrium state, the bonding temperature can be lowered. In a system for forming an alloy layer, the alloying process promotes the bonding process since the free energy becomes lower when an alloy is formed. It is also possible to increase the melting point of an alloy to a higher level than the original metals or to increase mechanical strength of the alloy. An alloy may be formed by using all metals or by combining a metal forming silicide such as nickel and silicon and a semiconductor.

As bonding layers, there may be used amorphous metals such as Al—Ta, Al—Cu, Al—Au, Al—Mg, Ti—Co, Ti—Ni, Ti—Cu, Si—Mn, Si—Mn, Si—Pd, Si—Pt, Si—Ag or Si—Au. At the time of bonding these metals together, they may be crystallized and the energy of crystallization may be utilized for the bonding. It becomes possible to lower the bonding temperature by selecting an amorphous metal or a semiconductor as one of the first and second bonding layers. This is because the crystallization process promotes the bonding process since the free energy is lowered in a crystal state than in an amorphous state.

Further, it is desirable to elaborate the bonding methods as follows:

(a) Mating the opposing two bonding layers in a vacuum chamber to stick each other, immediately after depositing the bonding layers on the semiconductor substrate, without taking them out into the atmosphere;

(b) Mating the opposing two bonding layers to stick each other, after physically cleaning the bonding interface, such as by sputtering in an inert gas;

(c) Mating the opposing two bonding layers to stick to each other, after chemically cleaning the bonding interface, or after annealing the bonding layers in a reducing ambient such as hydrogen to reduce the oxide film formed on the surfaces of the bonding layers so as to expose pure material surfaces of the bonding layers.

In the case of reducing the oxide film by hydrogen, for example, it is necessary to use an appropriate metal bonding layer or an appropriate semiconductor bonding layer that can thermodynamically achieve reduction, after through investigation of free energies of various oxides. After finishing the cleaning of the surfaces in (b) or (c) above, it is desirable to carry out the boding process without exposing the surfaces of the bonding layers to the atmosphere. In the fourth and fifth features of the present invention, since the first and second semiconductor substrates are mutually bonded together after uniformly depositing the first and second bonding layers over the whole wafer surface and thereafter a storage capacitor for each cell is delineated by a separation process employing the photolithography technology, it is easy to mate and bond the first and second semiconductor substrates together in the vacuum chamber without exposing these substrates to the atmosphere. Slight misalignments between the first and second semiconductor substrates can be adjusted in the subsequent photolithography process.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF DRAWINGS

FIG. 1A is a schematic cross sectional view illustrating a DRAM memory cell according to the first embodiment of the present invention.

FIG. 18A is a schematic cross-sectional view of a FRAM memory cell according to a seventh embodiment of the present invention;

FIG. 19A to FIG. 19I are cross-sectional views sequentially illustrating steps of manufacturing a FRAM memory cell according to the seventh embodiment of the present invention;

FIG. 22A to FIG. 22H are cross-sectional views sequentially illustrating steps of manufacturing a FRAM memory cell according to the eighth embodiment of the present invention:

DETAILED DESCRIPTION OF THE PREFERRED EMBODIMENTS

Figure 1B:
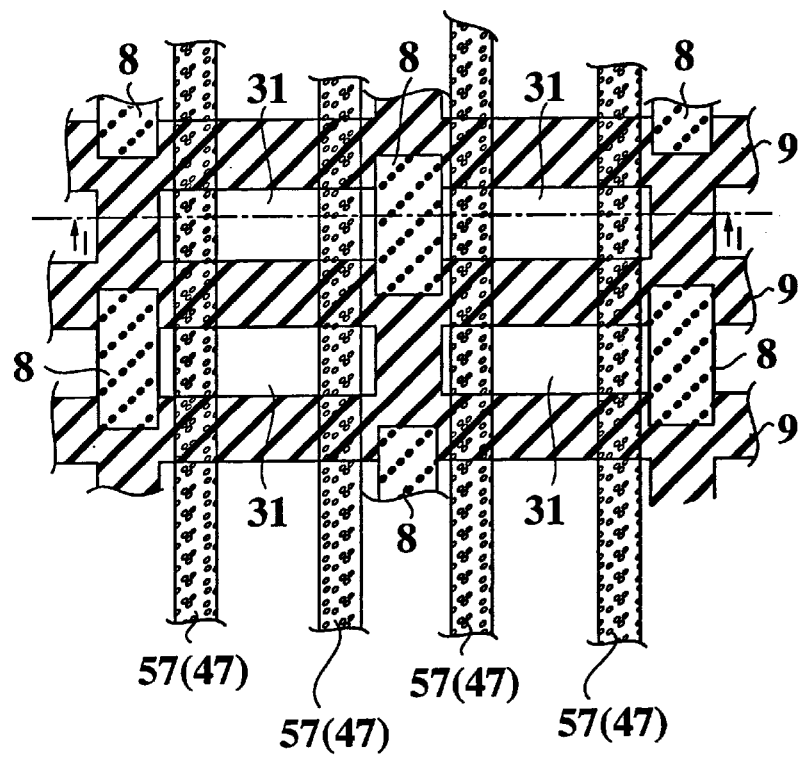
FIG. 1B is a plane view illustrating insulating regions for separation of capacitors, insulating regions for element isolation and word lines of DRAM according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

First Embodiment

FIG. 1A is a schematic cross sectional view illustrating a portion corresponding to two unit cells (two memory cells) of DRAM according to the first embodiment of the present invention. As shown in FIG. 1A, an epitaxial planar capacitor 41 composed of a first electrode layer 4, a dielectric thin film 5 and a second electrode layer 6 is disposed under a first main surface of a thin film semiconductor layer 31 formed from a p-type Si (100) substrate. The epitaxial planar capacitor 41 is formed as a uniform and continuous plane under the first main surface of the thin film semiconductor layer 31 wherein the adjacent two memory cells are formed. Two switching transistors 91a and 91b are formed in a second main surface placed opposite to the first main surface. The switching transistor 91a comprises an n$^+$ source region 44a, an n$^+$ drain region 45, a gate oxide layer 46 and a gate electrode layer 47. The n$^+$ drain region 45 of the switching transistor 91a is also serves as an n$^+$ drain region of the adjacent switching transistor 91b, i.e. the switching transistor 91b comprises the n$^+$ drain region 45, the n$^+$ source region 44b, a gate oxide layer 46 and a gate electrode layer 47. The gate electrode layers 47 of the switching transistors 91a and 91b have a double-layered structure composed of a doped polysilicon layer 47a and a silicide layer 47b of refractory metal such as WSi$_2$, MoSi$_2$ and TiSi$_2$. In place of the silicide layer of refractory metal, a refractory metal such as W, Mo, Ti and Co can be used. The gate electrode layer 47 also serves as a part of word line of DRAM. The n$^+$ drain region 45 which is common to the switching transistors 91a and 91b is connected to a bit line 18 through a contact plug 51. The thin film semiconductor layer 31 is a thin film silicon layer. The thin film silicon layer 31 merging the switching transistors 91a and 91b is separated from the adjacent thin film silicon layer (see FIG. 1B) by an element isolation region 9. An n$^+$ diffusion layer in side wall 14 is formed in the neighborhood of thin film semiconductor layer 31 and a contact plug 13 composed of an n$^+$ doped poly-silicon is formed between the n$^+$ diffusion layer in side wall 14 and the element isolation regions 9. Further, an n$^+$ impurity diffusion layer 2 is formed in the main surface of the thin film semiconductor layer. A barrier metal layer 3 is formed between the first electrode layer 4 constituting the epitaxial planar capacitor 41 of DRAM and an n$^+$ impurity diffusion layer 2 to prevent diffusion of elements constituting the first electrode layer 4 into the thin film semiconductor layer 31. The first electrode layers 4 and the barrier metal layers 3 in the adjacent unit cells are separated each other by an capacitor isolation region 8.

FIG. 1B is a plane view illustrating the capacitor isolation regions 8 and the element isolation regions 9. FIG. 1A corresponds to a cross sectional view along the I—I direction of FIG. 1B. As shown in FIG. 1B, the thin film semiconductor layer 31 merging two switching transistors in the second main surface is separated from the adjacent other thin film semiconductor layer 31 by the element isolation region 9. The epitaxial planar capacitor 41 connected to the switching transistor 91a and that connected to the switching transistor 91b are separated from each other by the capacitor isolation region 8. Further, the epitaxial planar capacitor 41 is separated from the epitaxial planar capacitor of another cell located just under the thin film semiconductor layer 31 (at the first main surface) by the element isolation region 9.

Figure 2:
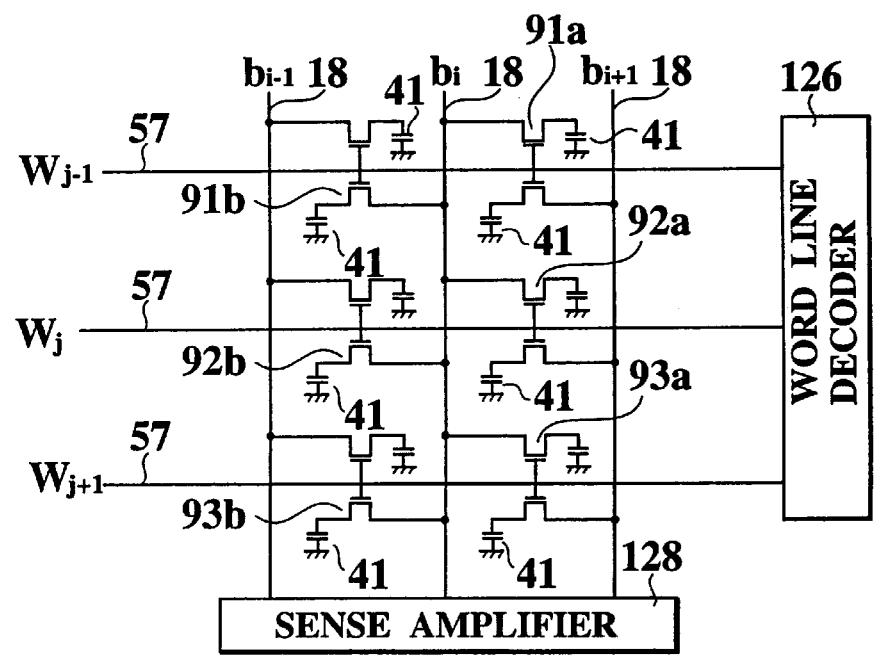
FIG. 2 is a drawing illustrating an equivalent circuit of DRAM according to the first embodiment of the present invention.

FIG. 2 is an equivalent circuit of DRAM according to the first embodiment of the present invention. As is obvious from FIG. 2, DRAM according to the second embodiment of the present invention has a one cell-one transistor structure such that the unit cell (memory cell) is composed of one switching transistor 91a, 91b; 92a, 92b; 93a, 93b; . . . , and one epitaxial planar capacitor 41. An X-Y matrix is constructed by words lines ( . . . , Wj−1, Wj, Wj+1, . . . ) 57 and bit lines ( . . . , bi−1, bi, bi+1, . . . ) 18. The common drain region of paired switching transistors 91a and 91b are connected to the common bit lines. Each word line 57 and each bit line 18 are connected to a word line decoder 126 and a sense amplifier 128, respectively so that random access is possible for desired cell.

As shown in FIG. 1A, the barrier metal layer 3 connected to the first electrode layer of the epitaxial planar capacitor 41 is connected to the source region 44a or 44b of the switching transistor 91a or 91b through the contact plug 13, the n$^+$ diffusion layer in side wall 14 and the n$^+$ impurity diffusion layer 2 so that the contact resistance is very low. According to the construction shown in FIG. 1A, since the thin film semiconductor layer 31 made of (100) plane of the thin film Si substrate 1 can be used as a base substrate, the (100) oriented (Tl, Al)N barrier metal layer 3, the first and the second electrode layers 4 and 6 such as (100) oriented SrRuO$_3$ and the dielectric thin film 5 such as (100) oriented (Ba, Sr)TiO$_3$ can be formed under entire of the surface in the lower side (the first main surface) of the thin film semiconductor layer 31 in stable state. Hence, scattering of the dielectric constant of dielectric capacitor and the scattering of the leakage current flowing through the dielectric capacitor can be decreased. As the epitaxial planar capacitor 41 is constructed under each switching transistor 91a or 91b in a plane of the same horizontal level, steps of the surface due to a geometrical structure of the epitaxial planar capacitor having portions existing at different levels can be eliminated. And consequently the metallization process becomes easy and simplification of the fabrication steps is attained. Since the first electrode layer 4 of the epitaxial planar capacitor 41 and the switching transistors 91a, 91b can be separated at the same time by the insulating films 8 and 9 for capacitor and element isolations, respectively, error of mask alignment is decreased and yield of the product is increased. As the epitaxial planar capacitor 41 is disposed three dimensionally in the region under lower side (the first main surface) of the switching transistors 91a and 91b, entire region of the lower side (the first main surface) of the switching transistor 91a and 91b can be used as a capacitor forming region. Consequently, the area occupied by the epitaxial planar capacitor in each memory cell can be insured without increasing the area of the memory cell. As a result, storage charge of DRAM and operation margin of memory cell can be enlarged. Although it is not shown in the figure, an SOI structure for the peripheral circuit at boundary portion of the semiconductor chip is possible by using an insulating film such as oxide film of a certain thickness, instead of the corresponding epitaxial planar capacitor 41 in the central portion (memory cell portion), and high speed operation or low electric power dissipation of transistor is possible.

Next, a fabricating method of DRAM according to the first embodiment of the present invention illustrated in FIGS. 1A and 1B will be described using FIGS. 3A to 3K. The Illustration of fabricating method will be made referring only to the switching transistor 91a.

Figure 3A:
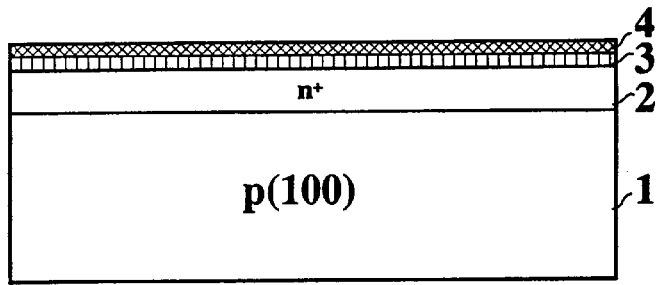
FIGS. 3A to 3K are schematic cross sectional views of steps for illustrating a fabricating method of DRAM according to the first embodiment of the present invention.
Figure 3B:
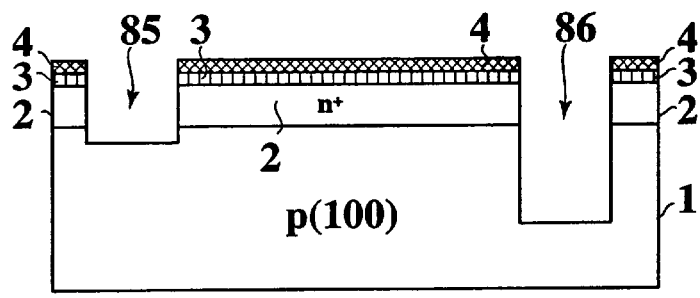
Figure 3C:
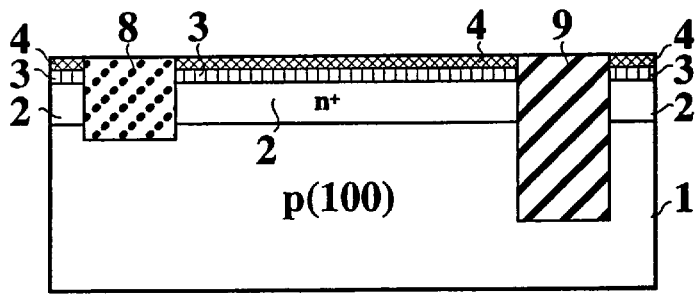

(a) First, as shown in the schematic cross sectional view FIG. 3A, the $n^+$ impurity diffusion layer 2 having an impurity concentration of $1 \times 10^{18} – 1 – 10^{21}$ cm$^{-3}$ and depth of about 0.1 μm is formed on the first main surface of a p-type Si (100) substrate 1 and thereafter, the (Ti, Al)N layer of 10 nm in thickness as the barrier metal layer 3 and the SrRuO$_3$ film of 20 nm in thickness as the first electrode layer 4 are grown successively by epitaxial growth using DC sputtering method at the substrate temperature of 600° C. The impurity concentration of substrate 1 may be, for example, $1 \times 10^{15} – 1 – 10^{18}$ cm$^{-3}$. Next, as shown in FIG. 3B, the first groove 85 for separation of adjacent capacitors and the second groove 86 for element isolation are formed by photolithography and reactive ion etching (RIE) methods. Next, as shown in FIG. 3C, the first groove 85 is buried with a first insulating film to form the capacitor isolation region 8 and the second groove 86 is buried with a second insulating film to form the element isolation region 9. The first insulating film and the second insulating film may be same material such as an oxide film (SiO$_2$ film). Then the first and second insulating films can be deposited simultaneously by CVD method. Thereafter, the first main surface is polished by chemical and mechanical polishing (hereafter denote simply as "CMP") and the oxide film is buried into the first and the second grooves. At this time, a method such that TiN layer or another layer is formed beforehand to serve as a polishing stop layer, which may be etched out after CMP, can be used to protect the surface of the first electrode layer 4.

Figure 3D:
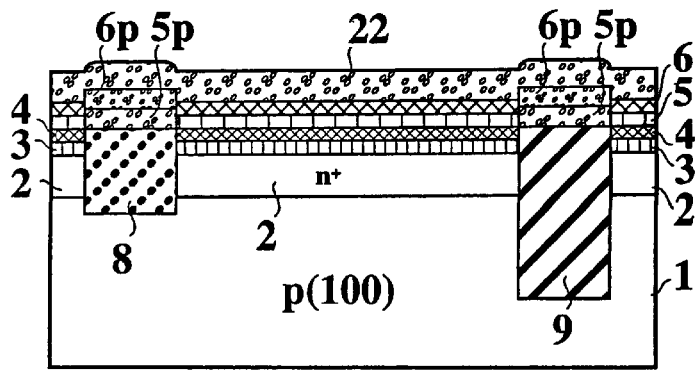

(b) Next, as shown in FIG. 3D, the BSTO thin film layer 5 of 20 nm in thickness with Ba mole fraction 30% as a dielectric thin film and the SrRuO$_3$ film 6 of 20 nm in thickness as a second electrode layer 6 are grown epitaxially by RF and DC sputtering methods, respectively at a substrate temperature of 600° C. Portions of the BSTO thin film and the SrRuO$_3$ film at the top of the insulating regions 8 and 9 become to polycrystalline BSTO and SrRuO$_3$ films, respectively. Hereafter, the polycrystalline BSTO and SrRuO$_3$ films will be named as "poly-BSTO thin film" 5p and "poly-SrRuO3 film" 6p, respectively. Further, a TiN film of 200 nm in thickness is sputtered on the entire surface at room temperature as a plate electrode layer 22.

Figure 3E:
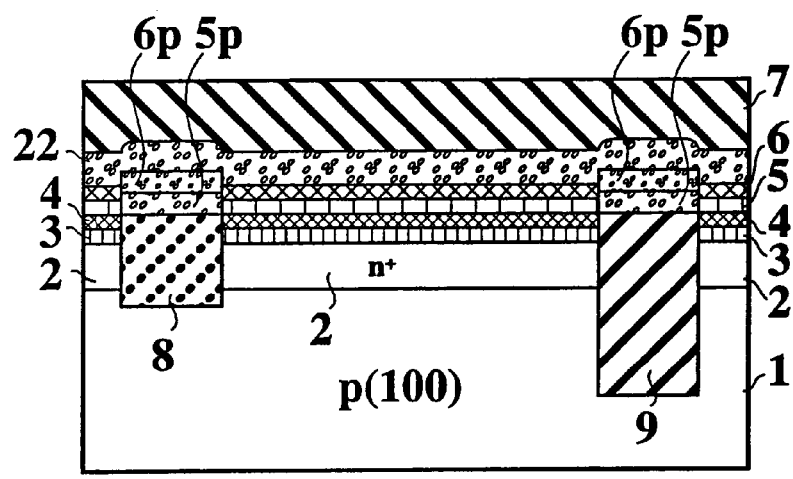

(c) Next, as shown in FIG. 3E, BPSG film 7 is formed to a thickness of for example, about 500 nm as a bonding layer and thereafter the surface is polished by for example, CMP method to obtain a mirror-like surface.

Figure 3F:
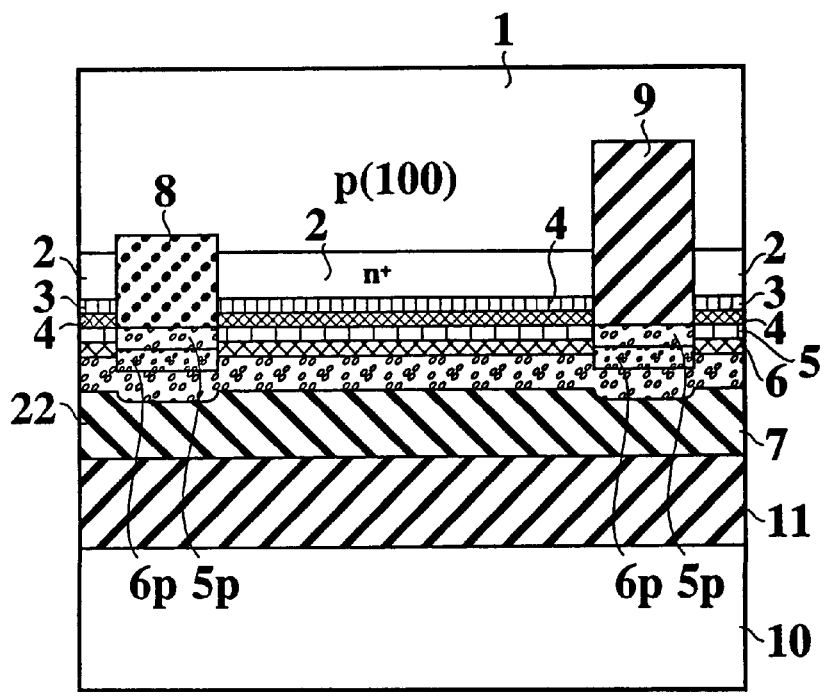

(d) Next, a supporting substrate 10 is prepared and another BPSG layer 11 is deposited thereon as shown in FIG. 3F and the surface is polished to obtain a mirror-like surface. Then, the mirror-like surfaces of BPSG films are mated with facing each other to stick the p-type Si (100) substrate 1 to the supporting substrate 10. A known Silicon Wafer Direct Bonding (SDB) technique such as for instance, heat treatment at about 900° C. can be used for direct bonding.

Figure 3G:
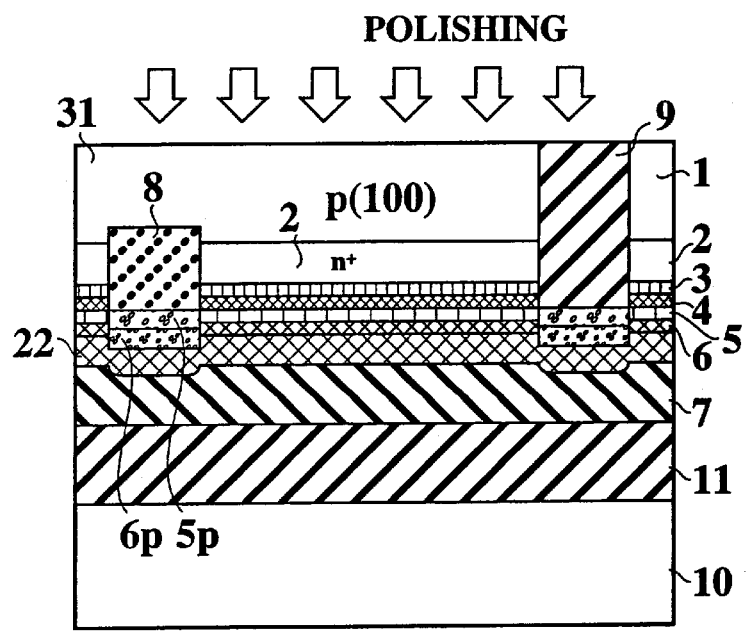

(e) Next, as shown in FIG. 3G, the thickness of the semiconductor substrate 1 is adjusted by removing a part of the second main surface of the semiconductor substrate 1. Namely, the second main surface of the p-type Si (100) substrate 1 is polished using the element isolation region 9 as a layer to stop the polishing. Then a thin film semiconductor layer 31 of for example, about 150 nm in thickness is formed. Cleaving of "SMART-CUT substrates" at hydrogen implanted plane or removing the supporting substrate of SOI structure by RIE or polishing, grinding can also be used to obtain the thin film semiconductor layer 31. Of course, the second main surface of the thin film semiconductor layer 31 is polished to accommodate the later steps for the formation of transistor. The element isolation in transistor formation region is also done at the same time by the element isolation region 9 formed from the first main surface.

Figure 3H:
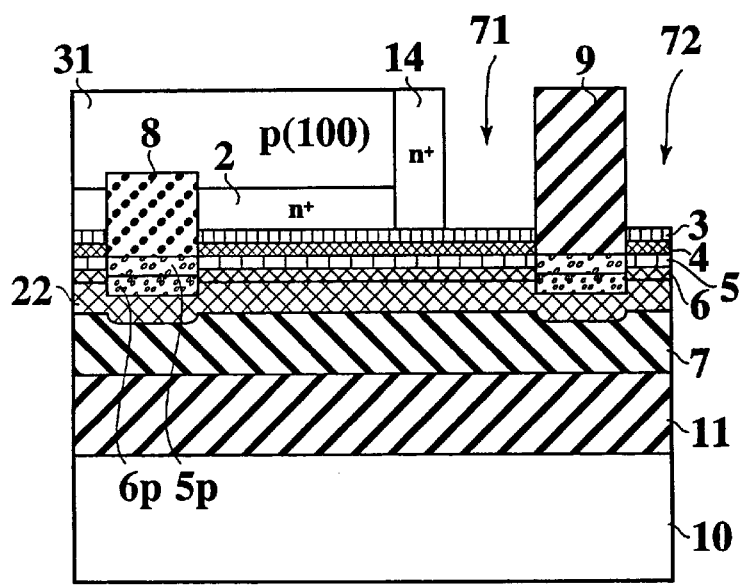
Figure 3I:
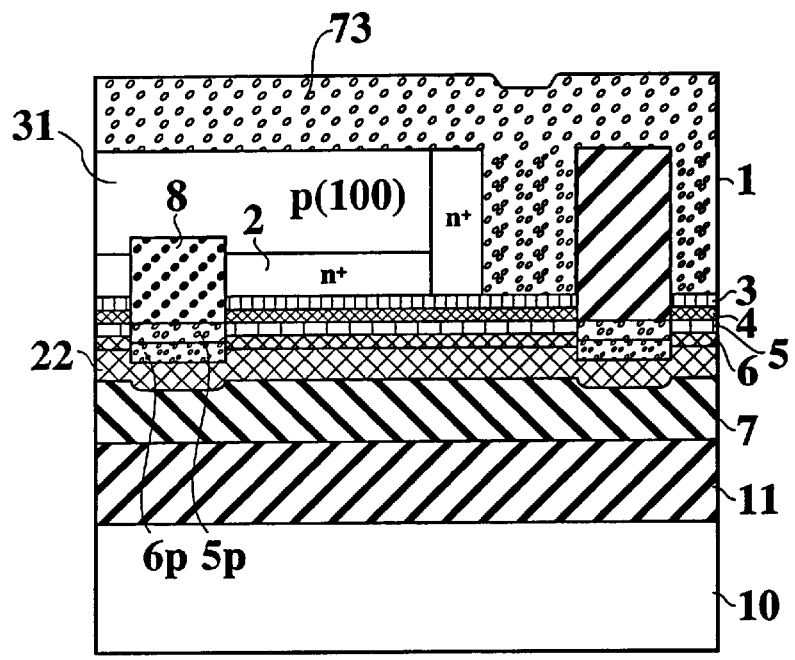
Figure 3J:
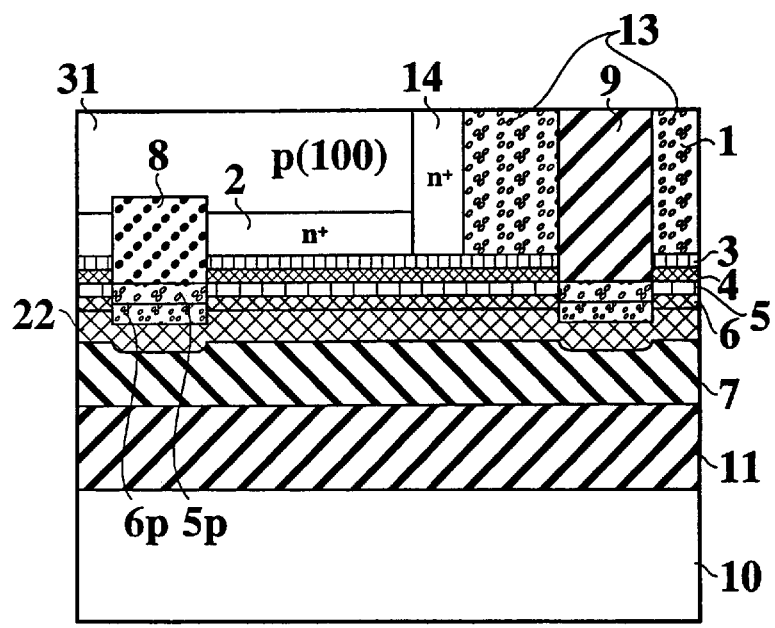

(f) Next, as shown in FIG. 3H, connecting grooves 71 and 72 are dug adjacently to the element isolation region 9 using usual photolithography and dry etching technique such as RIE methods. As the etching condition, self stopping of the etching using the barrier metal layer 3 (or the first electrode layer 4) as an etching stopper is desirable. Next, as shown in FIG. 3I, doped polysilicon film containing for example, an $n^+$ impurity such as phosphorus (P) and arsenic (As) is deposited to a thickness of about 200 nm over the surface of the connecting grooves 71 and 72. Thereafter, as shown in FIG. 3J, a contact plug 13 made of $n^+$ doped polysilicon film is buried in the connecting groove by etching back the entire surface using CMP or another method. Thereafter, an $n^+$ impurity is diffused into the p-type Si (100) substrate from the side surface of connecting groove by annealing at 800° C. for 20 second with a rapid thermal annealing (RTA) technique in a nitrogen atmosphere to form the $n^+$ side wall diffusion layer 14 having an impurity concentration of $5 \times 10^{17} – 2 \times 10^{20}$ cm$^{-3}$.

Figure 3K:
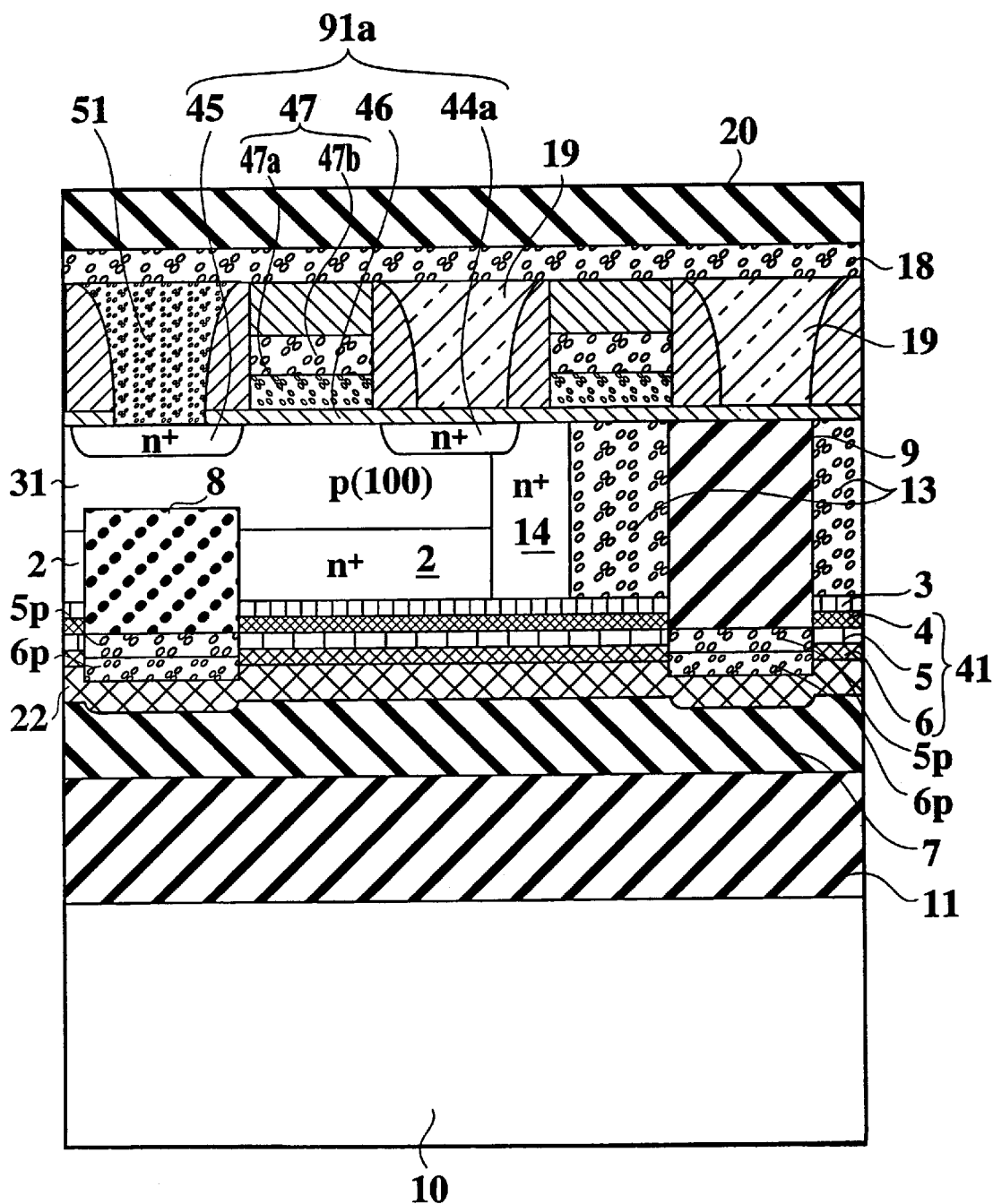

(g) Next, a switching transistor 91a is formed in the second main surface of the thin film semiconductor layer using a known MOS process, i.e. a switching transistor 91 comprising the $n^+$ source region 44a, the $n^+$ drain region 45, the gate oxide film 46 and the gate electrode layer 47 (word line 57) are formed as shown in FIG. 3K. The impurity concentration of $n^+$ source region 44a, the $n^+$ drain region 45 may be, for example, $1 \times 10^{18} – 1 \times 10^{21}$ cm$^{-3}$. The thickness of the gate oxide film 46 may be, for example, 10–50 nm. Then, interlayer insulating films 19 are deposited and the interlayer insulating film 19 on the top of the $n^+$ drain region 45 is removed and the contact plug 51 is buried to form a bit line 18. Further, the second interlayer insulating film 20 is deposited on the top of the bit line 18 to complete DRAM shown in FIG. 3K according to the first embodiment of the present invention.

Although above description is made focusing on the switching transistor 91a, the switching transistor 91b is also completed by the same steps at the same time. However, as shown in FIG. 3K, bottom parts of the insulating regions 8 and 9 for capacitor and element isolations, respectively are poly BSTO thin film 5p and poly SrRuO$_3$ 6p, which are slightly different from the structure shown in FIG. 1A.

It was ascertained that the first and the second electrode layers and the dielectric thin film are grown epitaxially on the p-type Si (100) substrate by the fabricating method shown in FIGS. 3A to 3K. Consequently, a dielectric thin film with very high dielectric constant of 930 has been obtained. An excellent performance of DRAM has been ascertained by the epitaxial planar capacitor using this dielectric thin film.

In order to prevent polycrystallization of the bottom portions of the insulating films 8 and 9 for capacitor and element isolations, respectively as shown in FIG. 3K, the following steps can be made. FIGS. 4A to 4H are cross sectional views illustrating another fabricating method of DRAM according to the present invention.

Figure 4A:
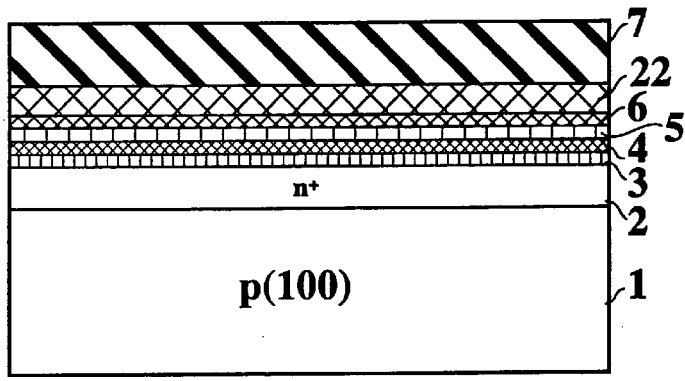
FIGS. 4A to 4J are schematic cross sectional views of steps for illustrating another fabricating method of DRAM according to the first embodiment of the present invention.

(a) First, as shown in FIG. 4A, the n$^+$ impurity diffusion layer 2 of about 0.1 $\mu$m in depth is formed on the first main surface of a p-type Si (100) substrate and thereafter the (Ti, Al)N film of 10 nm in thickness as the barrier metal layer 3, the SrRuO$_3$ film of 20 nm in thickness as the first electrode layer 4, the BSTO thin film of 20 nm in thickness with Ba of mole fraction 30% as the dielectric thin film 5 and the SrRuO$_3$ film of 20 nm in thickness as the second electrode layer 6 are grown epitaxially and successively without exposure to air, using RF or DC sputtering methods at a substrate temperature of 600° C. Then the TiN film of 200 nm in thickness is deposited as the plate electrode layer 22 and BPSG film is deposited to a thickness of for example, about 500 nm as the bonding layer 7 process and thereafter the surface is polished by for example, CMP to make a mirror-like surface.

(b) Next, the supporting substrate 10 is prepared separately. Then the BPSG film 11 is deposited on the surface of the supporting substrate 10 and finish the surface to a mirror-like surface. The mirror-like surfaces of the BPSG films 7 and 11 are mated facing each other and the supporting substrate 10 and the p-type Si (100) substrate 1 are directly bound. A known SDB technique, for example, which may employ a heat treatment at about 900° C. can be adopted for bonding.

Figure 4B:
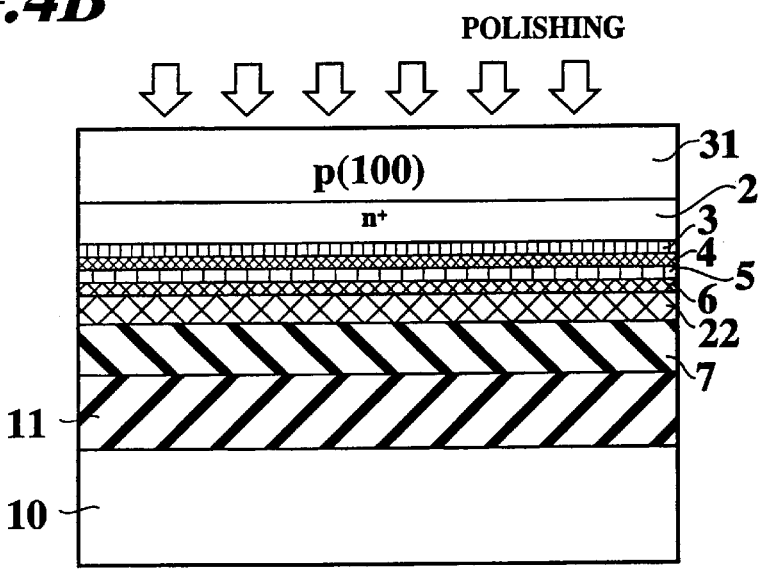
Figure 4C:
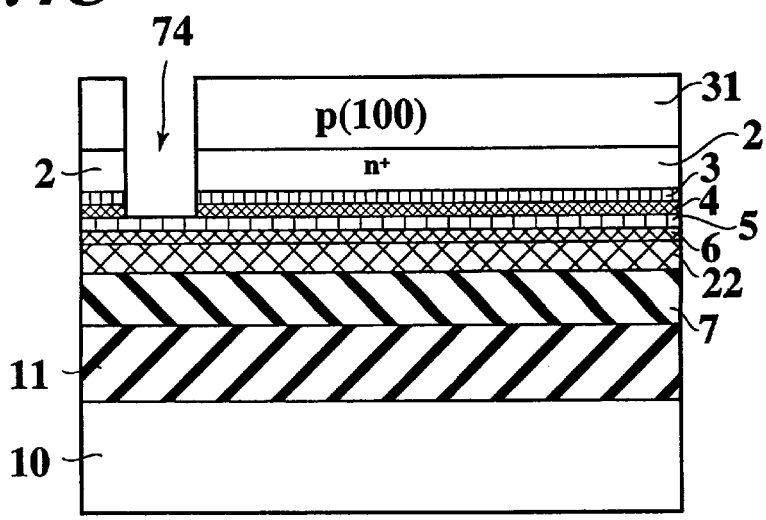
Figure 4D:
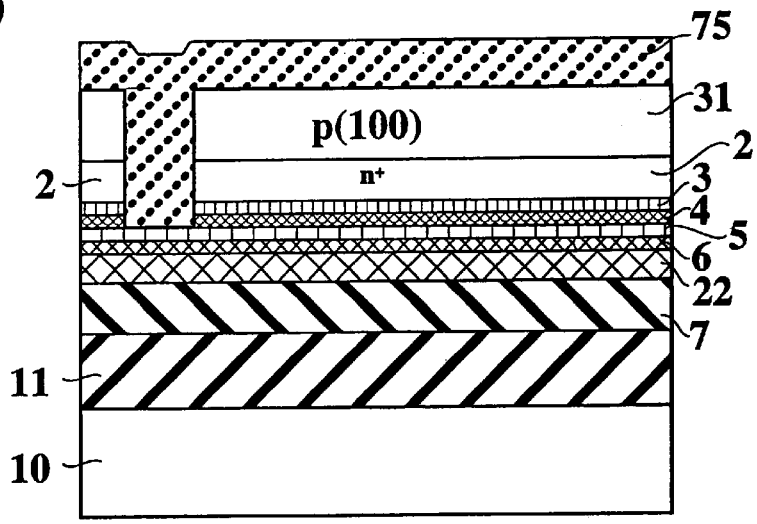
Figure 4E:
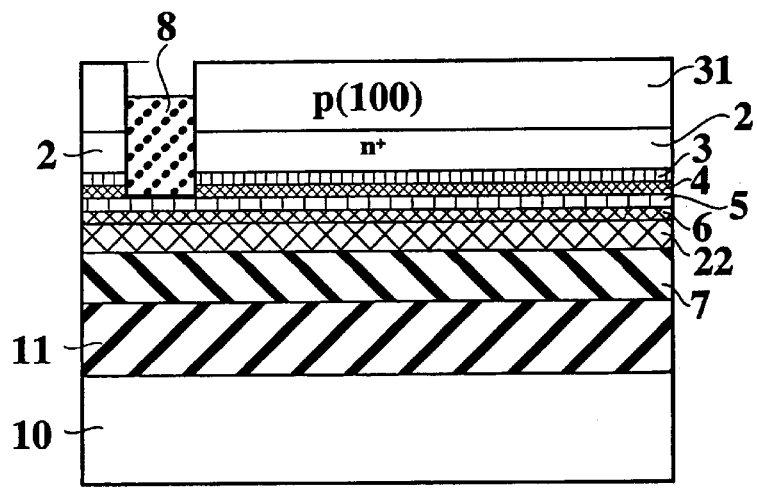
Figure 4F:
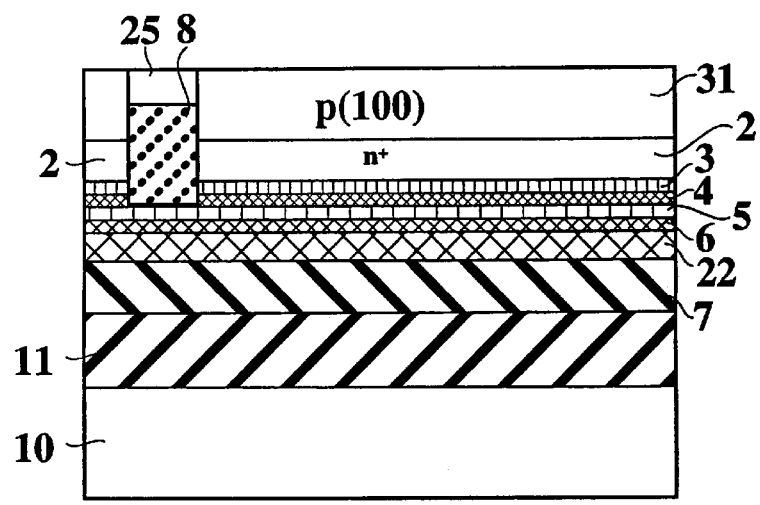

(c) Next, as shown in FIG. 4B, the thin film semiconductor layer 31 of, for example, 150 nm in thickness is formed by polishing the second main surface of the p-type Si (100) substrate 1. Formation of the thin film semiconductor layer 31 can be made by other methods such as cleaving of SMART-CUT substrates or removing the supporting substrate from the SOI structure. Of course, a mirror-like polishing of the surface of thin film semiconductor layer 31 is done to accommodate later steps for the formation of transistors. Next, as shown in FIG. 4C, the first groove 74 for separation of adjacent capacitors is formed by lithography and an etching technique such as RIE methods. At this time, use of the dielectric thin film 5 as a stopping layer for the etching is desirable. Then, as shown in FIG. 4D, the insulating film 75 such as SiO$_2$ film the thickness of which is larger than the depth of the first groove is deposited. The film is planarized by CMP or another method after the formation and the first groove is buried with the capacitor isolation region 8. Further, as shown in FIG. 4E, the surface of the capacitor isolation region 8 is slightly and selectively etched back. Thereafter, the single crystalline silicon electrode layer 25 is formed in the slightly etch-backed portion and again planarized as shown in FIG. 4F. For the formation of single crystalline silicon electrode layer 25, known technique such as a method of crystallization from side wall portion to obtain a single crystal by heat treatment such as the RTA technique after conformal formation of amorphous silicon layer or a method of burying a single crystalline silicon selectively by selective growth CVD method. According to circumstances, crystallization after burying the polysilicon using laser annealing technique or electron-beam (EB) annealing technique can be made.

Figure 4G:
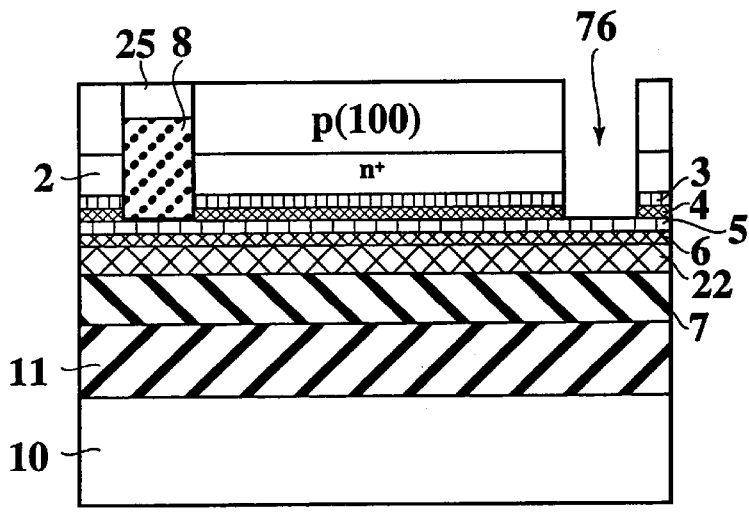
Figure 4H:
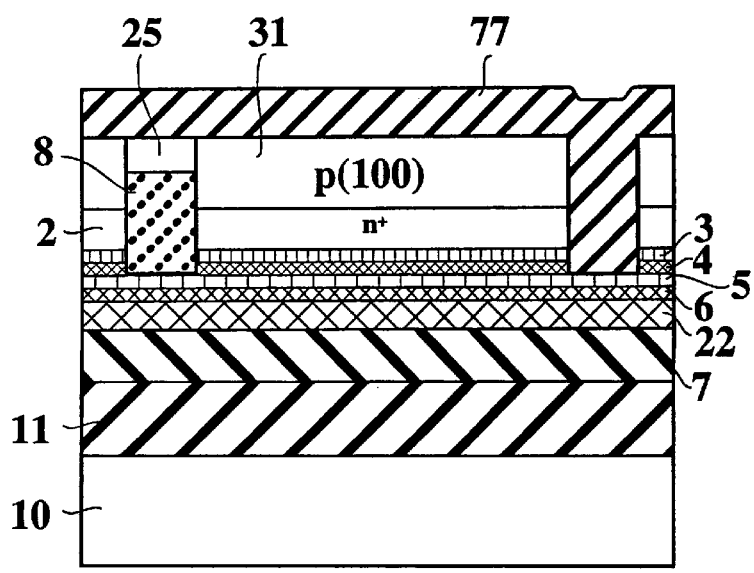

(d) Next, as shown in FIG. 4G, the second groove 76 for element isolation is formed by lithography and an etching technique such as RIE. In this case, use of the dielectric thin film 5 as a stopping layer for etching is desirable. Next, as shown in FIG. 4H, the insulating film 77 such as the SiO$_2$ film is deposited by CVD or another method to a thickness larger than the depth of the second groove 76. Thereafter, the film is planarized by CMP or another method and the element isolation region 9 is buried into the second groove 76.

Figure 4I:
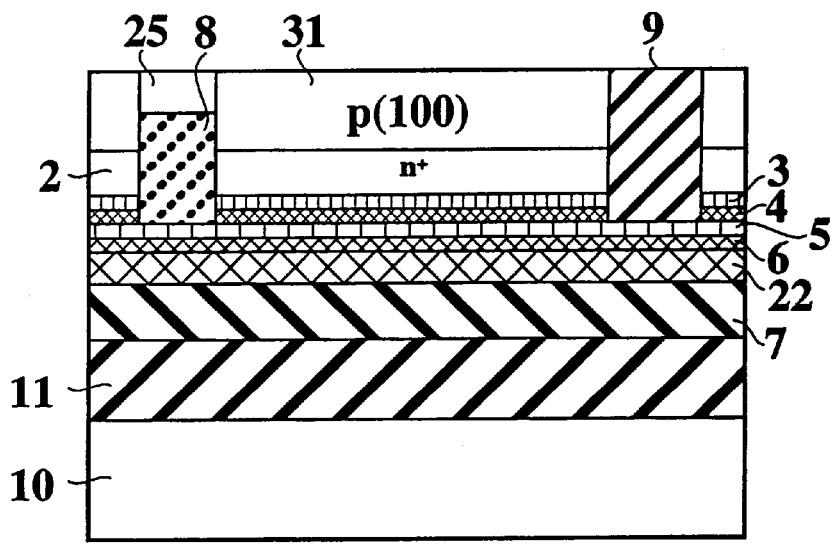
Figure 4J:
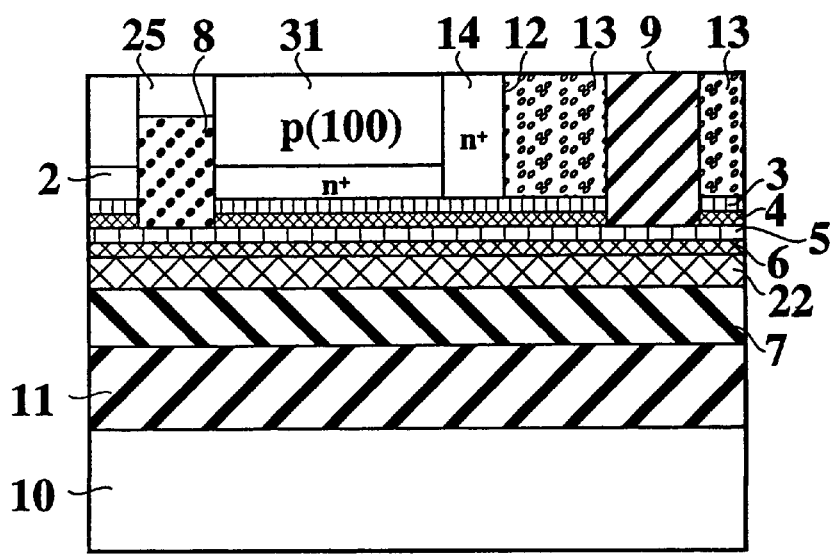

(e) Next, a connecting groove is opened using usual photolithography and plasma etching such as RIE methods or another method. In the condition of etching in this time, the barrier metal layer 3 (or the first electrode layer 4) is desirable to be used as a stopper to stop the etching automatically. Next, a doped polysilicon film containing for example, an n$^+$ type impurity is deposited to a thickness of about 200 nm on the entire surface and buried into the connecting groove by etching back entire of the surface by CMP or another method and thus the contact plug 13 composed of an n$^+$ doped polysilicon layer is formed as shown in FIG. 4J. Thereafter, an n-type impurity is diffused into the thin film semiconductor layer 31 from the n$^+$ doped polysilicon layer 13 by annealing in an nitrogen atmosphere at about 800° C. for 20 second using the RTA technique.

(f) Following steps are similar to those illustrated by above-mentioned FIG. 3K. Namely, the switching transistor 91a comprising the n$^+$ source region, the n$^+$ drain region, the gate oxide film 16 and the gate electrode layer 47 and the bit line 18 or another portion is formed using a known MOS process to complete DRAM according to the first embodiment of the present invention shown in FIGS. 1A and 1B.

Figure 5:
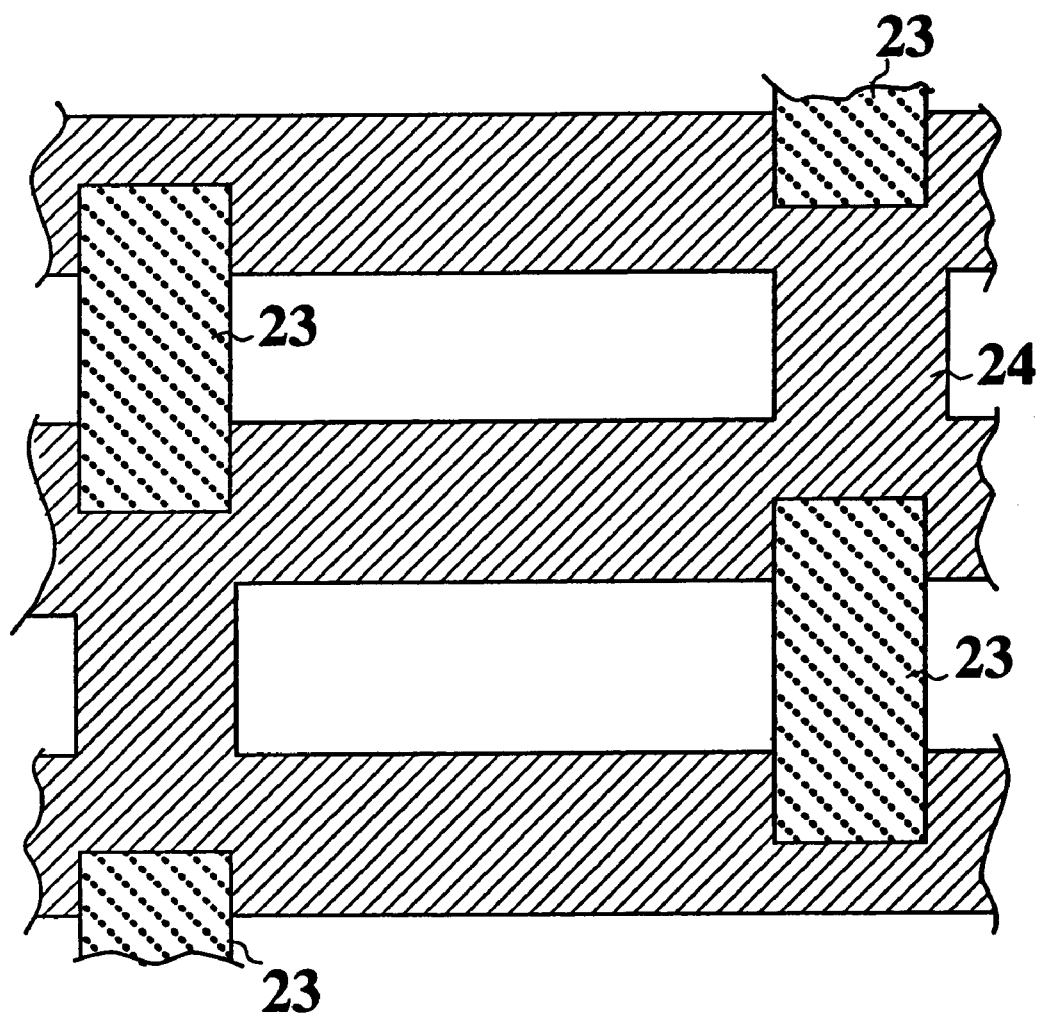
FIG. 5 is a drawing illustrating a mask pattern for formation of capacitor isolation and element isolation regions.

In the above-mentioned method, the fabrication process to form two kinds of buried insulating regions 8 and 9 is as follows. Firstly, a delineation of an etching mask for the first groove 74 is performed using a reticle pattern 23 for capacitor isolation as shown in FIG. 5 and the first groove 74 is formed by RIE or another method. Thereafter, burying, planarization and selective etching back of the insulating film 75 and burying and planarizing of a selectively grown silicon single crystal are performed. Then, the second groove is formed by selective etching of the thin film semiconductor layer 31 using another etching mask delineated with another reticle pattern 24 for element isolation region. And the insulating film 77 is buried, and finally planarized. In this way, requirement for the accuracy of precise mask alignment in the formation of the insulating films 8 and 9 for capacitor and element isolations, respectively can be relaxed. Here, reticle patterns 23 and 24 are of course the patterns indicating window portions. The steps after that shown in FIG. 4J are a mask alignment of the n$^+$ source region 44a and the n$^+$ drain region 45 and succeeding other mask alignments for other regions of switching transistor, using the pattern of the selectively grown single crystalline silicon 25 exposed on the surface and/or the element isolation region 9 as alignment marks.

Figure 7A:
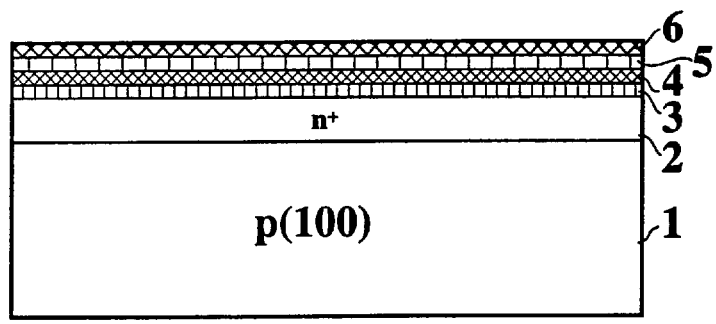
FIGS. 7A to 7G are schematic cross sectional views of steps for illustrating a fabricating method of DRAM according to the second embodiment of the present invention.
Figure 7B:
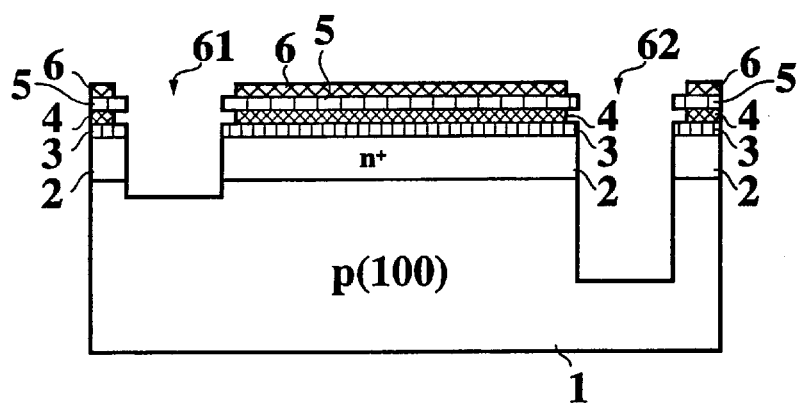
Figure 7C:
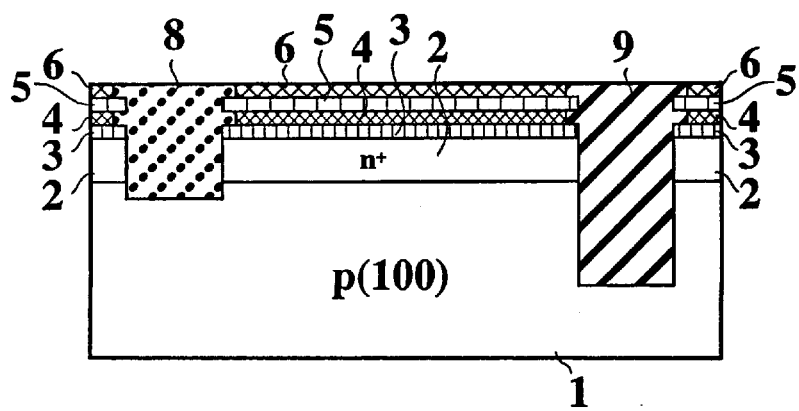
Figure 7D:
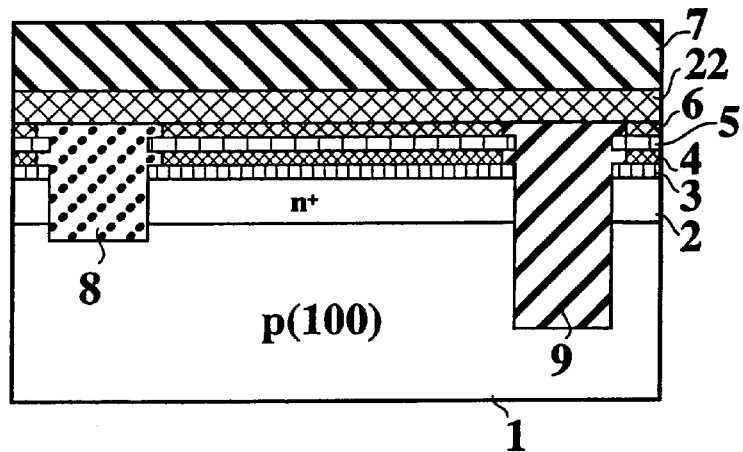
Figure 7E:
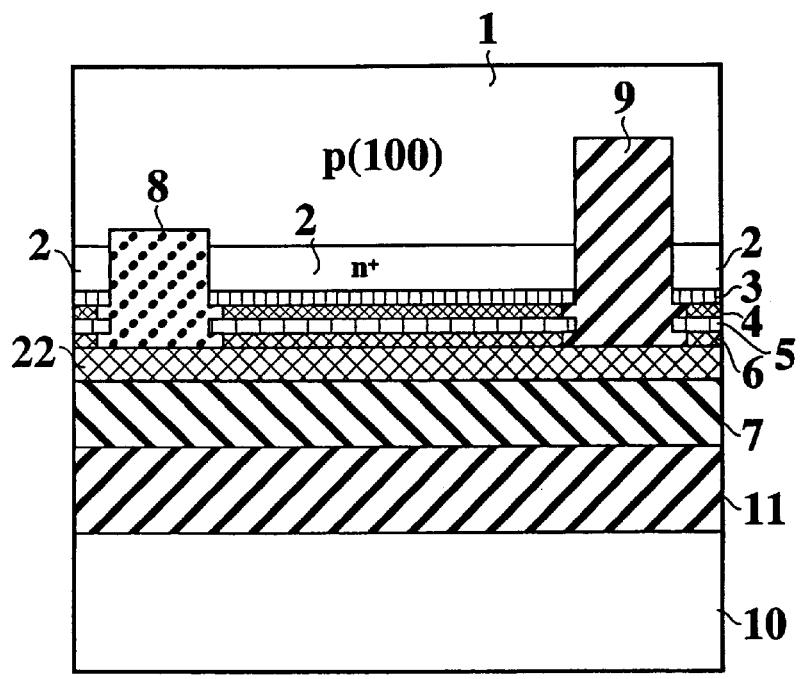
Figure 7F:
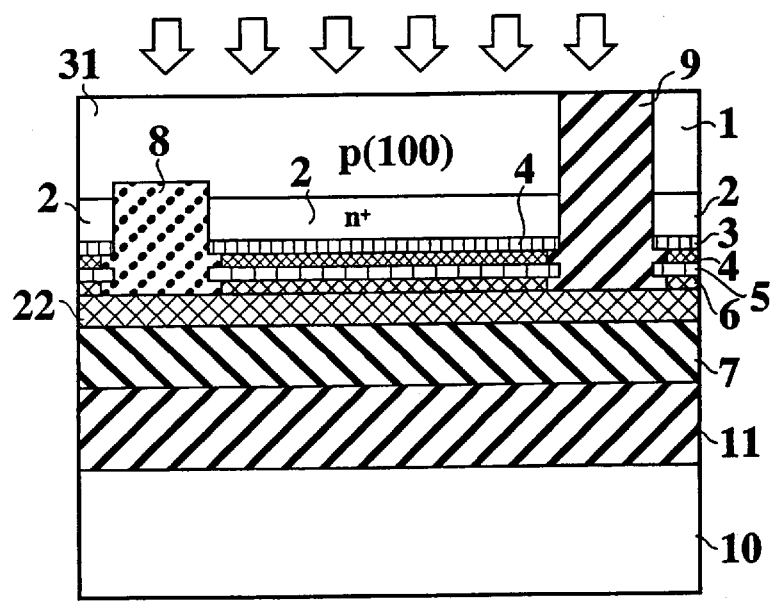
Figure 7G:
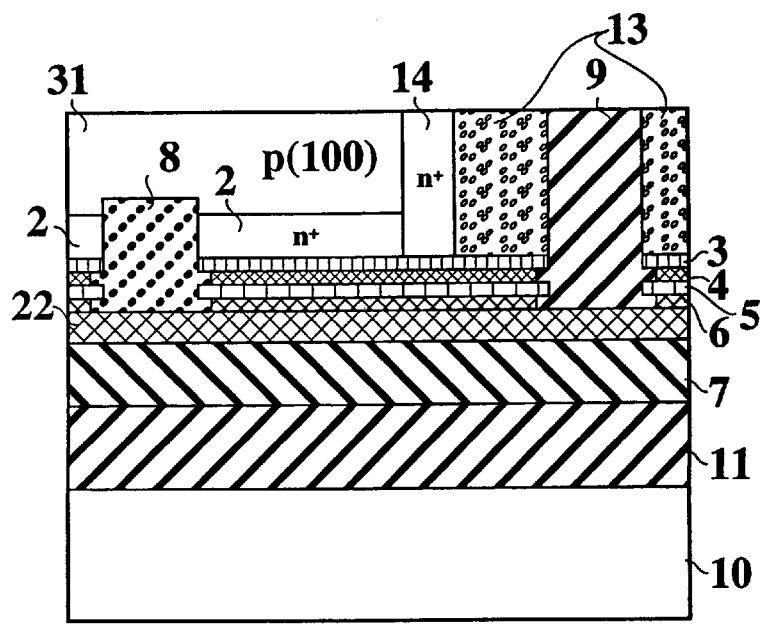
Figure 8:
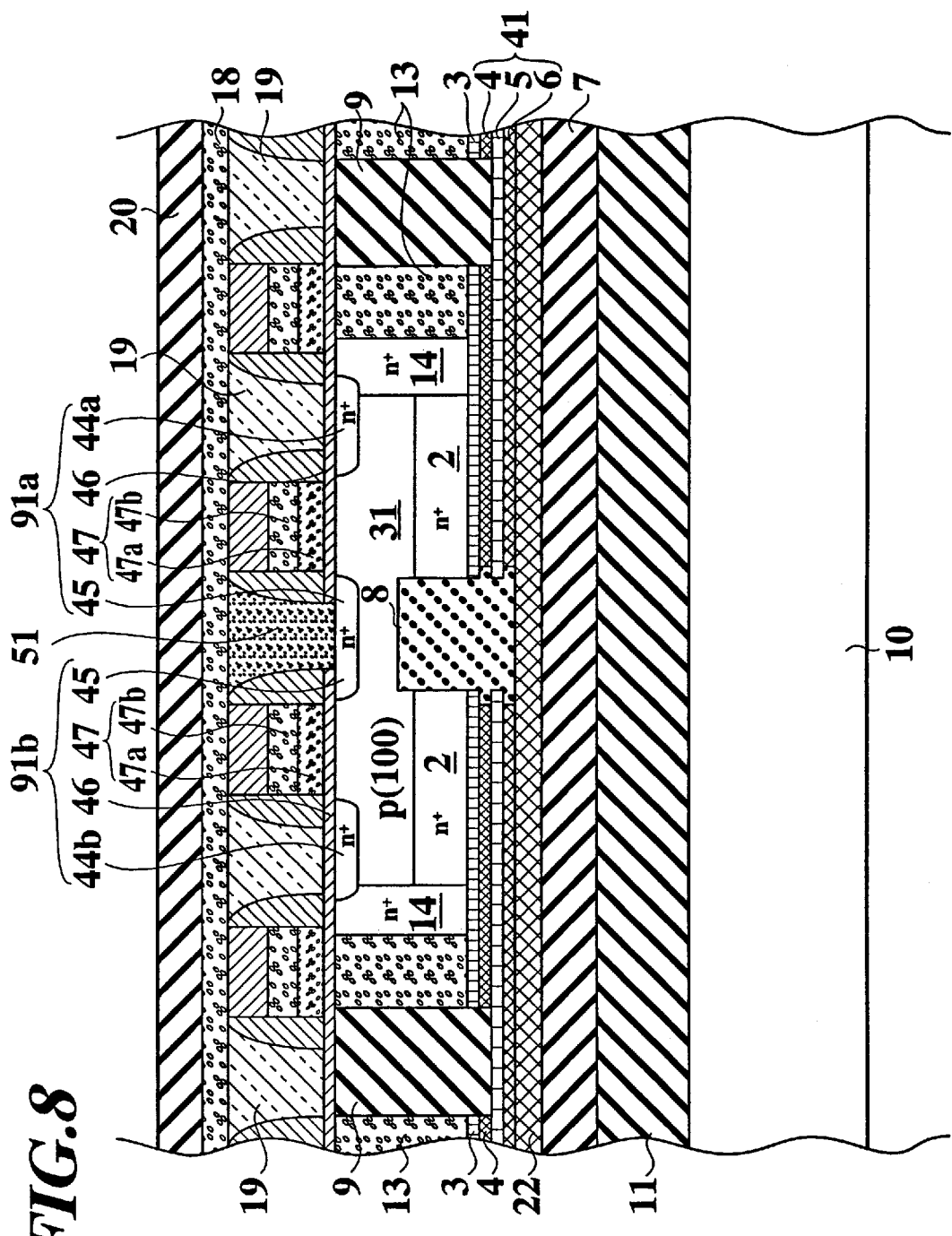
FIG. 8 is a schematic cross sectional view illustrating a memory cell according to the third embodiment of the present invention.

By another method of fabricating DRAM according to the first embodiment of the present invention shown in FIGS. 7 and 8, a dielectric thin film with very high dielectric constant can be obtained as a dielectric thin film for an epitaxial planar capacitor. For example, a dielectric constant as large as 920 was obtained. By the capacitor using this dielectric thin film an excellent performance of DRAM was ascertained.

Above-mentioned method of fabricating DRAM according to the first embodiment of the present invention has a feature that all of the patterning of a cell region are basically performed from the side of the second main surface after direct bonding. Consequently, it has a very big feature that when the first and second surfaces of Si wafer are separately patterned, complicated and time consuming step of mask alignment against both surfaces is unnecessary so that a problem of misalignment of the patterns at two surfaces can be avoided. Furthermore, as an epitaxial dielectric layer is formed on entire of the surface, high reliability and efficiency can be expected.

Although it is not shown in the figure, the contact plug for the plate electrode layer can be formed by digging grooves from the second main surface in the neighborhood of the cell, and burying the grooves with conductive materials.

Second Embodiment

Figure 6:
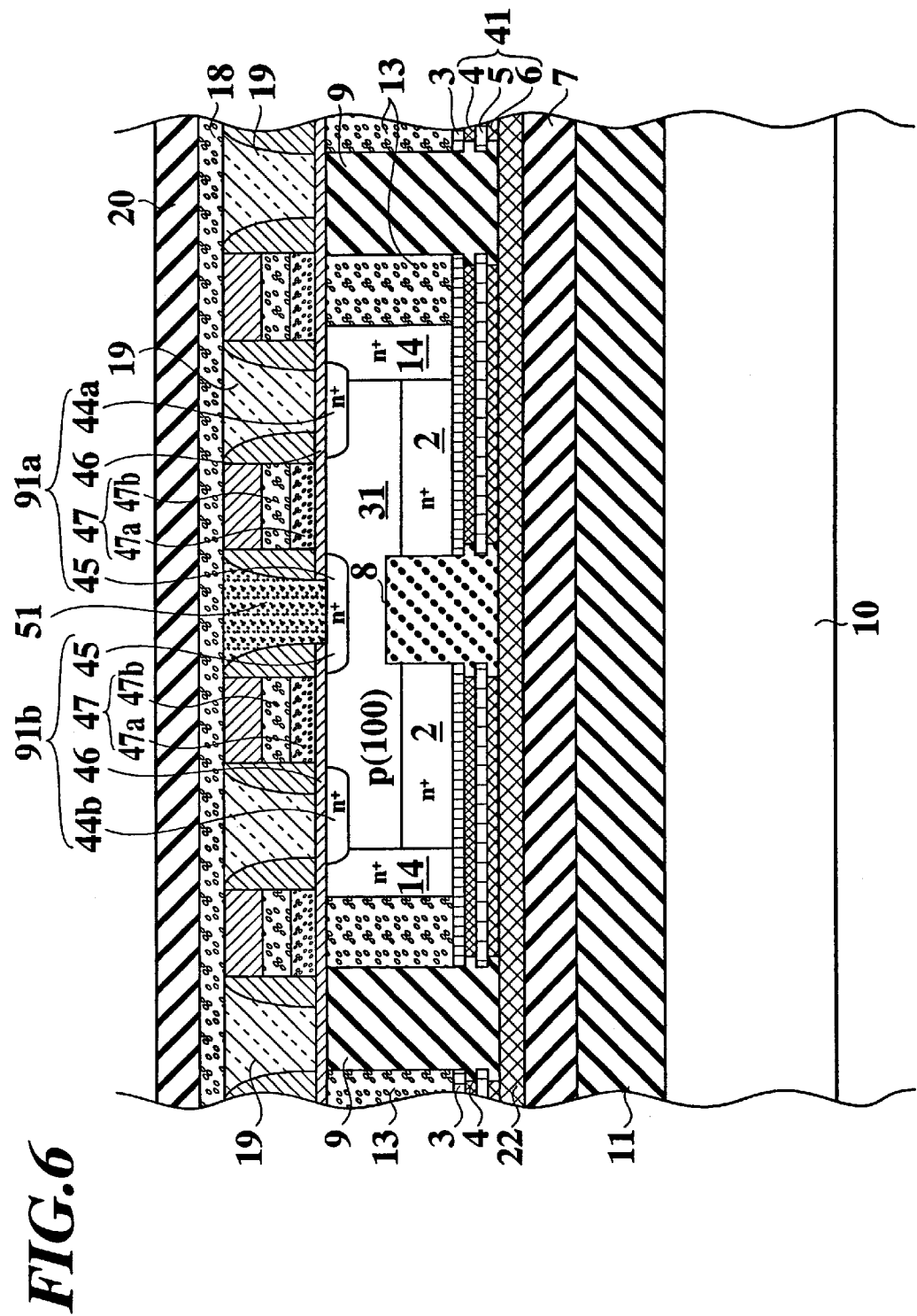
FIG. 6 is a schematic cross sectional view illustrating a memory cell of DRAM according to the second embodiment of the present invention.

FIG. 6 is a schematic cross sectional view illustrating a portion corresponding to two unit cells (memory cells) of DRAM according to the second embodiment of the present invention. In FIG. 6, an epitaxial planar capacitor 41 comprising a first electrode layer 4, a dielectric thin film 5 and a second electrode layer 6 are deposited by epitaxial growth in a first main surface of a thin film semiconductor layer 31 made from a p-type Si (100) substrate. Two switching transistors 91a and 91b are formed in a second main surface opposed to the first main surface. The switching transistor 91a comprises an n$^+$ source region 44a, an n$^+$ drain region 45, a gate oxide film 46 and a gate electrode layer 47. The n$^+$ drain region 45 also serves as a drain region of the switching transistor 91b, i.e. the switching transistor 91b comprises an n$^+$ source region 44b, an n$^+$ drain region 45 and a gate oxide film 47. Both the gate electrode layers 47 of the switching transistor 91a and 91b have a double layered structure composed of doped polysilicon layer 47a and a silicide layer of refractory metal 47b. Refractory metal can be used instead of its silicide. The gate electrode layer 47 also serves as a word line. The n$^+$ drain electrode layer 45 common to the switching transistors 91a and 91b is connected to a bit line 18 through a contact plug 51. The thin film semiconductor layer 31 is a silicon layer, wherein the two switching transistors 91a and 91b are formed. The thin film semiconductor layer 31 is separated from the adjacent thin film semiconductor layers. An n$^+$ side wall diffusion layer 14 is formed in the neighborhood of the thin film semiconductor layer 31 and a contact plug 13 made of an n$^+$ doped polysilicon is formed between the n$^+$ side wall diffusion layer and the element isolation region 9. Further, an n$^+$ impurity diffusion layer 2 is formed in the first main surface of the thin film semiconductor layer 31. A barrier metal layer 3 is formed between the first metal layer 4 constructing an epitaxial planar capacitor of DRAM and the n$^+$ impurity diffusion layer 2 to prevent the diffusion of the constituent elements of the first electrode layer 4 into the thin film semiconductor layer. A plate electrode layer 22 is connected to the bottom of the second electrode layers 6 of the epitaxial planar capacitors 41. As shown in FIG. 6, the element isolation region 9 is formed deeply from the upper surface (the second main surface) of the thin film semiconductor layer 31 down to the plate electrode layer 22. The element isolation region 9 separates the epitaxial planar capacitors of adjacent memory cells each other, together with the capacitor isolation region 8. Namely, in the second embodiment of the present invention, the second electrode layers 6 of the epitaxial planar capacitors 41 in each cell are independent each other, differently from the first embodiment. The epitaxial planar capacitors 41 are formed under the two switching transistors 91a and 91b on a surface of the same horizontal level.

As shown in FIG. 6, the barrier metal layer 3 connected to the first electrode layer of the epitaxial planar capacitor 41 of DRAM according to the second embodiment of the present invention is connected to the n$^+$ source region 44a of the switching transistor 91a as well as to the n$^+$ source region 44b of the switching transistor 91b through the contact plug 13, the n$^+$ side wall diffusion layer 14 and the n$^+$ impurity diffusion layer 2. Then the resistance between n$^+$ source region 44a or 44b and the first electrode layer 4 is very low. According to the construction shown in FIG. 6, since the (100) plane of Si (100) substrate can be used as a base substrate, a (100) oriented (Ti, Al)N barrier metal layer 3, the first and the second electrode layers 46 such as a (100) oriented SrRuO$_3$ and the dielectric thin film 5 such as a (100) oriented (Ba, Sr)TiO$_3$ can be formed on entire of the surface under the lower side of the thin silicon layer 31 in stable state. In this way, scattering of the dielectric constant of the dielectric capacitor and scattering of the leakage current which will flow through the capacitor 41 can be decreased. As the constituent layers in the epitaxial planar capacitors 41 are disposed, respectively, on the same horizontal levels under the two switching transistors 91a and 91b, steps due to coexistence of the portions of the epitaxial planar capacitors at different levels is eliminated. Hence, the formations of contact plugs and wiring layers become easy, and simplifications of the fabrication steps can be attained by omitting the planarizing steps. Since the first electrode layer 4 of the epitaxial planar capacitor 41 and the thin film semiconductor layer 31 can be separated at the same time by the insulating layers 8 and 9 for capacitor and element isolations, respectively, yield of the products can be improved. The respective layers in the epitaxial planar capacitors 41 are three-dimensionally disposed on same levels under the bottom surface of the thin film semiconductor layer 31 wherein the two switching transistors 91a and 91b are formed and hence, all regions under the thin film semiconductor layer 31 can be used as capacitor regions. Consequently, the area the thin film transistor can occupy within each memory cell is insured without increasing the area of memory cell. As a result, storage charge in the memory cell of DRAM and margin in the operation of memory cells can be increased and consequently the yield of products can be improved.

A method of fabricating DRAM according to the second embodiment of the present invention will be described using FIGS. 7A to 7G. Although the following description will be made focusing on the switching transistor 91a, also the steps of the switching transistor 91b, of course, proceed along with steps of 91a.

(a) First, as shown in FIG. 7A, the n$^+$ impurity diffusion layer 2 of about 0.1 μm in depth is formed on the first main surface of a p-type Si (100) substrate. Thereafter, the (Ti, Al)N film of 10 nm in thickness as the barrier metal 3, the SrRuO$_3$ film of 20 nm in thickness as the first electrode layer 4, the BSTO thin film of 20 nm in thickness with Ba of mole fraction 30% as the thin film dielectric layer 5 and the SrRuO$_3$ film of 20 nm in thickness as the second electrode layer 6 are grown epitaxially using the RF or DC sputtering methods at a substrate temperature of 600° C., successively without exposure to air and thus the epitaxial planar capacitor is completed.

(b) Next, as shown in FIG. 7B, the first groove 61 for separation of adjacent epitaxial planar capacitors and the second groove 62 for element isolation are formed by etching the second electrode layer 6, the thin film dielectric layer 5, the first electrode layer 4, the barrier metal 3, the n$^+$ impurity diffusion layer 2 and the p-type Si (100) substrate 1, using the lithography and RIE methods or another method. In addition, after the etching processes of the first groove 61 and the second groove 62, the edges at the first and the second electrode layers, SrRuO$_3$ films 4 and 6, are selectively wet-etched to form an undercut region, in order to prevent leakage at the edge surface of the dielectric layer.

(c) Next, as shown in FIG. 7C, the first groove 61 is buried with a first insulating film to form the capacitor isolation region 8 and the second groove 62 is buried with a second insulating film to form the element isolation region 9. The first insulating film and the second insulating film may be same material such as an oxide film (SiO$_2$ film). Then the first and second insulating films can be deposited simultaneously to a thickness larger than the depth of the first and the second grooves 61 and 62 by CVD or another method. Thereafter the surface is polished by CMP or another method as shown in FIG. 7C. In this case, a TiN layer or another layer can be formed previously as a polishing stop layer so as to protect the surface of the second electrode layer 6, and the polishing stop layer is removed after CMP.

(d) Next, as shown in FIG. 7D, a TiN film of 200 nm in thickness is deposited at room temperature on entire of the surface as plate electrode layer 22. Further, a BPSG film of for example, 500 nm in thickness is formed on the plate electrode layer 22 as a bonding layer 7 and the surface is polished by for example, CMP method to obtain a mirror-like surface.

(e) Next, a BPSG layer 11 is deposited on a supporting substrate 10 previously prepared and the surface is polished to obtain a mirror-like surface. Then, the p-type Si (100) substrates 1 and the supporting substrate 10 are bound by mating the BPSG layers, both surfaces of which have become mirror-like. The bonding method may be a known SDB technique, which may include the method such as heat treatment at about 900° C.

(f) Next, as shown in FIG. 7F, the thickness of the semiconductor substrate 1 is adjusted by removing a part of the second main surface of the semiconductor substrate 1. Then, the thin film semiconductor layer 31 of, for example, about 150 nm in thickness is formed. In the adjustment of the thickness of the semiconductor substrate 1, it is preferable to employ the polishing technology such as the CMP method, using an insulating region 9 as a stopping layer for the polishing. To obtain the thin film semiconductor layer 31, another method such as cleaving of the SMART-CUT substrates at implanted boundary plane or grinding, polishing the supporting substrate of SOI substrate can also be used. Of course, the second main surface of the thin film semiconductor layer 31 is polished to be a mirror-like surface to accommodate the later steps of transistor formation. Element isolation is also done in the transistor formation region in the same time by the element isolation region 9 formed from the side of the first main surface.

(g) Next, a connecting groove is opened adjacent to the element isolation region 9 using lithography and dry etching such as RIE methods. It is desirable, as an etching condition at this time, that the first electrode layer 3 or the second one 4 is used as a stopper for self stopping. Next, as shown in FIG. 7G, a doped polysilicon film containing for example, $n^+$ impurity is deposited to a thickness of about 200 nm on entire of the surface. Then the entire surface is etched back by CMP or another method to form the contact plug 13 made of $n^+$ doped polysilicon film in the connecting groove. Thereafter, n-type impurity in the $n^+$ doped polysilicon 13 is diffused into the thin film semiconductor layer and thus, the $n^+$ side wall diffusion layer 14 is formed.

(h) Next, the switching transistor or another element is formed using a known process. Namely, the switching transistor 91a shown in FIG. 6 comprising the $n^+$ source region 44a, the $n^+$ drain region 45, the gate oxide film 46 and the gate electrode layer 47 is formed in and above the second main surface of the thin film semiconductor layer 31. The gate electrode layer 47 serves also as a word line 57. Then the bit line 18 is connected to the drain region 45 through the contact plug 51 and thus, DRAM according to the second embodiment of the present invention is completed. The contact plug 51 is formed by burying the contact hole opened through a first interlayer insulating film 19 which is formed in the upper portion of the switching transistor 91. A second interlayer insulating layer 20 is formed above bit line 18.

According to above-mentioned fabricating method, the first electrode layer 4, the dielectric thin film 5 and the second electrode layer 6 can be formed sequentially, so that scattering of the dielectric properties can be decreased. As a result, a dielectric thin film with very high dielectric constant of 950 was obtained as a dielectric thin film for epitaxial planar capacitor. By the epitaxial planar capacitor using this dielectric thin film, an excellent performance of DRAM was ascertained. Since no poly BSTO thin film is grown, according to the fabricating method shown in FIGS. 7A to 7G, the dielectric thin film of the epitaxial planar capacitor 41 is an epitaxially grown single crystalline film entirely, including the bottoms of the insulating regions 8 and 9, the reliability of the storage capacitor is very high.

Third Embodiment

FIG. 8 is a schematic cross sectional view illustrating a unit cell(memory cell) of DRAM according to the third embodiment of the present invention. A different point from DRAM according to the first embodiment shown in FIG. 1A is that the capacitor isolation region 8 is formed deeply than that in the case of FIG. 1A. However, in the third embodiment, the structure of the element isolation region 9 same as the first embodiment and is formed down to the top of the dielectric thin film 5. By this insulating region 9, only the barrier metal 3 and the electrode layer 4 are separated but the dielectric thin film 5 and the second electrode layer 6 are not separated. On the other hand, the capacitor isolation region 8 separates the dielectric layer 5 and the second electrode layer 6. Other points are similar to the first embodiment. An effectiveness similar to the first embodiment can be obtained by the structure of DRAM according to the third embodiment shown in FIG. 8.

The feature of the third embodiment of the present invention shown in FIG. 8 lies in the fabricating method. A fabricating method of DRAM according to the third embodiment will be described using FIGS. 9A to 9L focusing on the switching transistor 91a side.

Figure 9A:
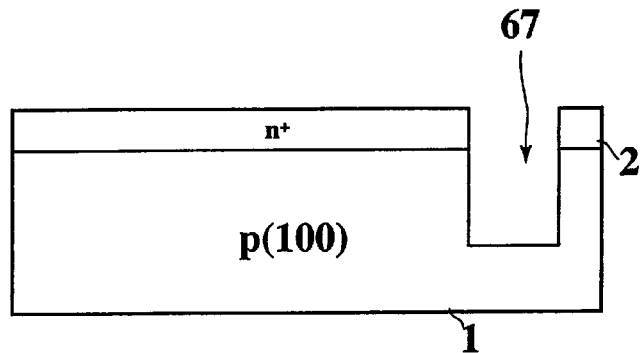
FIGS. 9A to 9L are schematic cross sectional views of steps for illustrating a fabricating method of DRAM according to the third embodiment of the present invention.
Figure 9B:
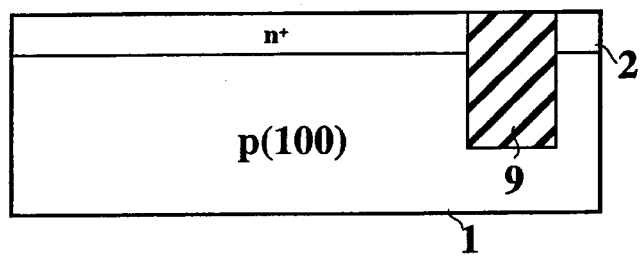

(a) First, as shown in FIG. 9A, the $n^+$ impurity diffusion layer 2 of about 0.1 μm in depth is formed on the first main surface of the p-type Si (100) substrate and thereafter, the second groove 67 for element isolation region is formed by lithography and etching such as RIE or other method. Then, an insulating film such as oxide film ($SiO_2$ film) is deposited to a thickness larger than the depth of the second groove 67 by CVD or another method. Thereafter, the surface is polished by CMP or another method and the element isolation region 9 is buried into the second groove 67 as shown in FIG. 9B.

Figure 9C:
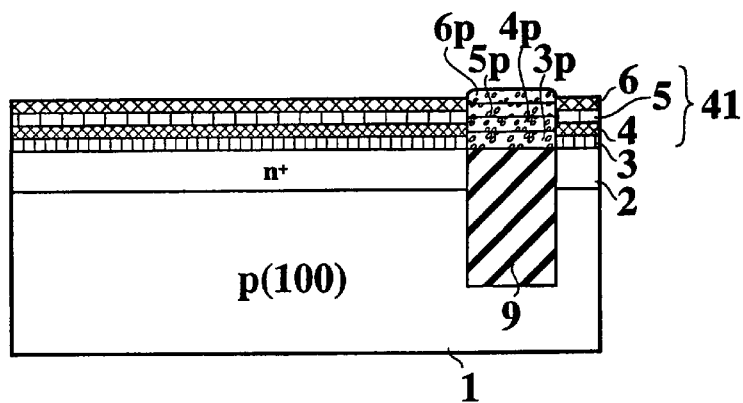
Figure 9D:
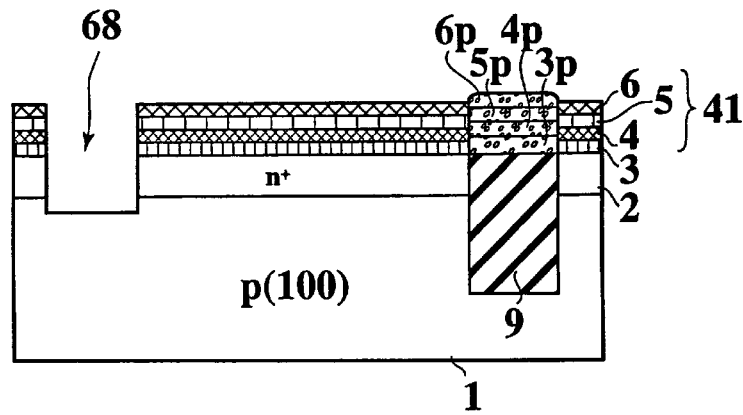
Figure 9E:
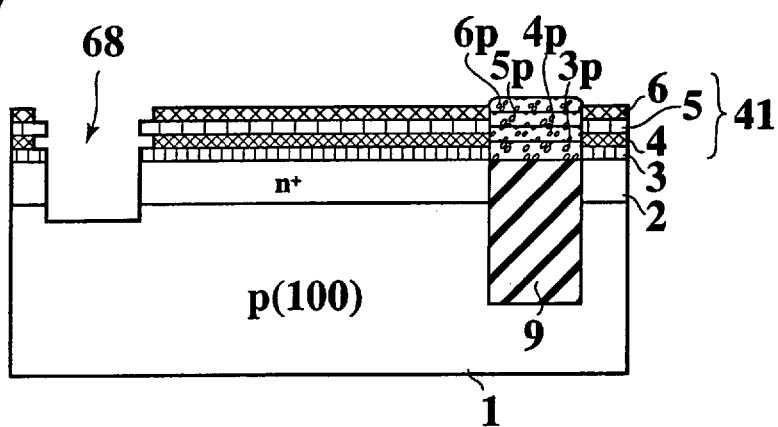
Figure 9F:
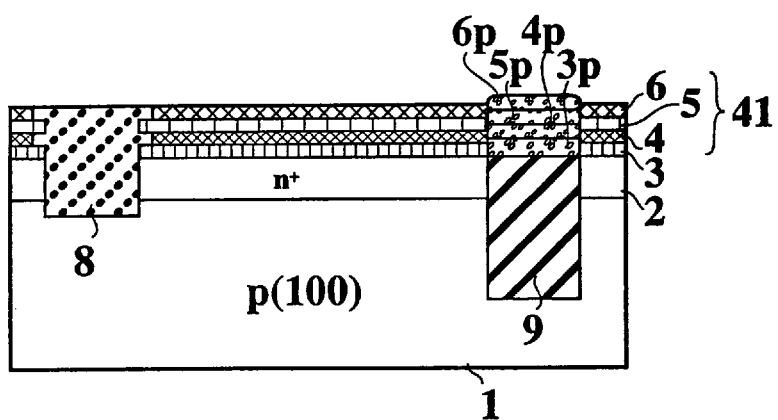

(b) Next, as shown in FIG. 9C, the (Ti, Al)N layer of 10 nm in thickness as the barrier metal layer 3, the $SrRuO_3$ film of 20 nm in thickness as the first electrode layer 4, the BSTO film of 20 nm in thickness with Ba of mole fraction 30% as the dielectric thin film 5 and the $SrRuO_3$ layer of 20 nm in thickness as the second electrode layer 6 are sequentially grown without exposure to air by the epitaxial method using RF or DC sputtering at a substrate temperature of 600° C., and thus the epitaxial planar capacitor 41 is formed. The upper portion of the element isolation region 9 is polycrystallized and the poly-barrier metal layer 3p, poly-$SrRuO_3$ films 4p and 6p, and the poly-BSTO thin film layer 5p are formed ("poly-barrier metal layer" 3p means polycrystallized barrier metal layer). Further, as shown in FIG. 9D, the first groove 68 to separate adjacent epitaxial planar capacitors each other is formed by etching the second electrode layer 6, the dielectric thin film 5, the first electrode layer 4, the barrier metal layer 3, the $n^+$ impurity diffusion layer 2 and the p-type Si (100) substrate 1 using lithography and RIE or another method. Next, as shown in FIG. 9E, after etching process of the first groove 68 by RIE, edges of the first and the second electrode layers, the SrRuO$_3$ film, are selectively wet-etched to form undercut portions in order to prevent leakage at the edge surface of the dielectric thin film 5. An insulating film is deposited to a thickness larger than the depth of the first groove 68 and the surface is polished by CMP or another method and then, the capacitor isolation region 8 is buried into the first groove 68. In this case, the TiN layer or another layer can be prepared previously so as to use as a marker layer for end point monitoring of the polishing, and the marker layer is removed by etching after CMP, to protect the surface of the second electrode layer 6 at CMP.

Figure 9G:
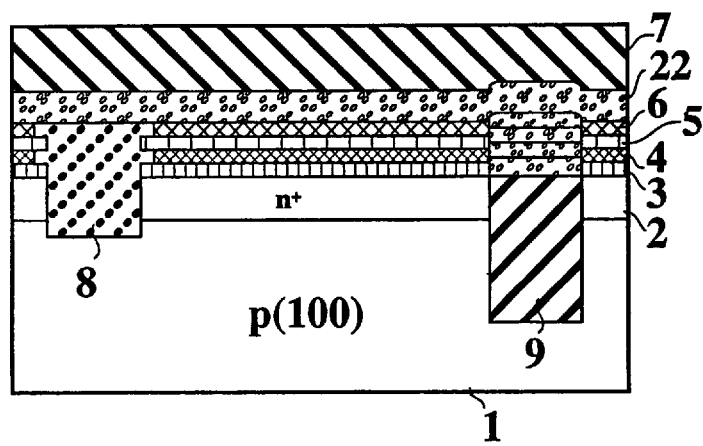

(c) Next, as shown in FIG. 9G, the TiN layer for 200 nm in thickness is deposited on entire of the surface at room temperature as the plate electrode layer 22. On the plate electrode layer 22, the BPSG film is deposited to a thickness of about 500 nm as the bonding layer 7 and thereafter, the surface is polished by for example, CMP method or another method.

Figure 9H:
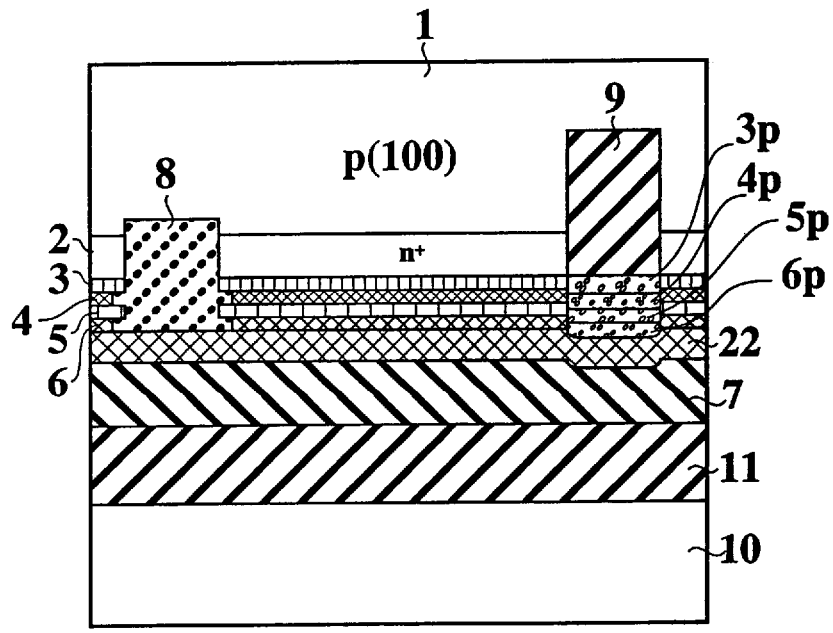

(d) Next, the supporting substrate 10 is prepared separately. Then, as shown in FIG. 9H, the BPSG film 11 is deposited on a separate surface of the supporting substrate 10 and the surface is polished to obtain a mirror-like surface. The supporting substrate 10 is bound to the p-type Si (100) substrate 1 by mating the mirror-like surfaces of the BPSG films each other. The bonding can be made by known SDB technique, for example, the technique may include heat treatment at about 900° C.

Figure 9I:
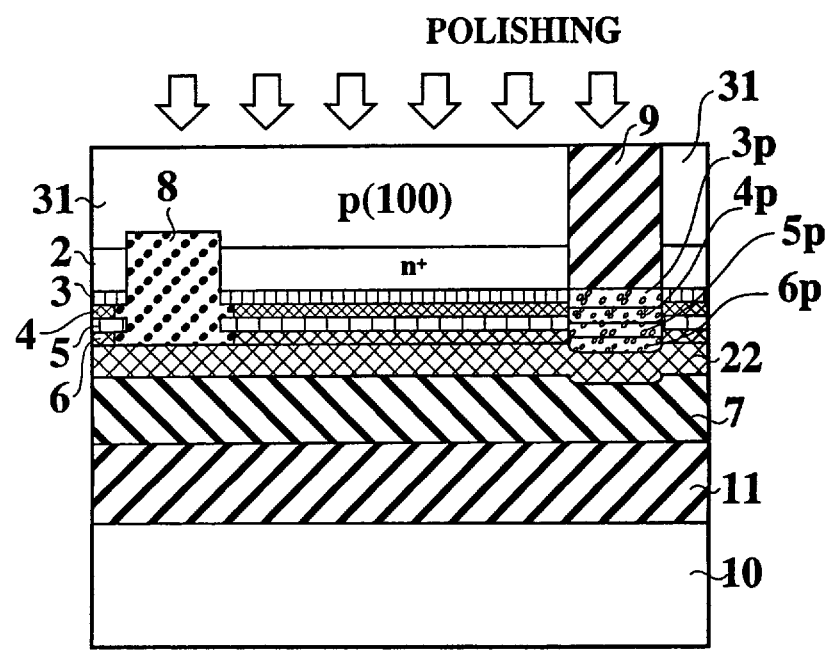

(e) Next, as shown in FIG. 9I, the thickness of the p-type Si (100) substrate 1 is adjusted by removing a part of the second main surface of the p-type Si (100) substrate 1. Then, the thin film semiconductor layer 31 of, for example, about 150 nm in thickness is formed. In the adjustment of the thickness of the semiconductor substrate 1, it is preferable to employ the polishing technology such as the CMP method, using an insulating region 9 as a stopping layer for the polishing. The thin film semiconductor layer 31 can also be formed by cleaving of SMART-CUT substrate or grinding and polishing of the supporting substrate of SOI substrate. Of course, the second main surface of the thin film semiconductor layer 31 is polished in mirror-like surface to accommodate the later steps of forming transistor. Regions for transistor formation are separated each other by the buried element isolation region 9 formed from the first main surface.

Figure 9J:
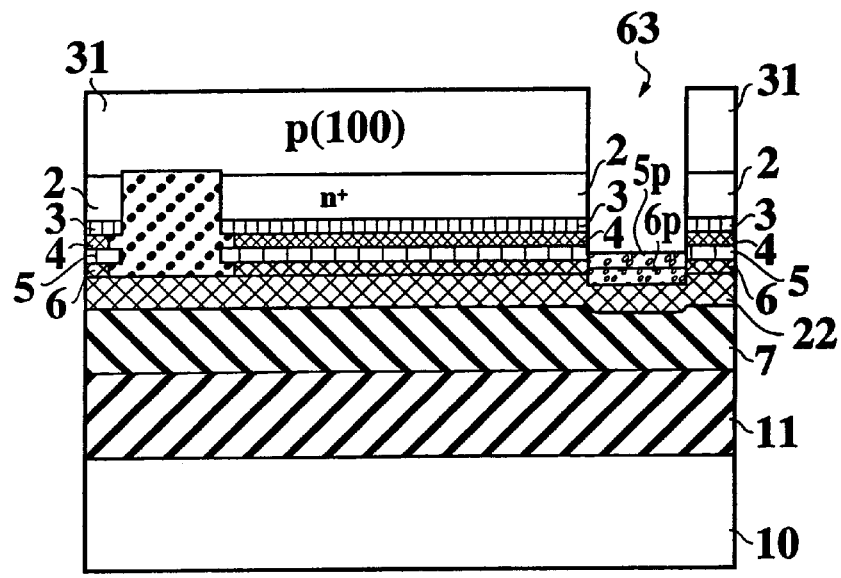

(f) Next, as shown in FIG. 9J, the second groove (trench) 63 is again excavated by selective etching-out of the oxide film (SiO$_2$ film) using etchant of an ammonium fluoride (NH$_4$F) solution. Further, the poly-barrier metal layer 3$p$ and the first electrode layer 4$p$ (poly-SrRuO$_3$ layer)of the epitaxial planar capacitor produced in bottom portion of the second groove (trench) are etched out by RIE or another method to separate the barrier metal layer 3 and the first electrode layer 4 of the epitaxial planar capacitor 41 at the bottom the second groove 63, the poly BSTO thin film layer 5P is exposed.

Figure 9K:
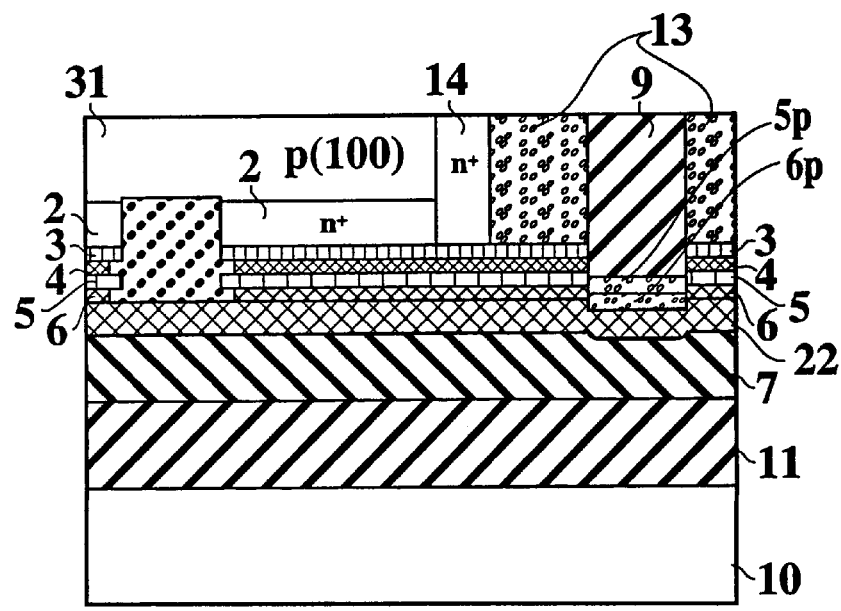

(g) Next, the insulating film such as oxide film is deposited into the second groove 63 to a thickness larger than depth of the second groove 63 which has become deep by removing the poly films 3$p$ and 4$p$. Thereafter, the surface is polished by CMP or another method and thus the second groove 63 is buried back again with the insulating region 9 as shown in FIG. 9K. Next, the connecting groove is opened adjacently to the insulating region 9 using photolithography and dry etching such as RIE methods. An etching condition such as automatic stopping, using layers from the barrier metal layer 3, is desirable. Next, the doped polysilicon layer containing for example, n$^+$ type impurity is deposited to a thickness of about 200 nm to bury the connecting groove. Then, etching back of entire of the surface by CMP or another method is performed to form the contact plug 13 made of n$^+$ doped poly-silicon layer in the connecting groove. Thereafter, the n-type impurity in the n$^+$ doped polysilicon layer is diffused into the thin film semiconductor layer 31 to form the n$^+$ side wall diffusion layer 14.

Figure 9L:
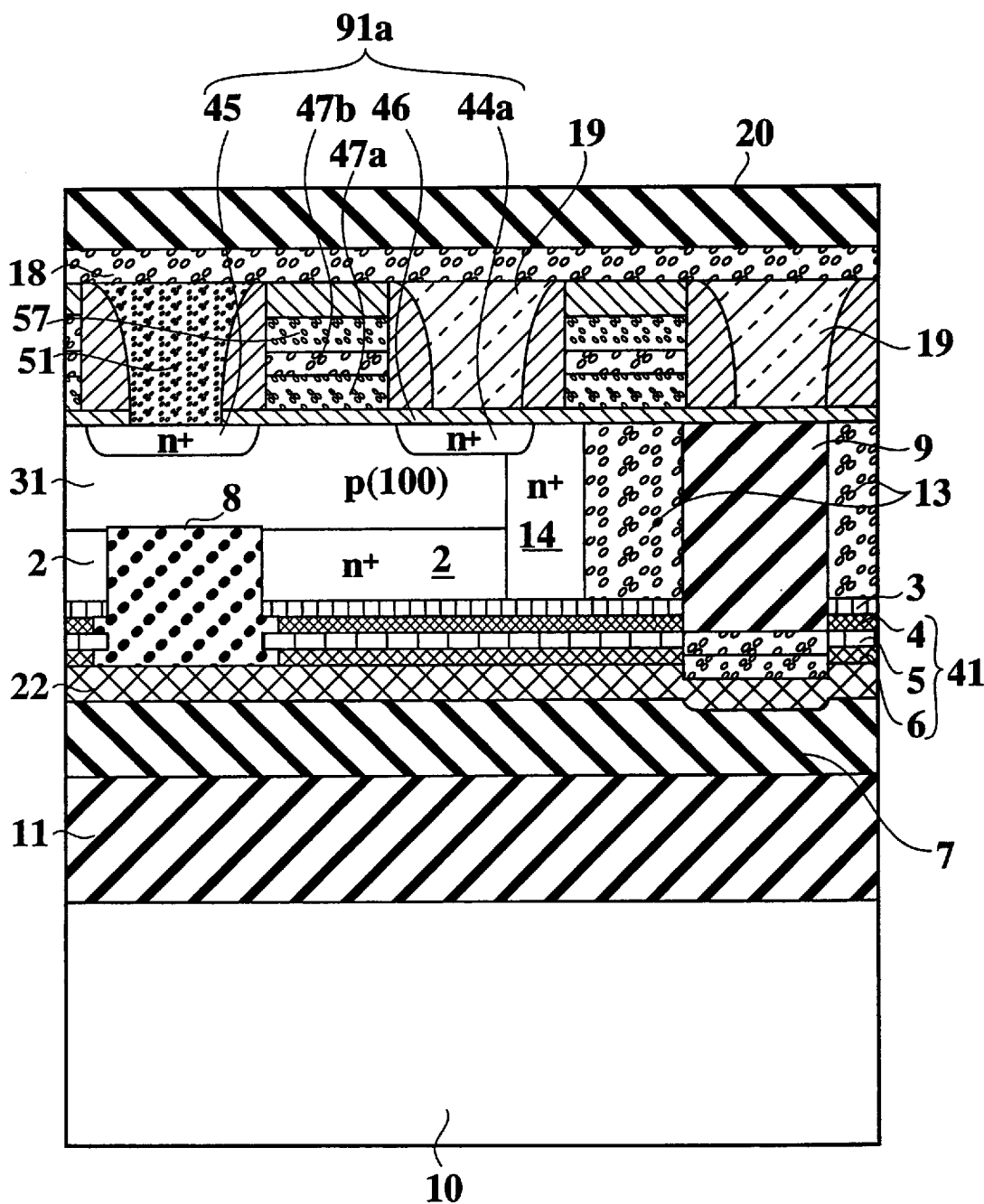

(h) Next, the switching transistor 9 is formed in the side of the second main surface of the thin film semiconductor layer 31 using the known MOS process. Namely, as shown in FIG. 9L, the switching transistor 91 comprising the n$^+$ source region 44$a$, the n$^+$ drain region 45, the gate oxide film 46 and the gate electrode layer 47 is constructed. The electrode layer 47 serves also as the word line 57. Further, the bit line 18 is connected to the n$^+$ drain electrode layer 45 through the contact plug 51 to complete DRAM according to the third embodiment of the present invention.

According to the fabricating method shown in FIGS. 9A to 9L, scattering of the dielectric properties can be decreased since the first electrode layer 4, dielectric thin film 5 and the second electrode layer 5 are continuously grown by epitaxy. As the dielectric thin film 5, a dielectric layer with very high dielectric constant of 950 was obtained. Good performances of DRAM by this dielectric epitaxial planar capacitor were ascertained. In the fabrication method shown in FIGS. 9A to 9L, the bottom portion of the element isolation region 9 is polycrystallized to form the poly-SrRuO$_3$ layer 4$p$ and the poly-BSTO thin film layer 5$p$. In order to avoid polycrystallization at this bottom portion, the fabricating method shown in FIGS. 10A to 10H can be used.

FIGS. 10A to 10H are schematic cross sectional views of steps illustrating another fabricating method of DRAM according to the third embodiment of the present invention.

(a) First, as shown in FIG. 1A, the n$^+$ impurity diffusion layer 2 of about 0.1 $\mu$m in depth is formed on the first main surface of the p-type Si (100) substrate 1. Thereafter, the (Ti, Al)N film of 10 nm in thickness as the barrier metal 3, the SrRuO$_3$ film of 20 nm in thickness as the first electrode layer 4, the BSTO film of 20 nm in thickness with Ba of mole fraction 30% as the dielectric thin film 5 and the SrRuO$_3$ film of 20 nm in thickness as the second electrode layer 6 are continuously grown by epitaxy at the substrate temperature of 600° C. without exposure to their using RF or DC sputtering methods to form the epitaxial planar capacitor 41.

Figure 10A:
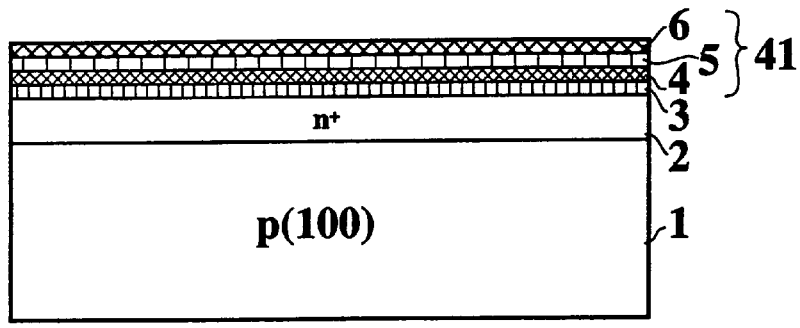
FIGS. 10A to 10H are schematic cross sectional views of steps for illustrating another fabricating method of DRAM according to the third embodiment of the present invention.
Figure 10B:
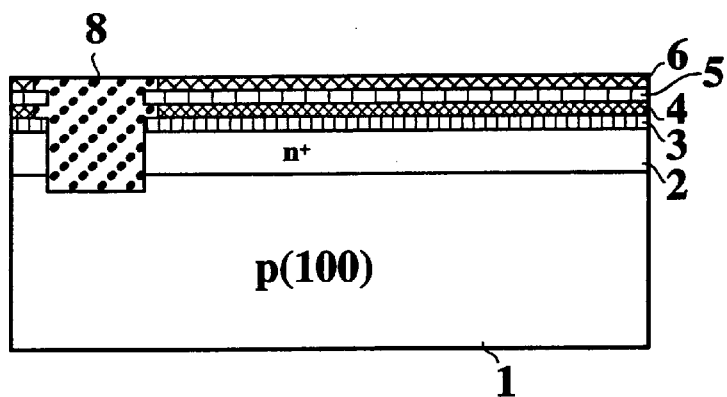

(b) Next, as shown in FIG. 10B, the first groove for separation of adjacent epitaxial planar capacitors is formed by etching using lithography and RIE methods or another method and an insulating film such as SiO$_2$ film is buried into this first groove to a thickness larger than the depth thereof. Namely, after deposition of the insulating film, the surface is polished by CMP or another method and the capacitor isolation region 8 is buried into the first groove. After etching process of the first groove by RIE, the first and the second electrode layers, SrRuO$_3$ films, are selectively wet-etched to form the under-cut portion, in order to avoid leakage at the edge surface of the dielectric thin film. In order to protect the surface of the second electrode layer at the time of CMP, the method wherein the TiN layer or another layer is prepared previously as a stopping layer of polishing and etch out after CMP can be used.

Figure 10C:
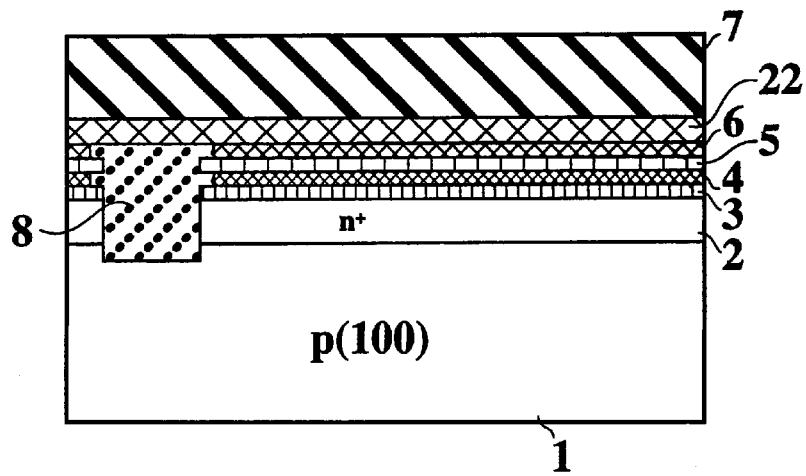

(c) Next, as shown in FIG. 10C, the TiN film of 20 nm in thickness is deposited on entire of the surface at room temperature as the plate electrode layer 22. Then, on the plate electrode layer 22, the BPSG film as the bonding layer 7 is deposited to a thickness of for example, 500 nm, and the surface is polished to make a mirror-like surface.

Figure 10D:
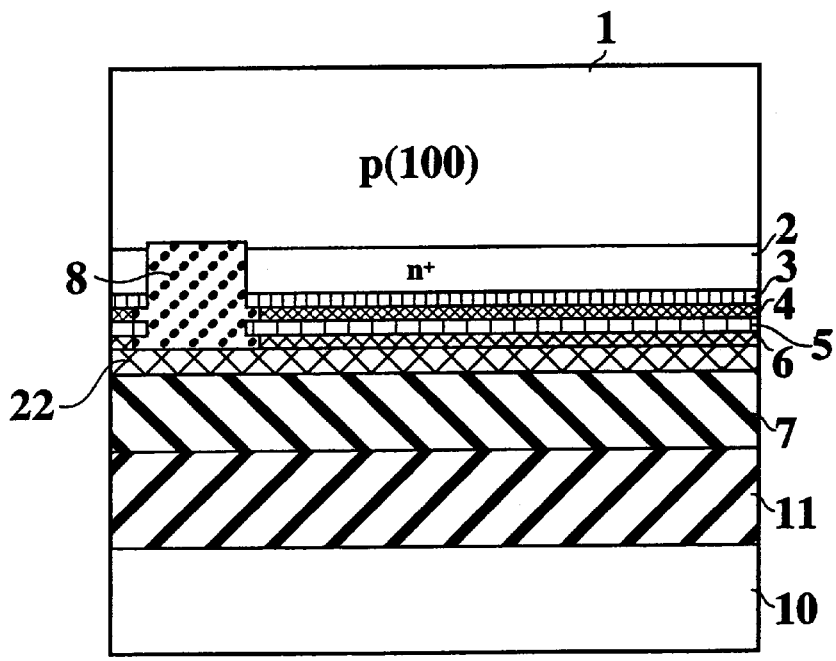

(d) Next, a supporting substrate 10 is prepared separately. On the surface of the supporting substrate 10, the BPSG film 11 is deposited and the surface thereof is made mirror-like as shown in FIG. 10D. Then, the p-type Si (100) substrate 1 is stuck to the supporting substrate 10 by mating the mirror-like surfaces of BPSG films each other. The bonding can be performed by known SDB technique with heat treatment at for example, about 900° C.

Figure 10E:
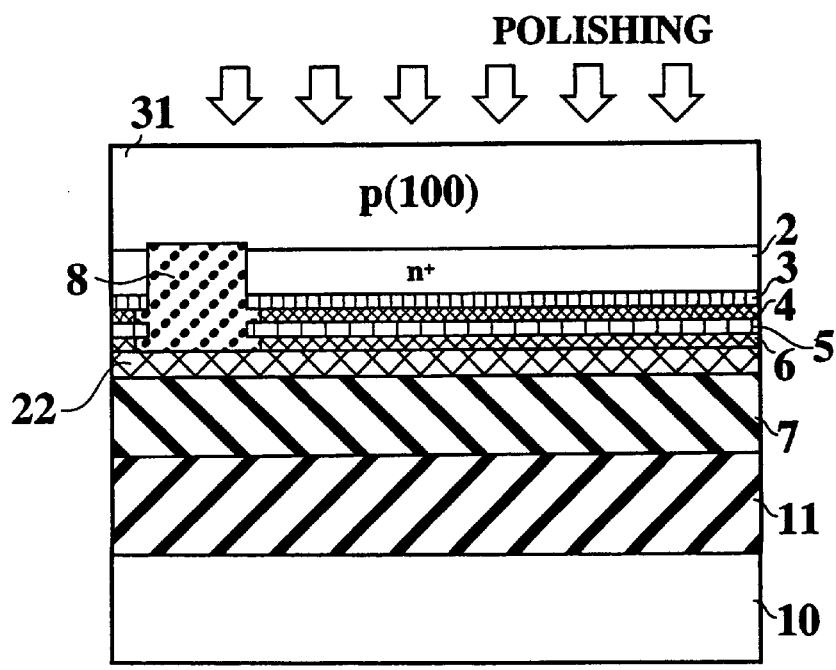

(e) Next, as shown in FIG. 10E, the thickness of the p-type Si (100) substrate 1 is adjusted by removing a part of the second main surface of the p-type Si (100) substrate 1. Then, the thin film semiconductor layer 31 of, for example, about 150 nm in thickness is formed. This thin film semiconductor layer 31 can be formed also by the method of cleaving the SMART-CUT substrate or polishing of the SOI substrate. Of course, the second main surface of the thin film semiconductor layer 31 is polished in mirror-like surface in order to accommodate the later formation steps of transistor.

Figure 10F:
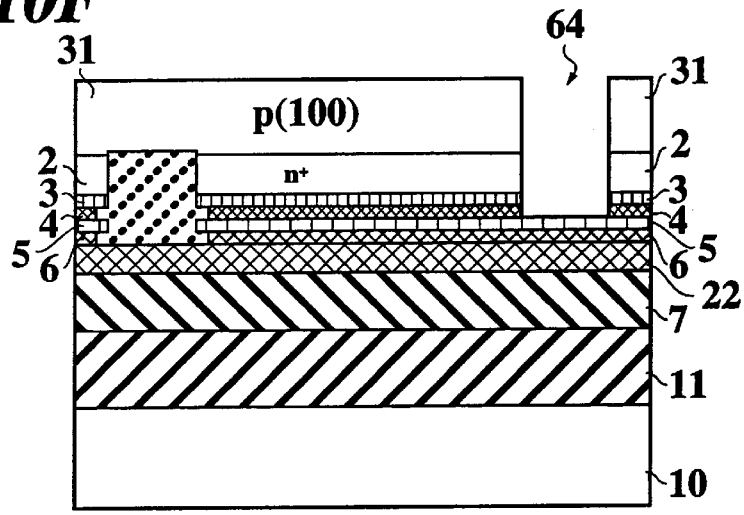

(f) Next, as shown in FIG. 10F, the second groove 64 for element isolation is formed by the lithography and RIE methods or another method. At this time, it is desirable to use the dielectric thin film 5 of the epitaxial planar capacitor as the stopping layer for etching. The element isolation of the switching transistor and the separation of the first electrode layer 4 of the epitaxial planar capacitor 41 can be performed at the same time by the formation of the second groove 64.

Figure 10G:
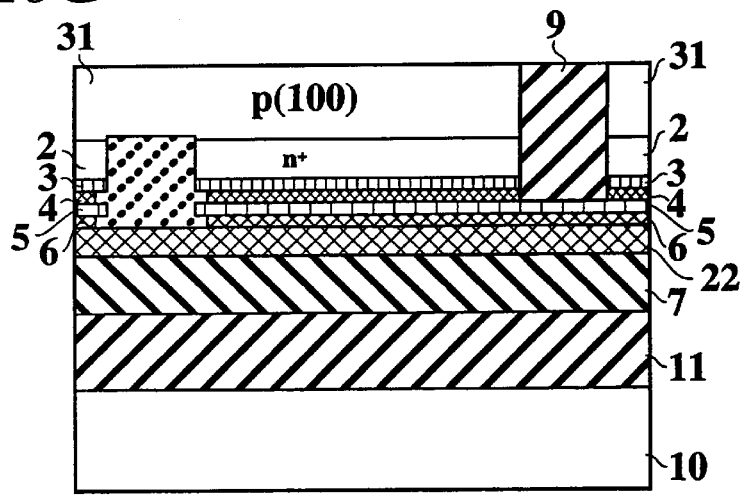
Figure 10H:
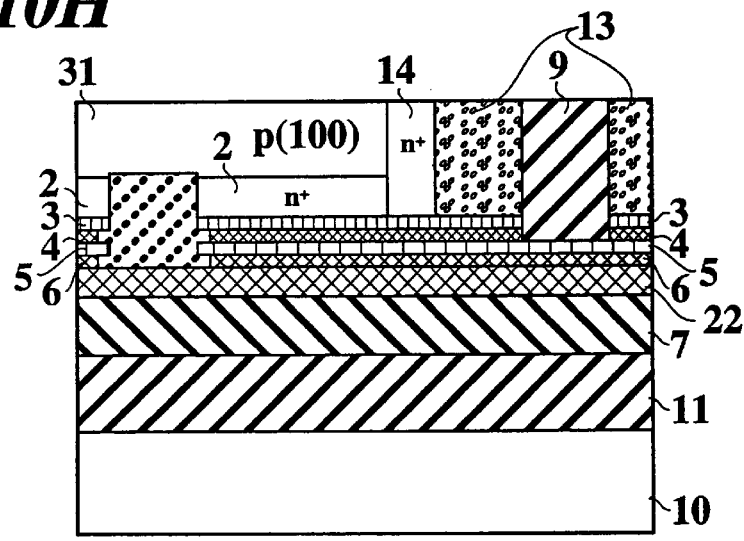

(g) Later steps are similar to the steps of (h) in above-mentioned fabricating method described using FIGS. 9A to 9L. Namely, the element isolation region 9 is buried into the second groove 64 as shown in FIG. 10G. Next, adjacently to this element isolation region 9, the contact plug 13 made of $n^+$ doped polysilicon layer is formed. Thereafter, the n-type impurity in the $n^+$ doped poly-silicon layer is diffused into the thin film semiconductor layer 31 by annealing for 20 second at about 800° C. in an nitrogen atmosphere using RTA method to form the $n^+$ side wall diffusion layer 14. The following steps are omitted to avoid repetition.

According to the fabricating method illustrated in FIGS. 10A to 10H, polycrystallization into poly-BSTO film of the bottom portion of the element isolation region 9 does not occur. In addition, a very high dielectric constant of for example, 930 can be obtained as the dielectric thin film 5. Excellent performance of DRAM was ascertained by epitaxial planar capacitor using this dielectric layer.

Fourth Embodiment

Figure 11:
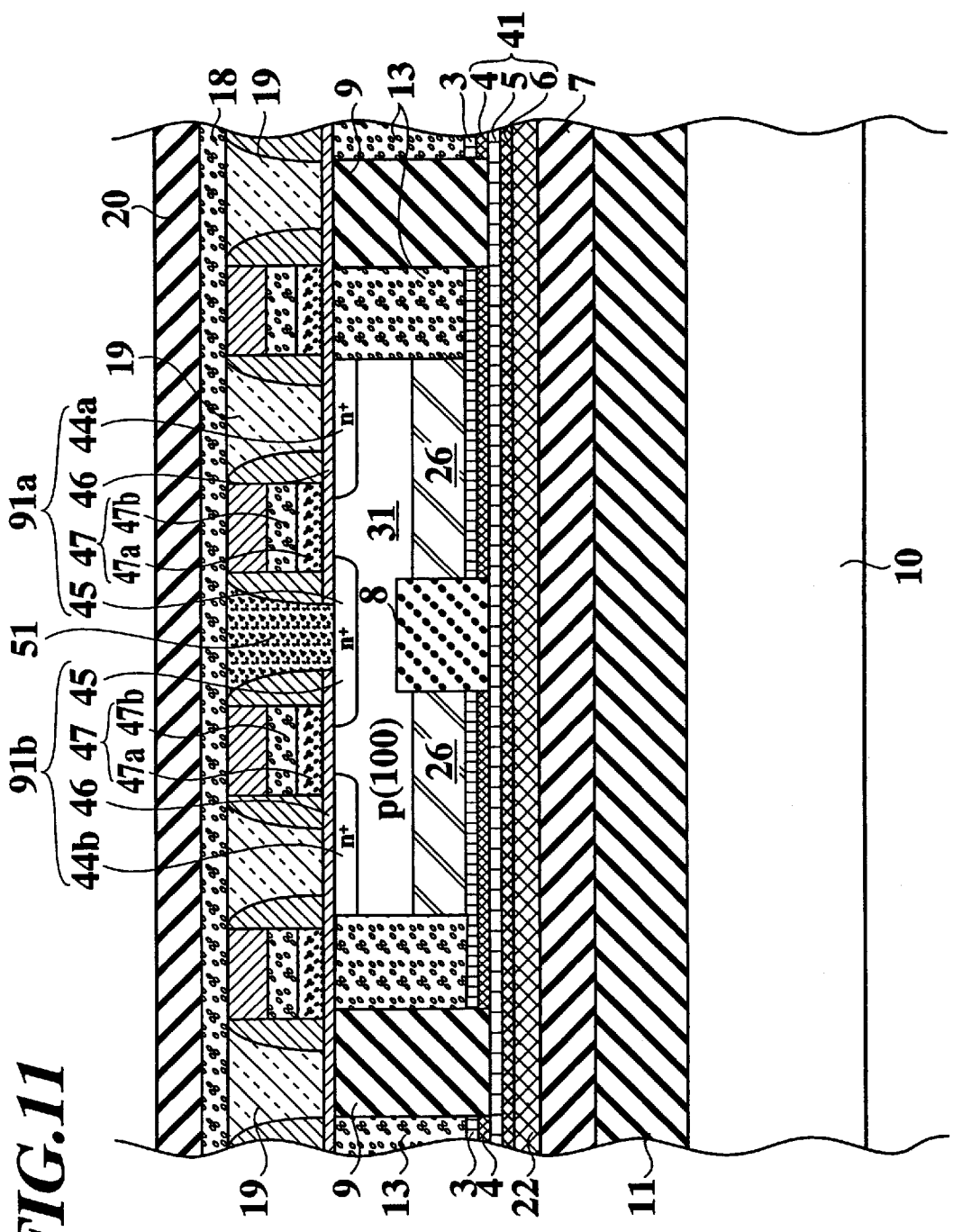
FIG. 11 is a schematic cross sectional view illustrating a memory cell of SOI-DRAM according to the fourth embodiment of the present invention.

FIG. 11 is a schematic cross sectional view illustrating a portion corresponding to two unit cells (memory cells) of DRAM with SOI structure ( hereafter denote "SOI-DRAM") according to the fourth embodiment of the present invention. In FIG. 11, a buried insulating film 26 constructing SOI structure is disposed on a first main surface of a thin film semiconductor layer 31 formed from a p-type Si (100) substrate and an epitaxially grown epitaxial planar capacitor 41 comprising a first electrode layer 4, dielectric thin film 5 and a second electrode layer 6 is formed thereunder. Two switching transistors 91a and 91b are formed on the second main surface opposite the first main surface. The switching transistor 91a comprises an $n^+$ source region 44a, an $n^+$ drain region 45, a gate oxide film 46 and a gate electrode layer 47. The $n^+$ drain region 45 also serves as a drain region of the switching transistor 91b, i.e. the switching transistor 91b comprises an $n^+$ source region 44b, an $n^+$ drain region 45 and a gate oxide film 47. Both the gate electrode layers 47 of the switching transistor 91a and 91b have a double layered structure composed of a doped polysilicon layer 47a and a refractory metal silicide layer 47b. Refractory metal may be used instead of the refractory metal silicide layer. The gate electrode layer 47 also serves as a word line. The $n^+$ drain electrode layer 45 common to the switching transistors 91a and 91b is connected to a bit line 18 through a contact plug 51. The thin film semiconductor layer 31 wherein the two switching transistors 91a and 91b are formed is isolated from adjacent thin film semiconductor layers by an element isolation region 9. On the first main surface (back surface side) of the thin film semiconductor layer 31, a buried insulating epitaxial film 26 of about 50 nm in thickness made of magnesium oxide (MgO) is formed. An epitaxial film of various oxides other than magnesium oxide such as strontium titanate ($SrTiO_3$) and cerium oxide ($CeO_2$), a carbide such as silicon carbide (SiC) and a fluoride such as calcium fluoride ($CaF_2$) may be used as the buried insulating film 26. In this way, SOI structure is attained by disposing the thin film semiconductor layer on the buried insulating film 26. And between the first electrode layer 4 constituting the epitaxial planar capacitor 41 of DRAM and the buried insulating film 26, a barrier metal 3 is formed to prevent diffusion of the constituent elements of the first electrode layer 4 into the buried insulating film 26. A plate electrode layer 22 is connected to the lower portion of the second electrode layer 6 of the epitaxial planar capacitor 41. The element isolation region 9 reaches the dielectric thin film 5 from the top surface (the second main surface) of the thin film semiconductor layer 31, to isolate the first electrode layer 4. Namely, the neighboring first electrode layers 4 belonging to different memory cells are isolated electrically by the element isolation region 9 and the capacitor isolation region 8. The first electrode layer 4 of each epitaxial planar capacitor is connected to the $n^+$ source regions 44a and 44b through a contact plug 13.

In the construction shown in FIG. 11, since (100) plane of the Si (100) substrate 1 can be used as a base, (100) oriented (Ti, N) barrier metal layer 3, the second electrode layers 4 and 6 such as (100) oriented $SrRuO_3$ film and the dielectric thin film 5 such as (100) oriented (Ba, Sr)$TiO_3$ film can be formed in a stable state under the entire bottom surface (the first main surface) of the thin film semiconductor layer 31 . As a result, scattering in the dielectric constant and in the leakage current of the dielectric capacitor can be suppressed. Since the epitaxial planar capacitor 41 is disposed under the two switching transistors 91a and 91b in the same plane level, difference in level due to existence of the epitaxial planar capacitor which will hinder the metallization process of wiring layer is eliminated. Then, the simplification of the fabrication processes, omitting or easing the planarizing steps are attained. In addition, since the isolations of the first electrode layer 4 of the epitaxial planar capacitor and the thin film semiconductor layer 31 can be performed at the same time by the insulating regions 8 and 9 for capacitor isolation and element isolation, respectively, yield of the products is improved. Since the epitaxial planar capacitor is three dimensionally disposed in a same plane level in the lower portion of the thin film semiconductor layer 31 wherein the two switching transistors 91a and 91b are formed, all regions under the thin film semiconductor layer 31 can be used as a capacitor region. Hence, the area to be occupied by the epitaxial planar capacitor in each memory cell can be ensured without expanding the area of memory cell. As a result, storage charge for each memory cell and the operational margin can be enlarged. In particular, since the switching transistors 91a and 91b have a SOI structure, a desirable result that the junction capacitance can be decreased so that the writing speed can be increased by 20% compared with the case of the first embodiment of the present invention.

SOI-DRAM shown in FIG. 11 can be fabricated by the steps similar to those for DRAM according to the first embodiment of the present invention. FIGS. 12A to 12G are the cross sectional views of the steps.

Figure 12A:
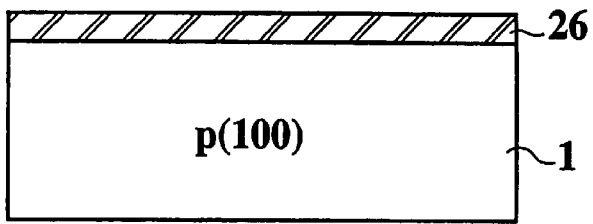
FIGS. 12A to 12G are schematic cross sectional views of steps for illustrating a fabricating method of SOI-DRAM according to the fourth embodiment of the present invention.
Figure 12B:
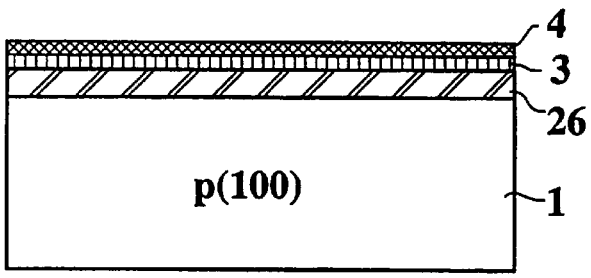

(a) First, as shown in FIG. 12A, the epitaxial insulating film 26 of about 50 nm in thickness composed of magnesium oxide (MgO) is formed as a buried insulating film on the main surface of the p-type Si (100) substrate 1 by sputtering method. Further the (Ti, Al)N film of 10 nm in thickness as the barrier metal layer 3 and the $SrRuO_3$ film of 20 nm in thickness as the first electrode layer 4 are sequentially grown by epitaxy using DC sputtering method at a substrate temperature of 600° C.

Figure 12C:
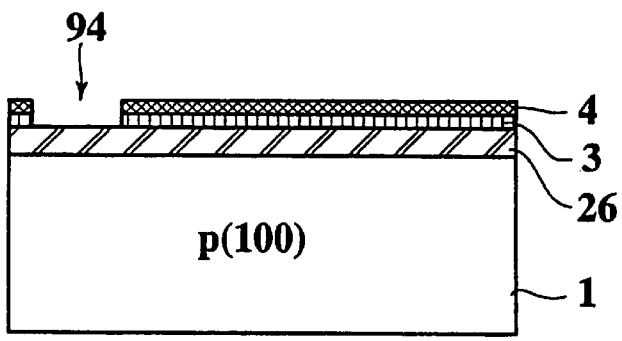
Figure 12D:
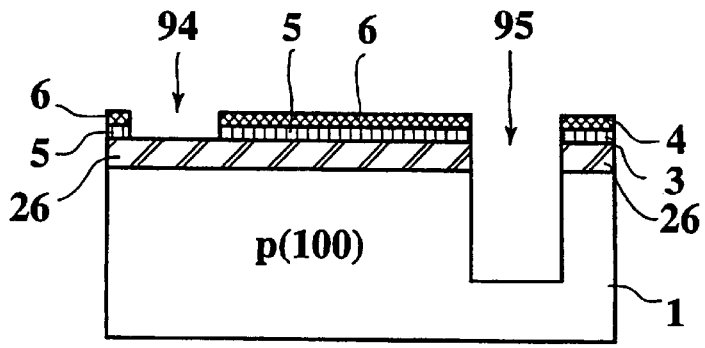
Figure 12E:
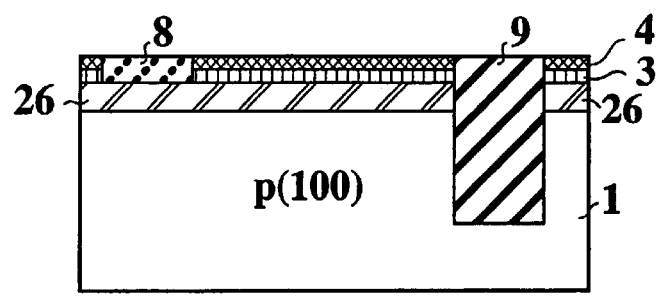
Figure 12F:
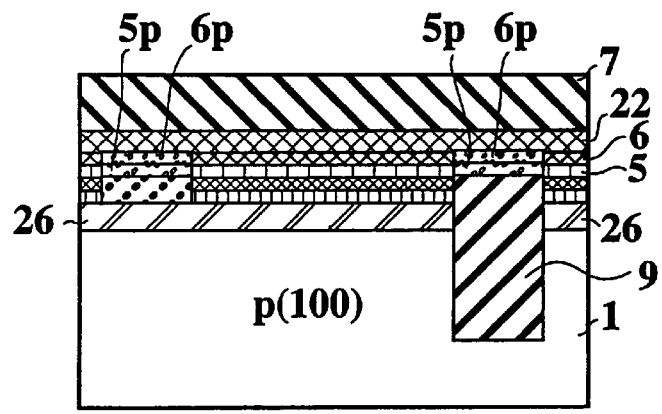

(b) Next, as shown in FIG. 12C, a first groove 94 for isolation of adjacent capacitors is formed by photolithography and RIE methods. Control of the depth of the first groove 94 for capacitor isolation is simple when the epitaxial insulating film 26 which serves as the buried insulating film is used as an etching stopper. Similarly, the second groove 95 is formed by photolithography and RIE methods as shown in FIG. 12D. The second groove 95 for element isolation may be formed at the same time as the first groove 94 until the epitaxial insulating film 26 serving as the buried insulating film is exposed and thereafter, the top of the first groove 94 is covered by photoresist film. Then, only the second groove 95 may be caved deeply by penetrating the buried insulating film 26 and eliminating a part of the first main surface of the p-type Si (100) substrate 1. Next, as shown in FIG. 12E, the first groove 94 is buried with a first insulating film to form the capacitor isolation region 8 and the second groove 95 is buried with a second insulating film to form the element isolation region 9. The first insulating film and the second insulating film may be same material such as an oxide film ($SiO_2$ film). Namely, the insulating film of a thickness larger than the width of the second groove is deposited by CVD, sputtering, vacuum evaporation, or another method and planarized by CMP and thus the insulating regions 8 and 9 for capacitor and element isolations respectively, are buried as shown in FIG. 12E.

(c) Next, the BSTO thin film layer 5 of 20 nm in thickness with Ba mole fraction of 30% as a dielectric thin film and the $SrRuO_3$ film 6 of 20 nm in thickness as the second electrode layer 2 are epitaxially grown by RF and DC sputtering methods, respectively at a substrate temperature of 600° C. The BSTO thin film and the $SrRuO_3$ film on tops of the insulating regions 8 and 9 for capacitor and element isolations are grown as polycrystallized films of poly BSTO thin film layer 5p and poly $SrRuO_3$ film 6p, respectively. Further, the TiN film of 200 nm in thickness is deposited on the entire surface at room temperature. Next, the BPSG film 7 is deposited to a thickness of about 500 nm and thereafter, the surface is planarized by for example, CMP method or another method to obtain a mirror-like surface. Further, a supporting substrate 10 is prepared, another BPSG film 11 is deposited thereon and the surface is polished to obtain a mirror-like surface. Then, the p-type Si (100) substrate 1 is stuck to the supporting substrate 10 by mating the mirror-like surfaces of the BPSG films each other. The bonding may be performed by a known method for example, the heat treatment at about 900° C.

Figure 12G:
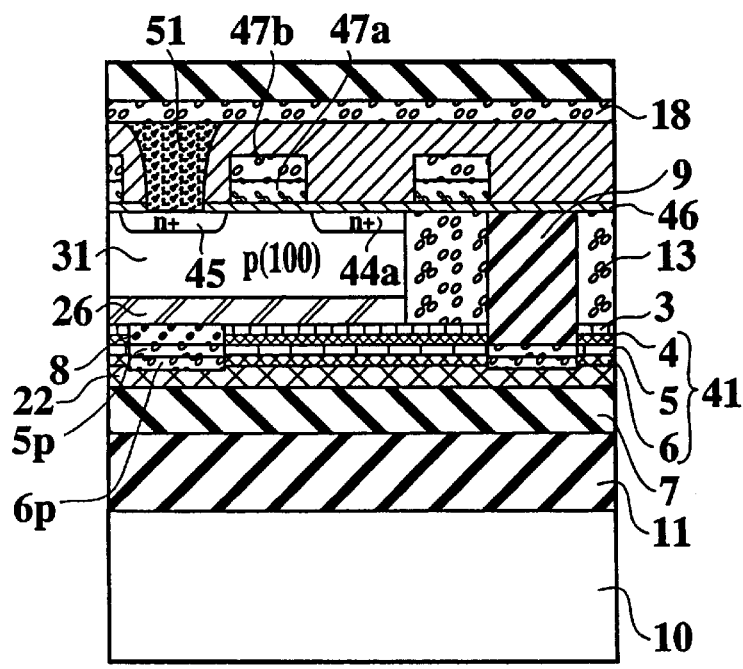

(d) Next, the thickness of the semiconductor substrate (the p-type Si (100) substrate) 1 is adjusted by removing a part of the second main surface of the semiconductor substrate 1. Then, the thin film semiconductor layer 31 of, for example, about 150 nm in thickness is formed. In the adjustment of the thickness of the semiconductor substrate 1, it is preferable to employ the polishing technology such as the CMP method, using an insulating region 9 as a stopping layer for the polishing. Next, a connecting groove is opened adjacently to the element isolation region 9 using usual photolithography and RIE methods. Next, as shown in FIG. 12G, the doped polysilicon film containing for example, $n^+$ type impurity is deposited to a thickness of about 200 nm on the entire surface of the connecting groove and the entire surface is etched back by CMP or another method. Thereafter, the contact plug 13 composed of $n^+$ doped polysilicon film is embedded in the connecting groove. Thereafter, the $n^+$ source region 44a and the $n^+$ drain region 45 or another region are formed using well-known MOS transistor fabrication process to construct the switching transistor 91a. Further, the metallization of the bit line 18 or another line is performed and thus SOI-DRAM according to the fourth embodiment of the present invention is completed.

Fifth Embodiment

Figure 13:
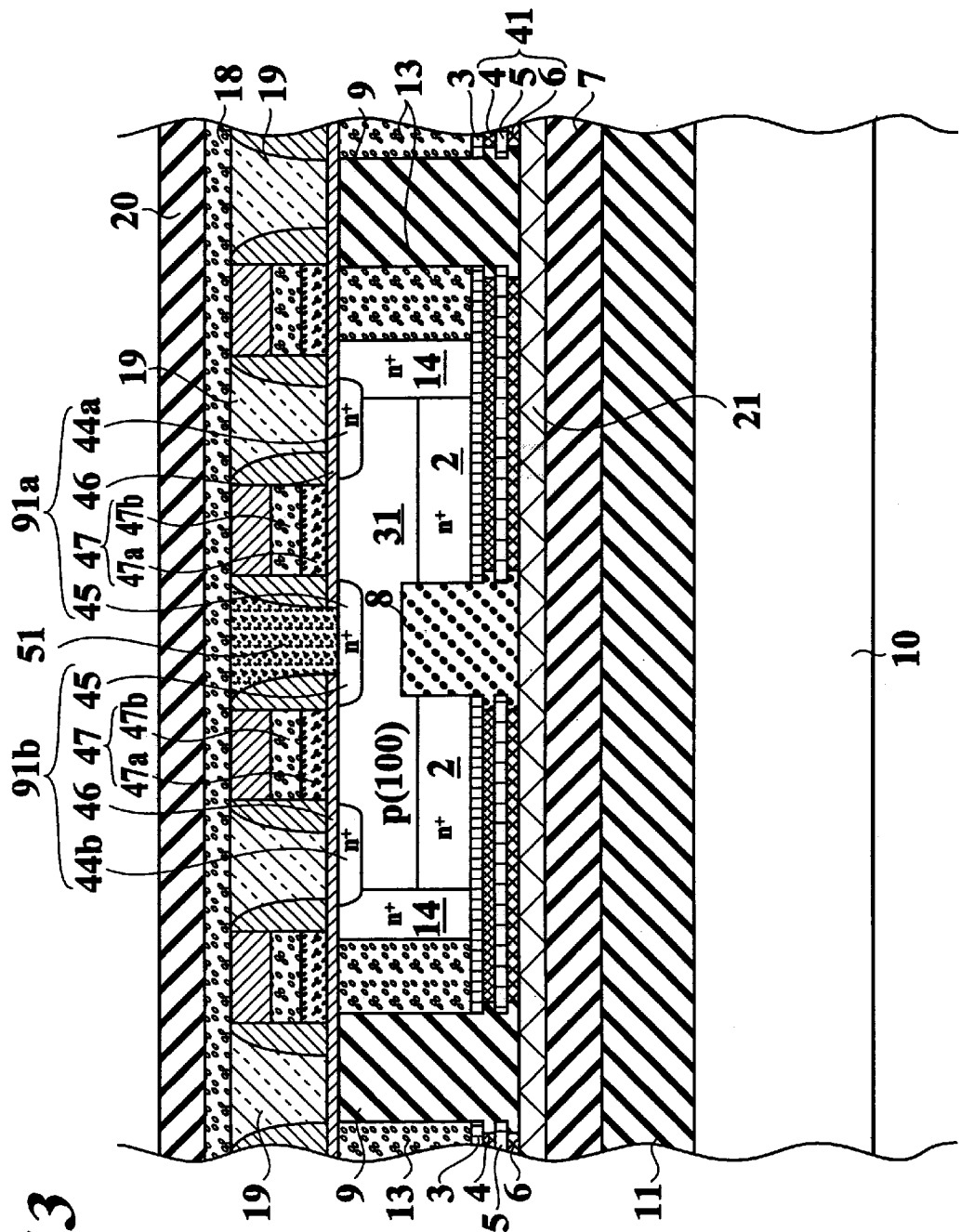
FIG. 13 is a schematic cross sectional view illustrating a memory cell of FRAM according to the fifth embodiment of the present invention.

FIG. 13 is a schematic cross sectional view illustrating the portion corresponding to two unit cells (memory cells) of FRAM according to the fifth embodiment of the present invention. In FIG. 13, the epitaxially grown epitaxial planar capacitor 41 comprising the first electrode layer 4, the dielectric layer 5 and the second electrode layer 6 is deposited under the first main surface of the thin film semiconductor layer 31 formed from p-type Si (100) substrate. The two switching transistors 91a and 91b are formed in the second main surface of the thin film semiconductor layer 31. The second main surface is opposing to the first main surface. The switching transistor 91a comprises the $n^+$ source region 44a, the $n^+$ drain region 45, the gate oxide film 46 and the gate electrode layer 47. The $n^+$ drain region 45 is also serves as a drain region of the switching transistor 91b. Namely, the switching transistor 91b comprises the $n^+$ source region 44b, $n^+$ drain region 45 and the gate oxide film 47. The gate electrode layers 47 of the switching transistors 91a and 91b both have a double-layered structure composed of doped polysilicon layer 47a and the refractory metal (or silicide of refractory metal) 47b. The gate electrode layer 47 also serves as a word line. The $n^+$ drain electrode layer 45 common to the switching transistors 91a and 91b is connected to the bit line 18 through the contact plug 51. The thin film semiconductor layer 31 wherein the two transistors 91a and 91b are formed is isolated from adjacent thin film semiconductor layers by the element isolation region 9. Around the boundary of the thin film semiconductor layer 31 the $n^+$ side wall diffusion layer 14 is formed. And, between the $n^+$ side wall diffusion layer 14 and the insulating region 9 for element isolation, the contact plug 13 made of $n^+$ doped polysilicon is formed. The barrier metal layer 3 is formed, between the first electrode layer 4 constructing the epitaxial planar capacitor 41 of FRAM and the $n^+$ impurity diffusion layer 2, to prevent diffusion of the constituent elements of the first electrode layer 4 into the thin film semiconductor layer 31. The element isolation region 9 is formed deeply from the top surface (the second main surface) of the thin film semiconductor layer 31 AL down to the bonding layer 7. The bonding layer 7 is an insulating film for direct bonding of two silicon wafers. The capacitor isolation region 8 is formed through the $n^+$ impurity diffusion layer 2, dividing the $n^+$ impurity diffusion layer 2 in the first main surface of the thin film semiconductor layer 31 into two regions: a lower region of the switching transistor 91a and a lower region of the switching transistor 91b. Then, the capacitor isolation region 8 reaches to the bonding layer 7.

The epitaxial planar capacitor 41 connecting to each switching transistor is isolated each other by the insulating regions 9 and 8 for element and capacitor isolations, respectively. Namely, the first electrode layer 4, the dielectric thin film 5 and the second electrode layer 6 are isolated in every switching transistor. Each epitaxial planar capacitor constructs a parallel plate condenser, or the planar capacitor, formed under the first main surface of the thin film semiconductor layer 31 in a same plane level. Further, the second electrode layer 6 of each epitaxial planar capacitor 41 is connected to a drive line 21. The drive line 21 is patterned as a wiring extending in the direction parallel to the bit line 18. The drive line 21 may be formed by conductive thin film such as TiN film or another film of for example, about 200 nm in thickness.

Figure 14:
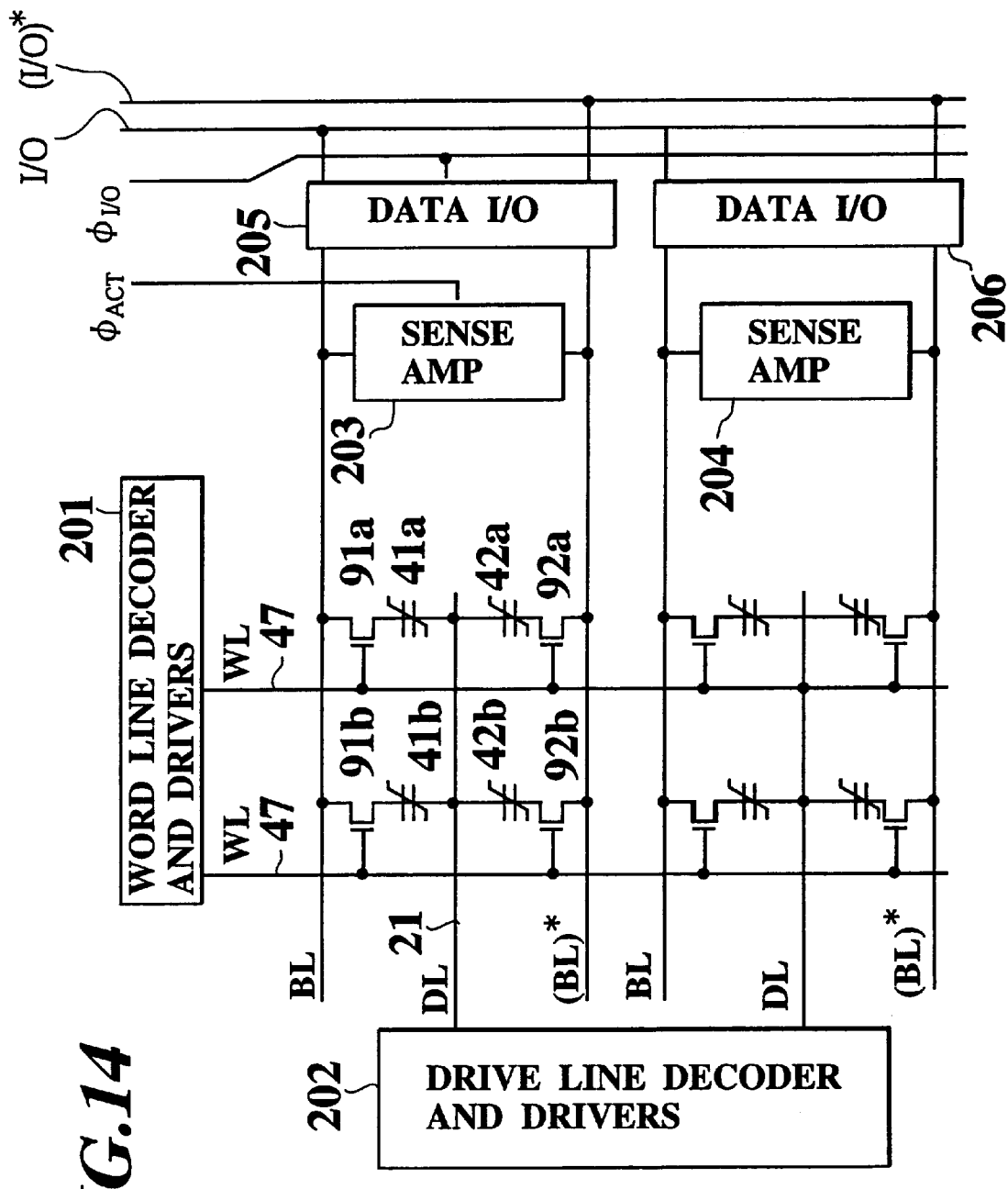
FIG. 14 is a drawing illustrating an equivalent circuit of FRAM according to the fifth embodiment of the present invention.

A circuit diagram of drive/word line decoder and drivers of FRAM according to the fifth embodiment of the present invention is shown in FIG. 14. The drive line decoder and drivers 202 shown in FIG. 14 have a construction such that the two capacitors 41b, 42b and the two switching transistors 91b, 92b constitute a unit of the memory cell (unit cell). FIG. 13 is a cross sectional view illustrating the two transistors 91a and 91b of adjacent two unit cells. Hence another unit cell is constructed by the two capacitors 41a, 42a and the two switching transistors 91a, 92a. In FIG. 14, one terminal of one capacitor 41b is connected to a bit line BL through the source and drain of the switching transistor formed in the semiconductor substrate and another terminal is connected to a drive line DL. For another capacitor 42b similarly, one terminal is connected to a bit line (BL)* through source and drain of the switching transistor 92b and another terminal is connected to a drive line DL. The pair of two bit lines, BL and (BL)*, is connected to one sense amp 203 or 204. The drive line 21 is one line common to the capacitors 41b and 42b and connected to the drive line decoder and drivers (DD) 202. Gates of the switching transistors 91b and 92b are connected to a word line WL. The gates of the two switching transistors 91b and 92b in one unit cells are connected to one word line WL. The word line WL is connected to the word line decoder and drivers 201.

In the circuit construction shown in FIG. 14, bit line pairs (BL, (BL)*) and drive lines DL run in parallel and each line is used commonly to a plurality of memory cells on one line among a plurality of memory cells disposed in matrix form. On the other hand, the word lines WL run perpendicular to the bit lines BL and (BL)* and to the drive line DL. The word lines WL are used commonly by a plurality of memory cells on one row among a plurality of memory cells disposed in matrix form. The sense amplifiers 203 and 204 are connected to each bit line pair (BL, (BL)*) one by one and each of the sense amplifiers 203 and 204 is controlled by sense amp active signal $\phi_{act}$. Further, the bit line BL is connected to I/O through input and output (I/O) connecting circuits 205 and 206. Connection between BL and I/O is controlled by I/O connecting signal $\phi_{I/O}$. The bit line (BL)* is connected to (I/O)* through input and output (I/O) connecting circuits 205 and 206.

Next, the method to write digital signal into a memory cell in the FRAM shown in FIG. 14 will be described (a) First, the sense amplifiers 203 and 204 connected to bit line pair (BL, (BL)*) are activated and potential of BL is fixed at a high level sufficient to reverse the dielectric polarization of capacitor.

(b) Next, on a certain row corresponding to address information indicating the position to be written, a voltage necessary to turn the switching transistor to "ON" state is applied to the word line WL. As a result, the switching transistor connected to the word line of this row is in a "ON" state and capacitor and paired bit lines is in a connecting state. Of course capacitor and bit line are remain isolated electrically since signals are not sent on other rows, which are independent at this time.

(c) The voltage of the drive line DL is, at first fixed to 0 V. During fixing of the drive line DL at 0 V, the voltage thereof relative to that of the bit line (BL)* fixed at high level Vcc produces writing in the capacitor 41b connected between BL and DL. At this time any change does not occur in the capacitor 42b connected between (BL)* and DL both being fixed at 0 V, i.e. the same voltage.

(d) Next, after a certain time has elapsed, a high level Vcc sufficient to reverse the polarization of the capacitor 42b is applied to the drive line DL. Owing to Vcc applied to the drive line DL, writing occur in the capacitor 42b connected between the bit line (BL) and the drive line DL by the voltage difference –Vcc relative to the bit line BL (voltage: 0). At this time, since the bit line BL (voltage: Vcc) and the drive line DL is at the same voltage, no change occur in the capacitor 41b connected between the bit line BL and the drive line DL. As a result, remnant polarization by voltage difference Vcc and that by –Vcc are stored in the capacitors 41b connected to the BL line and 42b connected to the (BL)* line, respectively.

Next, the reading method of the digital information stored in the memory cell will be described.

(a) First, one word line WL on the row corresponding to an address is selected and the switching transistors connected to the word line WL are turned to "ON" state. In this way, the capacitors of the memory cell are connected electrically to the bit lines (BL, (BL)*). At this time the switching transistors connected to another unselected word line WL keep "OFF" state.

(b) Next, a drive line DL corresponding to the address is selected and a low voltage $V_{read}$ for reading is applied thereto. In this way $V_{read}$ is applied to two capacitors in the memory cell. Remnant polarization stored in these two capacitors with different directions each other are not reversed by the low voltage $V_{read}$. Hence, nondestructive reading without reversion of the direction of dielectric polarization in capacitor is possible. Generally, leakage current in the capacitor of FRAM cell is varied by a factor 100 to 1000 depending on the direction of the remnant polarization. Hence, electric current flow into the bit lines BL and (BL)* depends on the direction of the dielectric polarization written in the capacitor. As a result, the potentials on the paired bit lines slightly change.

(c) When a predetermined voltage difference is appeals between the paired bit lines, the voltage of WL is set to the low level and the capacitor is isolated electrically from the bit lines. Thereafter, return also the voltage of the DL line returns to 0 V.

(d) At this time, the sense amplifiers 203 and 204 are activated by selecting $\phi_{act}$. In this way the voltage difference between the paired bit lines (BL, (BL)*) is amplified and further fixed. The voltage read on the bit line is transmitted to I/O and (I/O)* by sending the signal to $\phi_{I/O}$.

According to the structure shown in FIG. 13, the (100) oriented (Ti, Al)N barrier metal layer 3, the first and the second electrode layers 4 and 6 such as the (100) oriented SrRuO₃ film and the dielectric thin film 5 such as the (100) oriented (Ba, Sr)TiO₃ can be deposited in the stable state on entire bottom surface (the first main surface) of the thin film semiconductor layer 31, since (100) plane of the Si (100) substrate 1 can be used as a base. The dielectric thin film has a characteristic of strong ferroelectric thin film according to the fifth embodiment of the present invention. A large remnant polarization 2 Pr of 80 $\mu C/cm^2$ in the ferroelectric capacitor can be obtained and scattering in the remnant polarization and the leakage current can be suppressed. In addition, since the epitaxial planar capacitor 41 is disposed under the two switching transistors 91a and 91b on a same plane level, difference in level due to the existence of the epitaxial planar capacitor which will hinder the metallization process of the wiring layer is eliminated. Then the simplification of the fabrication processes, especially the simplification of the planarizing steps are attained. Since the first electrode layer 4 of the epitaxial planar capacitor 41 and the thin film semiconductor layer 31 are isolated at the same time by the insulating regions 8 and 9 for capacitor and element isolations, respectively, yield of the products is improved. Since the epitaxial planar capacitor 1 is disposed three dimensionally on a same plane level in the lower region of the thin film semiconductor layer 31 wherein the two switching transistors are formed, the entire region under the thin film semiconductor layer 31 can be used as a capacitor region. Hence, the area to be occupied by the epitaxial planar capacitors in each memory cell can be ensured without increasing the area of memory cell. As a result, stored charge in a memory cell in the FRAM can be increased, and the operational margin of the memory cell can be enlarged.

The fabricating method of FRAM according to the fifth embodiment of the present invention will be described using FIGS. 15A to 15C. Although the following description is focused on the switching transistor 91a, of course the steps of the switching transistor 91b also proceed with the steps of 91a.

Figure 15A:
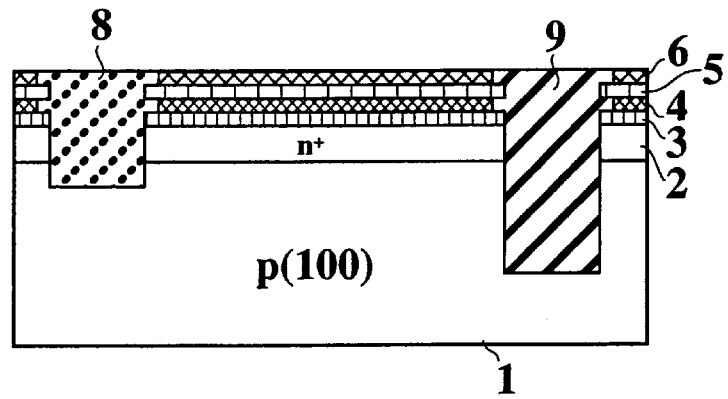
FIGS. 15A to 15C are schematic cross sectional views of steps for illustrating a fabricating method of FRAM according to the fifth embodiment of the present invention.

(a) First, as shown in FIG. 15A, the n+ impurity diffusion layer 2 of about 0.1 $\mu$m in depth is formed on the first main surface of the p-type Si (100) substrate 1. Thereafter, the (Ti, Al)N film of 10 nm in thickness as the barrier metal 13, the $SrRuO_3$ film of 20 nm in thickness as the first electrode layer 4, the BSTO thin film of 20 nm in thickness with Ba mole fraction of 70% as the dielectric thin film 5 and further the $SrRuO_3$ film of 20 nm in thickness as the second electrode layer 6 are sequentially grown by epitaxy to construct the epitaxial planar capacitor. The epitaxy is executed without exposure to their, using the RF or DC sputtering methods, at a substrate temperature of 600° C.

(b) Next, the first groove for isolation of adjacent capacitors and the second groove for element isolation are formed by etching the second electrode layer 6, the dielectric thin film 5, the first electrode layer 4, the barrier metal layer 3, the n+ impurity diffusion layer 2 and the p-type Si (100) substrate 1 using lithography and RIE method or another method. After the etching processes of the first and the second grooves, the first and the second electrode layers, the $SrRuO_3$ film, is selectively wet-etched to form under-cut portions in order to prevent a leakage current at the edge surface of the dielectric thin film 5. Next, the insulating film such as $SiO_2$ is deposited to a thickness larger than the depth of the first and the second grooves by CVD or another method. Thereafter, the surface is planarized by CMP or another method as shown in FIG. 15A. At this time, such a method that a TiN film or another film is previously prepared, as a stopping layer for polishing, may be used in order to protect the surface of the second electrode layer 6. The TiN film or another film may be removed by etching after the CMP or another method.

Figure 15B:
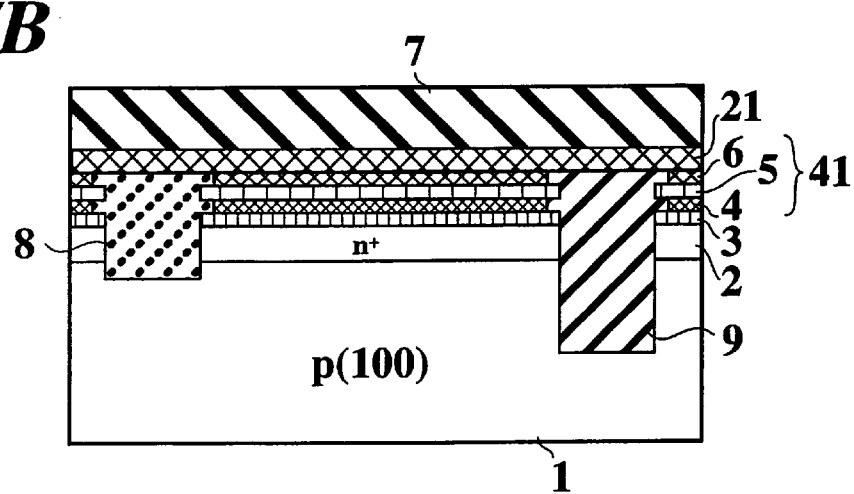
Figure 15C:
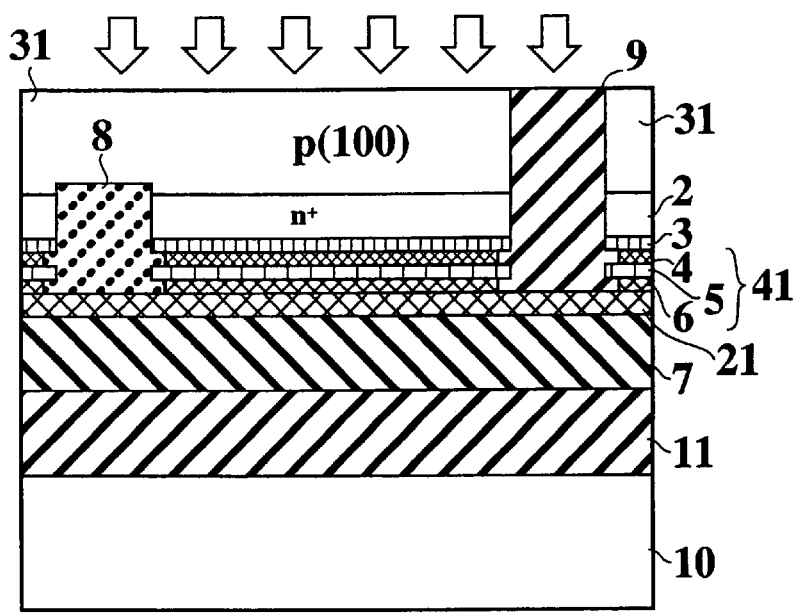

(c) Next, as shown in FIG. 15B, the TiN film 21 of 200 nm in thickness is deposited at room temperature. The TiN film is patterned using RIE along with another method to form the drive line 21 running parallel to the plane of the paper. Further, a BPSG film is deposited to a thickness of about 500 nm as the bonding layer 7 and thereafter, the surface is planarized by for example, CMP or another method to obtain a mirror-like surface. Next, the BPSG film 11 is deposited on the surface of the supporting substrate 10 separately prepared. And the surface of the separately prepared supporting substrate 10 is planarized to obtain a mirror-like surface. The BPSG films 7, 11, the surfaces of which have become mirror-like, are mated with each other and thus the p-type Si (100) substrate 1 is stuck to the supporting substrate 10 as shown in FIG. 15C. The bonding may be performed by for example, heat treatment at about 900° C.

(d) Thereafter, a part of the second main surface of the p-type Si (100) substrate is removed by polishing to adjust the thickness using the element isolation region 9 as a stopping layer. Then the thin film semiconductor layer 31 of, for example, about 150 nm thickness is obtained.

Description of the succeeding steps is omitted because they are similar to those shown in FIG. 7G et seq. illustrated in the second embodiment.

Sixth Embodiment

Figure 16:
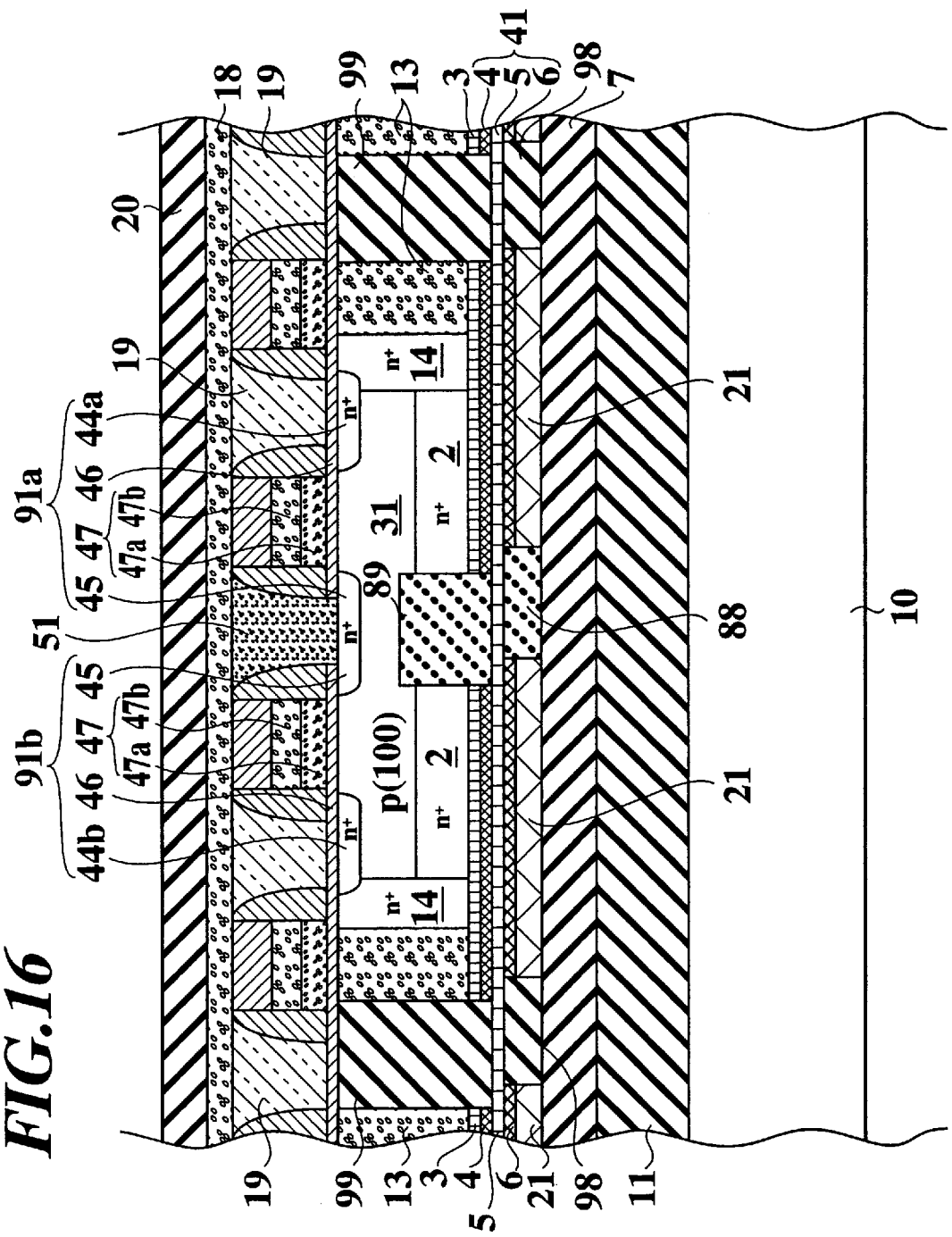
FIG. 16 is a schematic cross sectional view illustrating a memory cell of FRAM according to the sixth embodiment of the present invention.

FIG. 16 is a schematic cross sectional view illustrating a portion corresponding to two unit cells (memory cells) of FRAM according to the sixth embodiment of the present invention. In FIG. 16, an epitaxially grown epitaxial planar capacitor 41 comprising a first electrode layer 4, a dielectric thin film 5, and a second electrode layer 6 is deposited on the first main surface of a thin film semiconductor layer formed from a p-type Si (100) substrate. In a second main surface opposite to the first one, two switching transistors 91a and 91b are formed. The switching transistor 91a comprises an n+ source region 44a, an n+ drain region 45, a gate oxide film 46 and a gate electrode layer 47. The n+ drain region 45 also serves as a drain region of the switching transistor 91b. Namely, the switching transistor 91b comprises an n+ source region 44b and a gate oxide film 47. The gate electrode layers 47 of the switching transistors 91a and 91b are both have a double layered structure composed of a doped polysilicon layer 47a and a refractory metal (or a refractory metal silicide) layer 47b. The gate electrode layer 47 also serves as a word line. An n+ drain electrode layer 45 common to the switching transistors 91a and 91b is connected to a bit line 18 through a contact plug 51. The thin film semiconductor layer 31 wherein the two switching transistors 91a and 91b are formed is isolated from surrounding thin film semiconductor layers by an insulating region 99 for element isolation. Upper insulating region 99 for element isolation is connected to lower insulating region 98 for element isolation through the dielectric thin film 5. At boundary region of the thin film semiconductor layer 31, an n+ side diffusion layer 14 is formed. Between the n+ side diffusion layer 14 and the upper insulating region 99 for element isolation a contact plug 13 is formed. Further, on the first main surface of the thin film semiconductor layer 31, an n+ impurity diffusion layer 2 is formed. Between the first electrode layer 4 constituting the epitaxial planar capacitor of FRAM and the n+ impurity diffusion layer 2, a barrier metal 3 is formed to prevent diffusion of the constituent elements into the thin film semiconductor layer 31. The upper insulating region 99 for element isolation is formed from top surface (the second main surface) of the thin film semiconductor layer 31 and reaches the dielectric thin film 5. The lower insulating region 98 for element isolation is formed from the dielectric thin film 5 and reaches a bonding layer 7. An upper insulating region 89 for capacitor isolation penetrates the n+ impurity diffusion layer 2 in the first main surface of the thin film semiconductor layer 31, dividing the n+ impurity diffusion layer 2 into two portions: a lower portion of the switching transistor 91a and that of the switching transistor 91b. The upper insulating region 89 reaches the dielectric thin film 5. A lower insulating region 88 for capacitor isolation is formed from the dielectric thin film 5 and reaches the bonding layer 7. The first electrode layers 4 of the epitaxial planar capacitor 41 connected to each switching transistor are isolated each other by the upper insulating regions 99 and 89 for element isolation and capacitor isolation, respectively. The second electrode layers 6 of the epitaxial planar capacitor 41 are isolated each other by the lower insulating regions 98 and 88 for element isolation and capacitor isolation, respectively. Each epitaxial planar capacitor forms a parallel plate condenser constructed on the same plane level on the first main surface of the thin film semiconductor layer 31. Further, the second electrode layer 6 of each epitaxial planar capacitor 41 is connected to the drive line 21. The drive lines 21 are patterned as wirings extend obliquely, or in zigzag and substantially parallel to the direction of the bit lines 18. Although the drive lines 21 at each bottom of the switching transistors 91a and 91 are depicted as if being isolated from each other in the cross sectional view, they are connected at deep points in the direction perpendicular to the paper, actually. The drive line 21 may be formed by a conductive thin film such as a TiN film or another substance of for example, about 200 nm in thickness. Layout of the straight drive line 21 in the cross sectional view similar to FIG. 13 can be used instead of the zigzag line.

According to the construction shown in FIG. 16, a (100) oriented (Ti, Al)N barrier metal layer 3, the second electrode layers 4 and 6 such as a (100) oriented $SrRuO_3$ and further, the dielectric thin film 5 such as a (100) oriented (Ba, Sr)$TiO_3$ can be deposited in the stable state on entire bottom surface (the first main surface) of the thin film semiconductor layer 31, since (100) plane of the Si (100) substrate 1 can be used as a base. The dielectric thin film 5 has a property characteristics of a strong ferroelectric thin film according to the sixth embodiment of the present invention. A large remnant polarization 2 Pr of 85 $\mu C/cm^2$ in the ferroelectric capacitor can be obtained and scattering in the remnant polarization and the leakage current can be suppressed. Since the epitaxial planar capacitors 41 are disposed in the same plane level under the two switching transistors 91a and 91b, difference in level due to the existence of the epitaxial planar capacitor which will hinder the formation steps of the contact and the wiring is eliminated so that the metallization process are simplified. Then, the simplification of the fabrication processes are attained, or the step of the planarization is eased. Since the first electrode layer 4 of the epitaxial planar capacitor 41 and the thin film semiconductor layer 31 can be isolated at the same time by the upper insulating region 89 for capacitor isolation and the upper insulating region 99 for element isolation, yield of the products is improved.

Since each constituent thin film in the epitaxial planar capacitors 41 is three dimensionally disposed in the same plane level in the lower portion of the thin film semiconductor layer 31 wherein the two switching transistors 91a and 91b are formed, the entire region under the thin film semiconductor layer 31 can be used as a capacitor region. Hence, the area to be occupied by the epitaxial planar capacitor in each memory cell is ensured without increasing the area of the memory. As a result, storage charge in each memory cell of FRAM can be increased and margin of memory cell operation can be enlarged.

FRAM according to the sixth embodiment of the present invention can be fabricated by the steps as shown in FIGS. 17A to 17D.

Figure 17A:
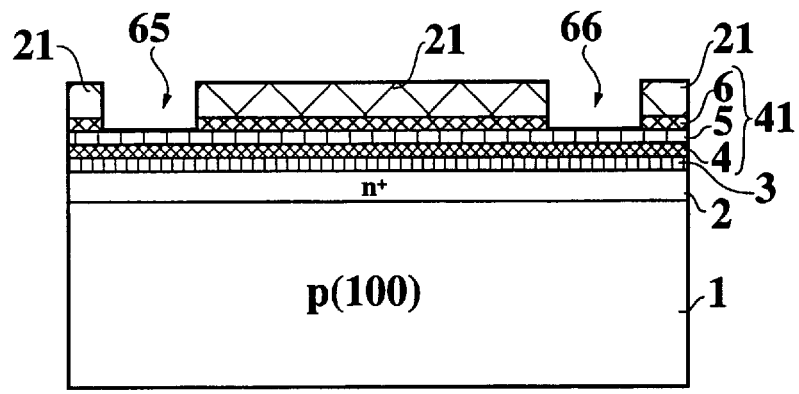
FIGS. 17A to 17I are schematic cross sectional views of steps for illustrating another fabricating method of FRAM according to the sixth embodiment of the present invention.

(a) First, as shown in FIG. 17A, the n+ impurity diffusion layer 2 of about 0.1 $\mu$m in depth is formed on the first main surface of the p-type Si (100) substrate 1 and thereafter, the (Ti, Al)N film of 10 nm in thickness as the barrier metal layer 3, the $SrRuO_3$ film of 20 nm in thickness as the first electrode layer 4, the BSTO thin film layer of 20 nm in thickness with Ba mole fraction of 70% as the dielectric thin film 5 and further, the $SrRuO_3$ film of 20 nm in thickness as the second electrode layer 6 are sequentially grown by epitaxy without exposure to air by RF or DC sputtering methods at a substrate temperature of 600° C. Next, the TiN film of 200 nm in thickness is deposited at room temperature as the drive line 21 and patterned by RIE method. At this time, using a photoresist which has been used for the patterning of the drive line 21 as a mask, the second electrode layer 6 is further etched to form the first groove 65 and the second groove 66. Here, it is desirable to use the dielectric thin film 5 as a stopping layer for the etching.

Figure 17B:
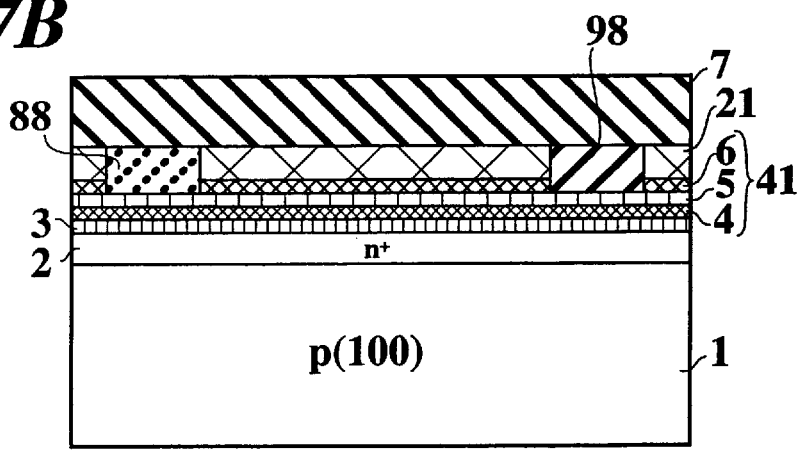

(b) Next, an insulating film such as $SiO_2$ film is deposited by CVD to a thickness larger than the depths of the first groove 65 and second groove 66 to for example, about 500 nm. And the surface of the insulating film is planarized using for example, CMP or another method. Then, the lower insulating regions 88 and 98 for capacitor isolation and for element isolation, respectively are buried as shown in FIG. 17B. And further, the bonding layer 7 is deposited thereon by CVD. And the surface of the insulating film 7 is polished to be mirror-like.

Figure 17C:
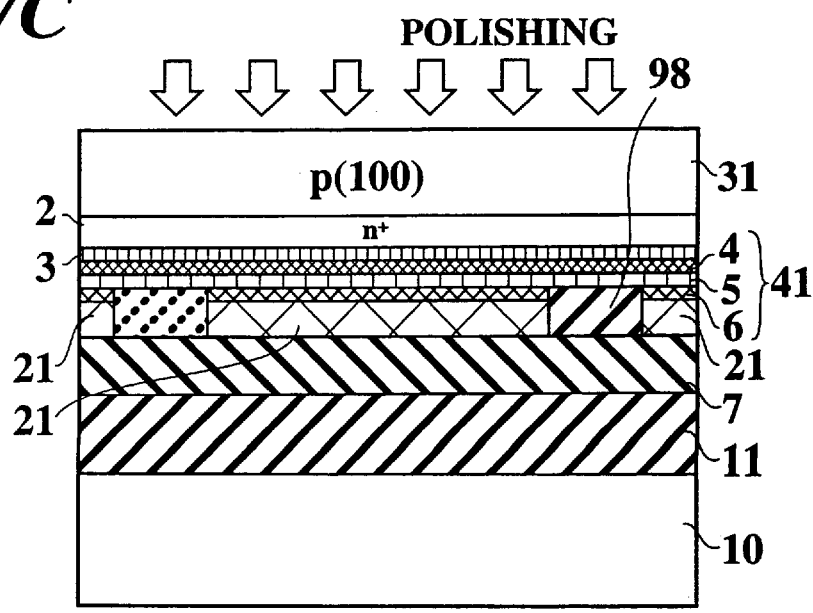

(c) Next, a supporting substrate 10 is prepared separately. The BPSG film 11 is deposited on the surface of the supporting substrate 10 by CVD and the surface is polished to be mirror-like. Mirror-liked surfaces of the BPSG films 7 and 11 are mated with each other to bond the separately prepared supporting substrate 10 with the p-type Si substrate 1 as shown in FIG. 17C. The bonding is conducted under a heat treatment of, for example, about 900° C. Next, as shown in FIG. 17C, the thickness of the p-type Si (100) substrate 1 is adjusted by removing a part of the second main surface of the p-type Si (100) substrate 1. Then, the thin film semiconductor layer 31 of, for example, about 150 nm in thickness is obtained.

Figure 17D:
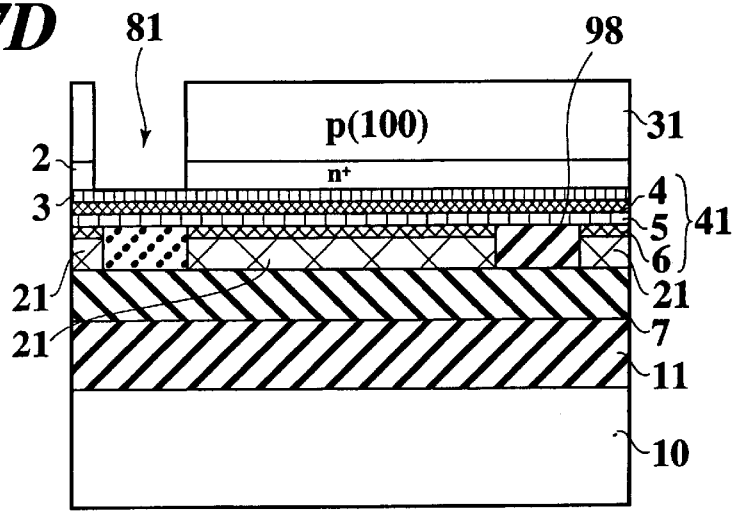
Figure 17E:
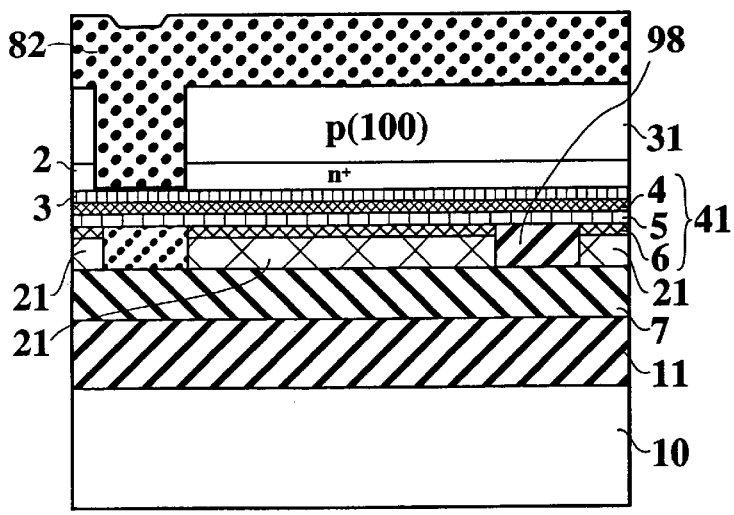
Figure 17F:
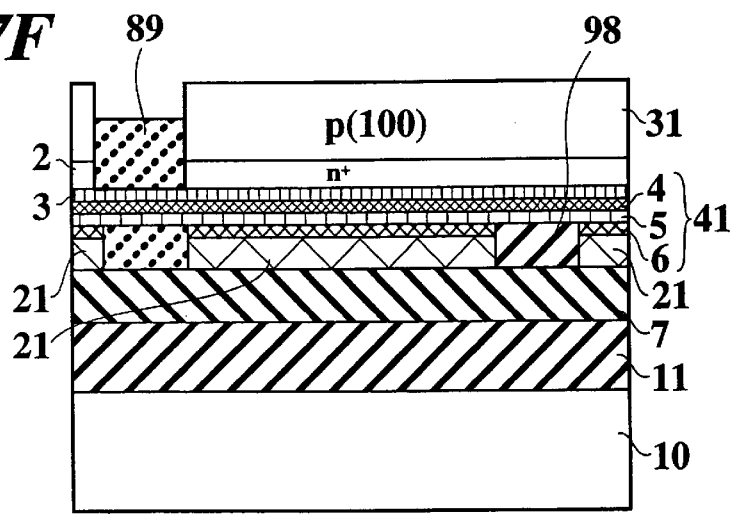
Figure 17G:
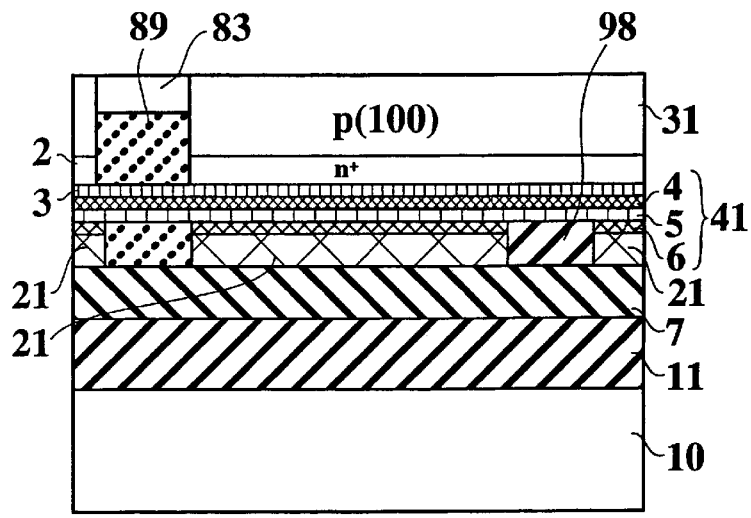

(d) Next, as shown in FIG. 17D, the third groove 81 for the isolation of adjacent capacitors is formed using an etching technique such as lithography and RIE. Here, it is desirable to use the dielectric thin film 5 as an etching stopping layer. Next, as shown in FIG. 17E, the insulating region 82 such as $SiO_2$ film is deposited to a thickness larger than the depth of the third groove by CVD. After the formation, the insulating region 82 is planarized by CMP or another method and thus the third groove is buried with the upper insulating region 89 for capacitor isolation. Further, as shown in FIG. 17F, the surface of the upper insulating region 89 for capacitor isolation is etched back selectively and slightly by RIE or another method. After the etching back, the single crystalline silicon electrode layer 83 is buried as shown in FIG. 17G. As the burying method of the single crystalline silicon electrode layer at this time, a known method can be used. For example, growing single crystal by crystallization from the side wall portion using heat treatment such as RTA after forming amorphous silicon conformally can be used. Or, it is possible to bury selectively a single crystalline silicon in the etched back portion of the third groove 81 by for example, selective CVD method.

Figure 17H:
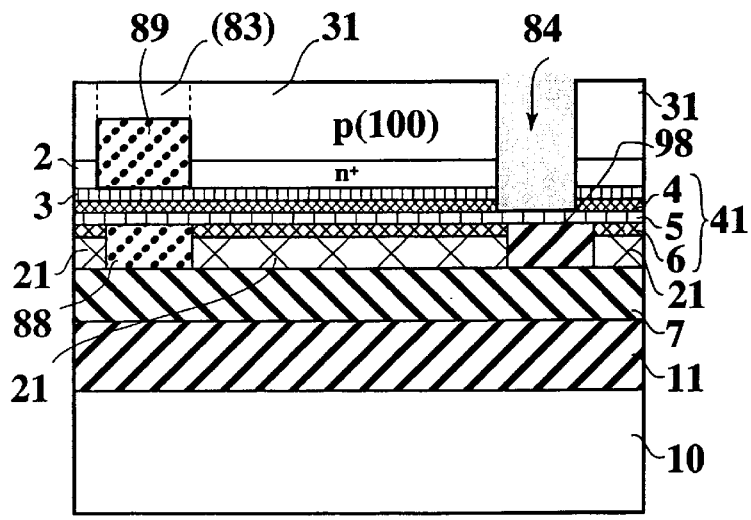
Figure 17I:
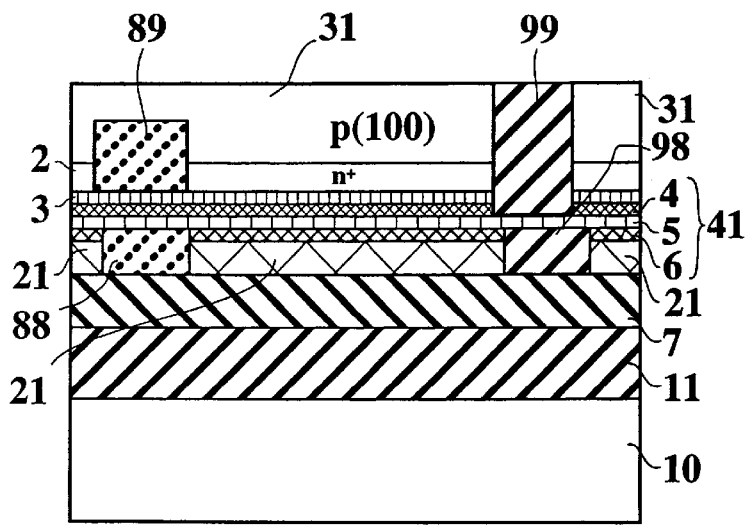

(e) Further, the fourth groove 84 for the formation of upper insulating region for element isolation is opened as shown in FIG. 17H. And the upper insulating region 99 for element isolation is buried thereinto as shown in FIG. 17I. FIG. 17I corresponds to FIG. 4I illustrated as another fabricating method according to the first embodiment of the present invention. Descriptions of the succeeding steps are omitted, since these steps being similar to those shown in FIG. 4J et seq. of above-mentioned first embodiment.

In FIG. 16, central axis of the upper insulating region 89 for capacitor isolation shifts from that of the lower insulating region 88 for capacitor isolation. Central axis of the upper insulating region 99 for element isolation also shifts from that of the lower insulating region 98 for element isolation. This is due to the misalignment of the mask patterns between the first and the second main surfaces. However, the shifts of such a level as shown in FIG. 17I is allowed because no current flows between them. Of course precise alignment of two central axes is allowed and preferred.

Seventh Embodiment

Figure 18B:
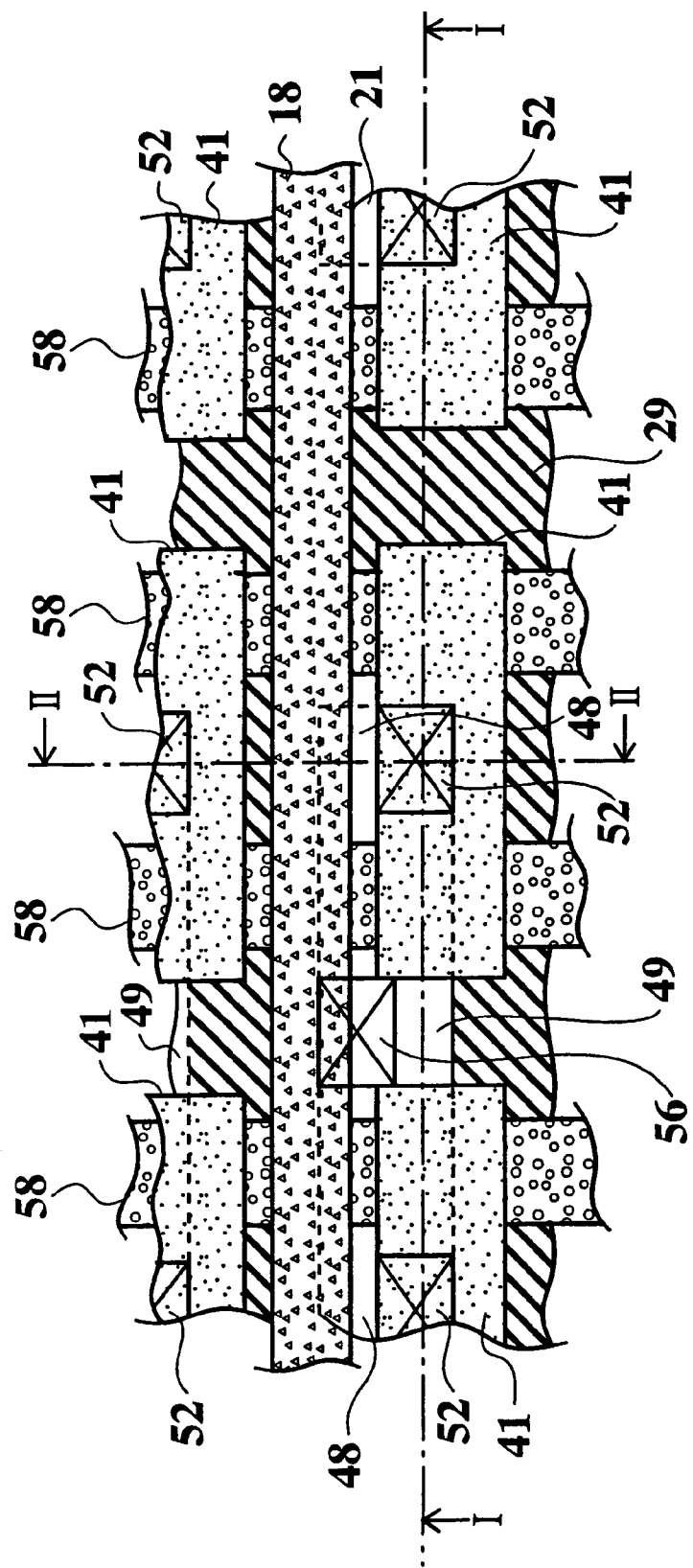
FIG. 18B is a top view of a FRAM memory cell according to the seventh embodiment of the present invention.

FIG. 18A is a cross-sectional view of a semiconductor memory device according to a seventh embodiment of the present invention. Here, FIG. 18A (a) and FIG. 18A (b) are mutually orthogonal cross-sectional views. In other words, FIG. 18A (b) is a cross-sectional view taken along the direction II—II of FIG. 18A (a), and FIG. 18A (a) is a cross-sectional view taken along the direction I—I of FIG. 18A (b). And, FIG. 18B is a corresponding top view.

The semiconductor memory device according to the seventh embodiment of the present invention is a FRAM having an epitaxial planar capacitor which uses a BSTO thin film with a 70% Ba mole fraction as a ferroelectric thin film layer. As shown in FIG. 18A, this semiconductor memory device (FRAM) comprises at least a first semiconductor substrate 27 wherein a plurality of switching transistors are provided in a matrix, a second semiconductor substrate 30 having a plurality of perovskite epitaxial planar capacitors 41 corresponding to the plurality of switching transistors, and connectors (52, 53 and 54) for electrically connecting the main electrode regions 48 of the switching transistors to their corresponding epitaxial planar capacitors 41.

Then, as shown in FIG. 18A, in the semiconductor memory device according to the seventh embodiment of the present invention, the plurality of MOS transistors which are separated by an element isolation region 13, comprising an buried oxide film known as an STI region, are provided on the semiconductor substrate 27 in a matrix. These a plurality of MOS transistors are nMOSFETs disposed in the surface of a p-well 28 provided on the semiconductor substrate 27. This nMOSFET has a source region 48 and a drain region 49, comprising $n^+$ regions, which constitute the main electrode regions in the p-well 28. Furthermore, the nMOSFET has a control electrode layer comprising a gate electrode layer 58 disposed above a gate oxide film 43 on the surface of the p-well 28. This gate electrode layer 58 serves as part of a word line. As shown in FIG. 18B, there are a plurality of word lines 58 running vertically.

Furthermore, as shown in FIG. 18B, a bit line contact plug 56, comprising doped polysilicon, refractory metal or refractory metal silicide or the like, is provided above the drain region 49 and connects to a bit line 18. The bit line 18 runs horizontally at a right angle to the word lines 58. For simplification, only one bit line 18 is shown in FIG. 18B, but of course the X-Y matrix is formed from a plurality of bit lines and a plurality of word lines.

As shown in FIG. 18A, a capacitor contact plug 52, comprising doped silicon, refractory metal or refractory metal silicide or the like, is connected to the $n^+$ source region 48. A first bonding layer 53 having the same top pattern as the rectangular epitaxial planar capacitor 41 shown in FIG. 18B connects to the capacitor contact plug 52.

On the other hand, as shown in FIG. 18B, the epitaxial planar capacitor 41 comprises a first barrier metal layer 3, a first electrode layer 4 such as an SRO, a dielectric thin film 5 such as BSTO thin film with a 70% Ba mole fraction, a second electrode layer 6 such as an SRO and a second barrier metal layer 55. The second semiconductor substrate 30 is a high impurity-concentration semiconductor substrate, having impurity concentration of between approximately $2 \times 10^{18}$ to $1 \times 10^{20}$ cm$^{-3}$. The second barrier metal layer 55 is connected to a drive line 22, comprising layers of Ti/TiN/Al or the like, with the high impurity concentration second semiconductor substrate 30 in between. Furthermore, a passivation film 87, comprising oxide film ($SiO_2$ film), PSG film, BPSG film, nitride film ($Si_3N_4$ film) or polyimide film or the like, is provided on the drive line 22. Then, a second bonding layer 54, having the same top pattern as the epitaxial planar capacitor 41 shown in FIG. 18B, is connected to the first barrier metal layer 3. As a result, the capacitor contact plug 52, the first bonding layer 53 and the second bonding layer 54 electrically connect the $n^+$ source region 48 to the epitaxial planar capacitor 41. Symbols 73, 78, 79 and 80 in FIG. 18 represent insulating films such as oxide film ($SiO_2$ film), PSG film, BPSG film or nitride film ($Si_3N_4$ film).

Next, a method for manufacturing the semiconductor memory device according to the seventh embodiment of the present invention will be explained using the following schematic cross-sectional views of the sequence of manufacturing steps (FIG. 19A to FIG. 19I). In FIG. 19A to FIG. 19I, (a) and (b) are mutually orthogonal cross-sectional views. In other words, (b) are cross-sectional views taken along the line II—II of (a), and (a) are cross-sectional views taken along the line I—I of (b).

Figure 19A:
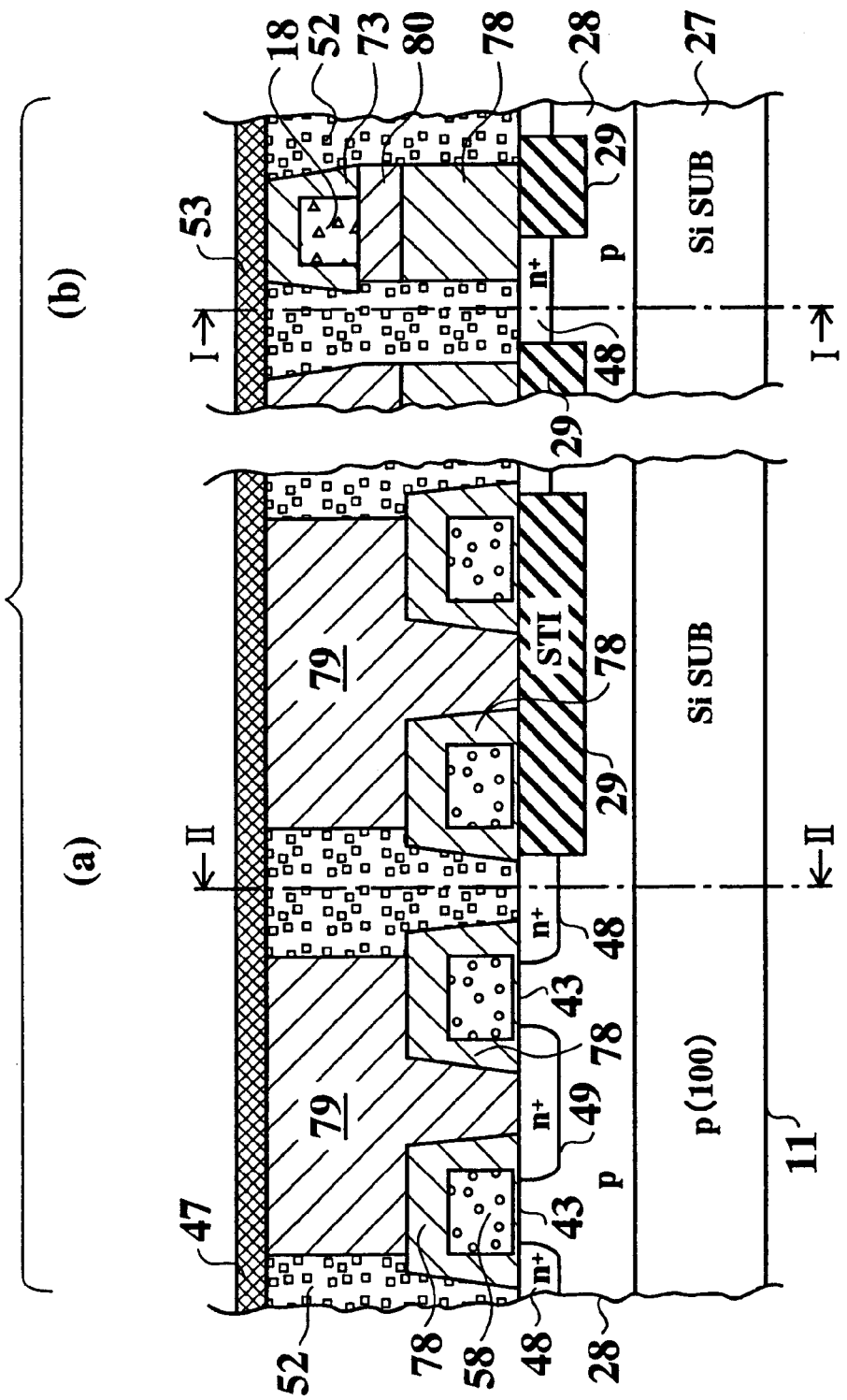

(a) Firstly, as shown in FIG. 19A, a switching transistor, which comprises the n+source region 48, the $n^+$ drain region 49, the gate oxide film 43 and the word line 58, the element isolation region 29, the bit line 18 and the capacitor contact plug 52 are provided in and on the first silicon (100) substrate 27 using a conventionally known process. The topmost surface is flattened by a method such as CMP method to produce a new substrate surface.

(b) Next, a flat Al film is deposited over the entire surface of this substrate to form a first bonding layer 53. At this point, the flat first bonding layer 53 is connected to the $n^+$ source region 48, which constitutes the main electrode region of the switching transistor according to the present invention, by the capacitor contact plug 52.

Figure 19B:
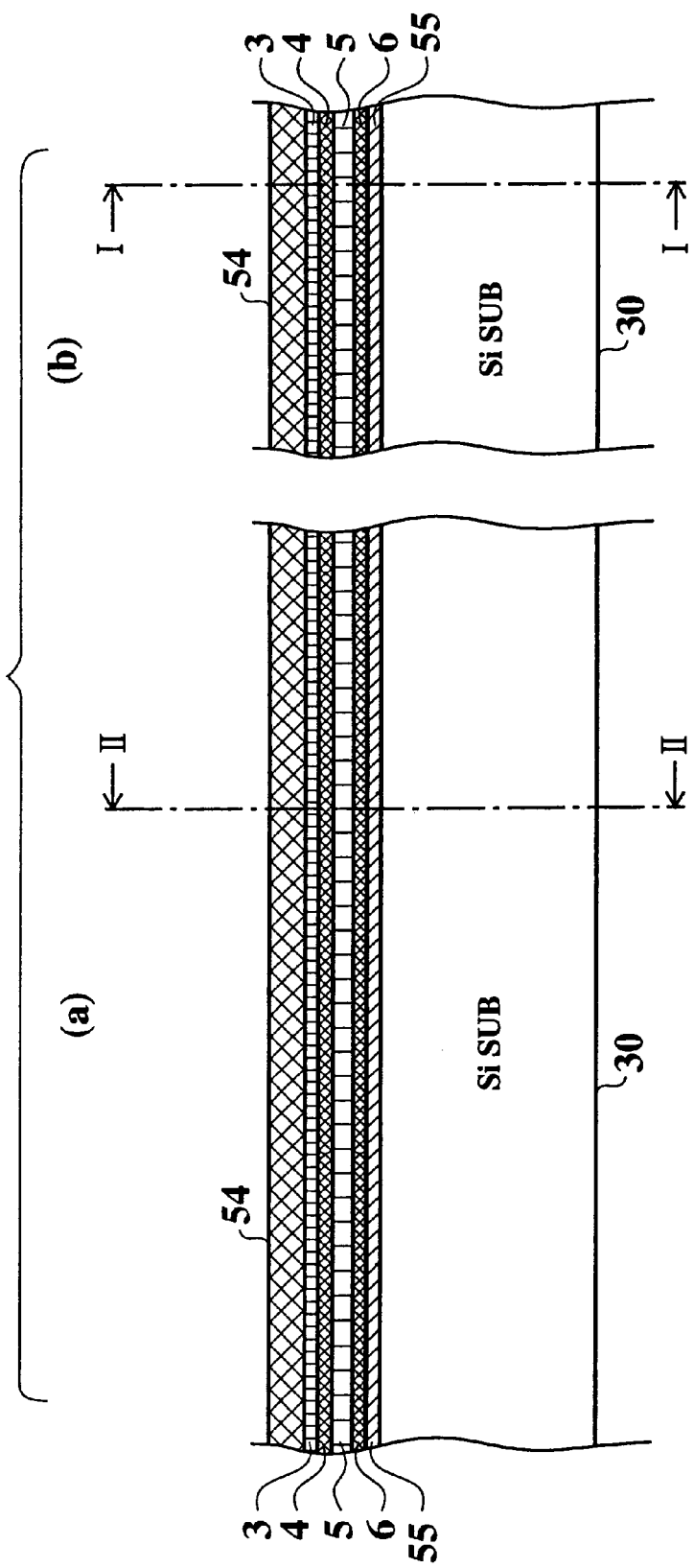

(c) Next, as shown in FIG. 19B, a multilayered structure for capacitor comprising (Ti, Al) N of thickness 10 nm as the second barrier metal layer 55, SrRuO$_3$ of thickness 20 nm as the bottom electrode layer (second electrode layer) 6, a BSTO thin film with a Ba mole fraction of 70% and thickness 20 nm as the dielectric thin film 5, SrRuO$_3$ of thickness 20 nm as the top electrode layer (first electrode layer) 4, and (Ti, Al) N of thickness 10 nm as the first barrier metal layer 3 is formed on the second silicon (100) substrate 30. This multilayered structure for capacitor need only be epitaxially grown continually without contacting the atmosphere by RF or DC sputtering at a substrate temperature of 600° C.

(d) Next, as shown in FIG. 19B, a flat Al film is deposited over the entire surface of the multilayered structure for capacitor thereby forming the second bonding layer 54.

Figure 19C:
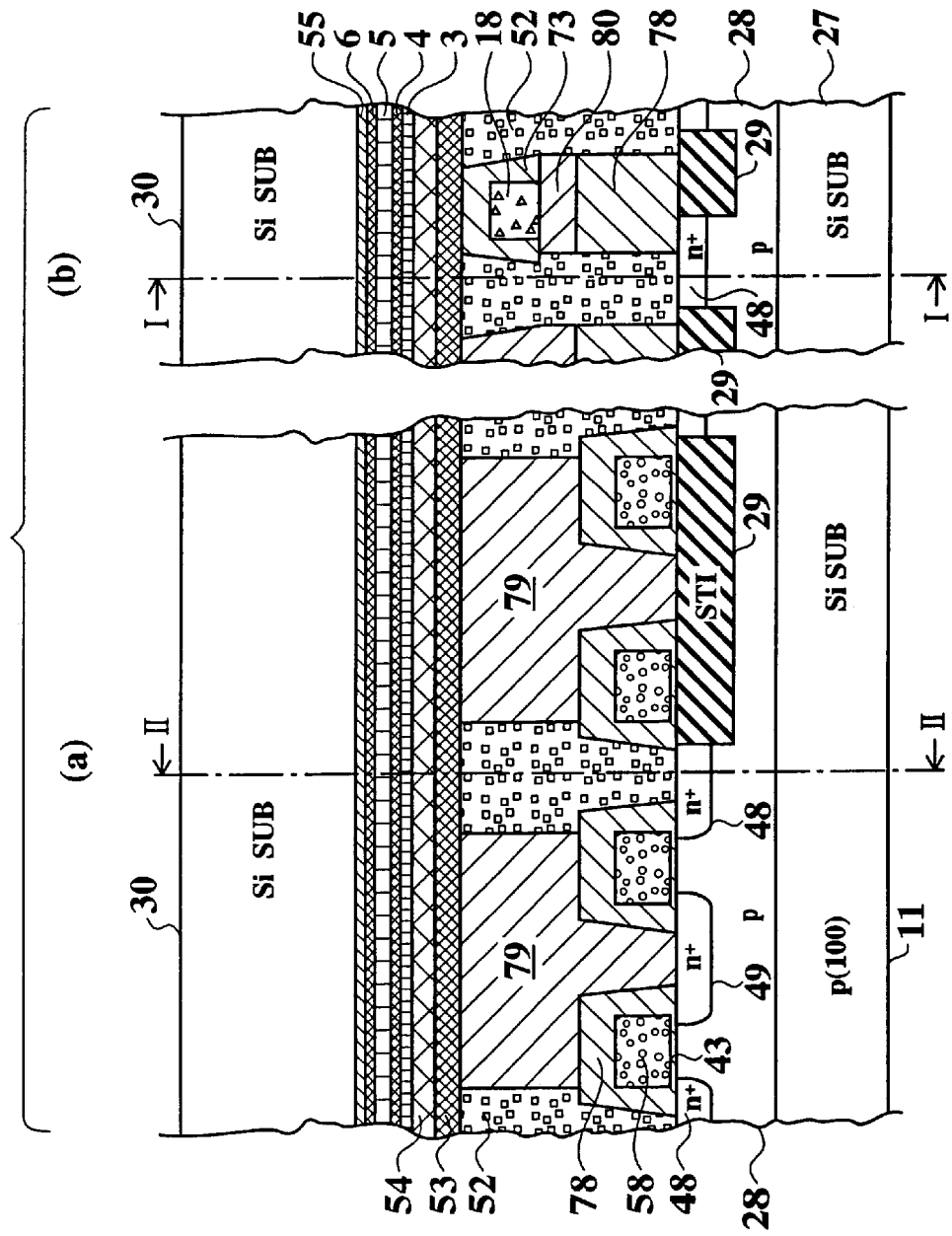

(e) Next, as shown in FIG. 19C, oxide layers formed on the surfaces of the first bonding layer 53 and the second bonding layer 54 are removed by sputtering of Ar gas in an ultra-high vacuum at pressure not greater than $4 \times 10^{-6}$ Pa, revealing the new Al face. Once the new Al face has been revealed, the first bonding layer 53 and the second bonding layer 54 are aligned without being exposed to the atmosphere and pressurized for 30 minutes at 400° C. so as to bond the first semiconductor substrate 27 to the second semiconductor substrate 30.

Figure 19D:
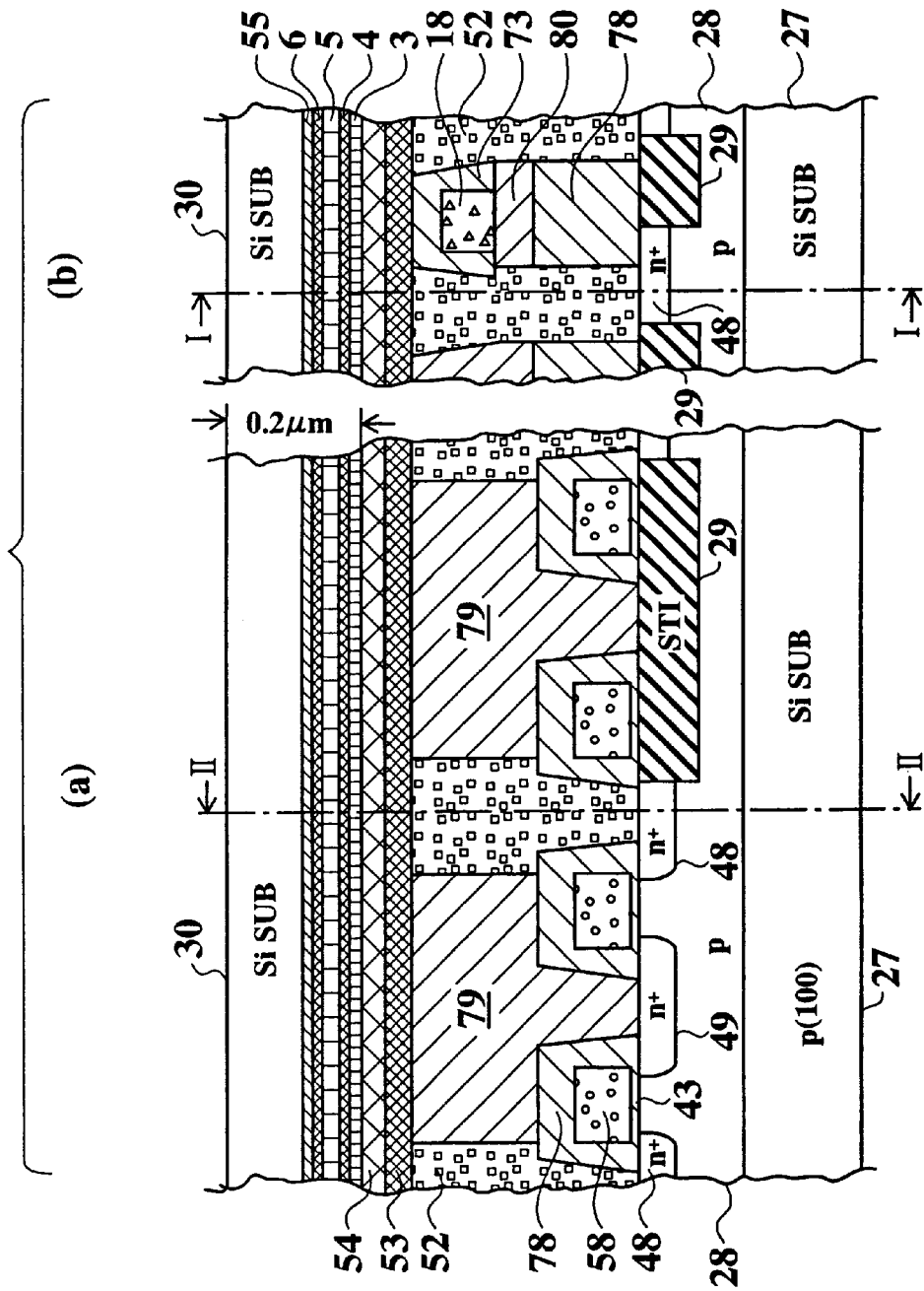

(f) Next, as shown in FIG. 19D, the bottom side of the bonded second semiconductor substrate 30 is polished by CMP or the like so as to leave a capacitor layer and silicon layer of approximately 0.2 µm.

(g) Thereafter, a mask alignment process is carried out using the transistor pattern formed in the semiconductor substrate 27 as a reference, or alignment mark. In other words, a photoresist mask pattern for capacitor isolation is delineated using photolithography. This mask pattern for capacitor isolation is used as a mask for etching. Then, capacitors for each memory cell are patterned using isolation grooves 96 as shown in FIG. 19E. The mask for etching may be a composite film comprising a photoresist and oxide thin film and the like, or another mask material. FIG. 19F is a corresponding top view. The pattern of rectangles which form the patterns for the capacitor portions are arranged in islands corresponding to each of the memory cells. These can be mask aligned using the alignment mark which was used when fabricating the switching transistors on the first semiconductor substrate, or by referring to the pattern of the actual transistors. After bonding, a new alignment mark can be formed. Reactive ion etching (RIE) or the like can be used to dig the isolation grooves 96. For an etching condition at this step, it is preferable to employ the insulating film (oxide layer) 79 as the etching stop layer.

Figure 19G:
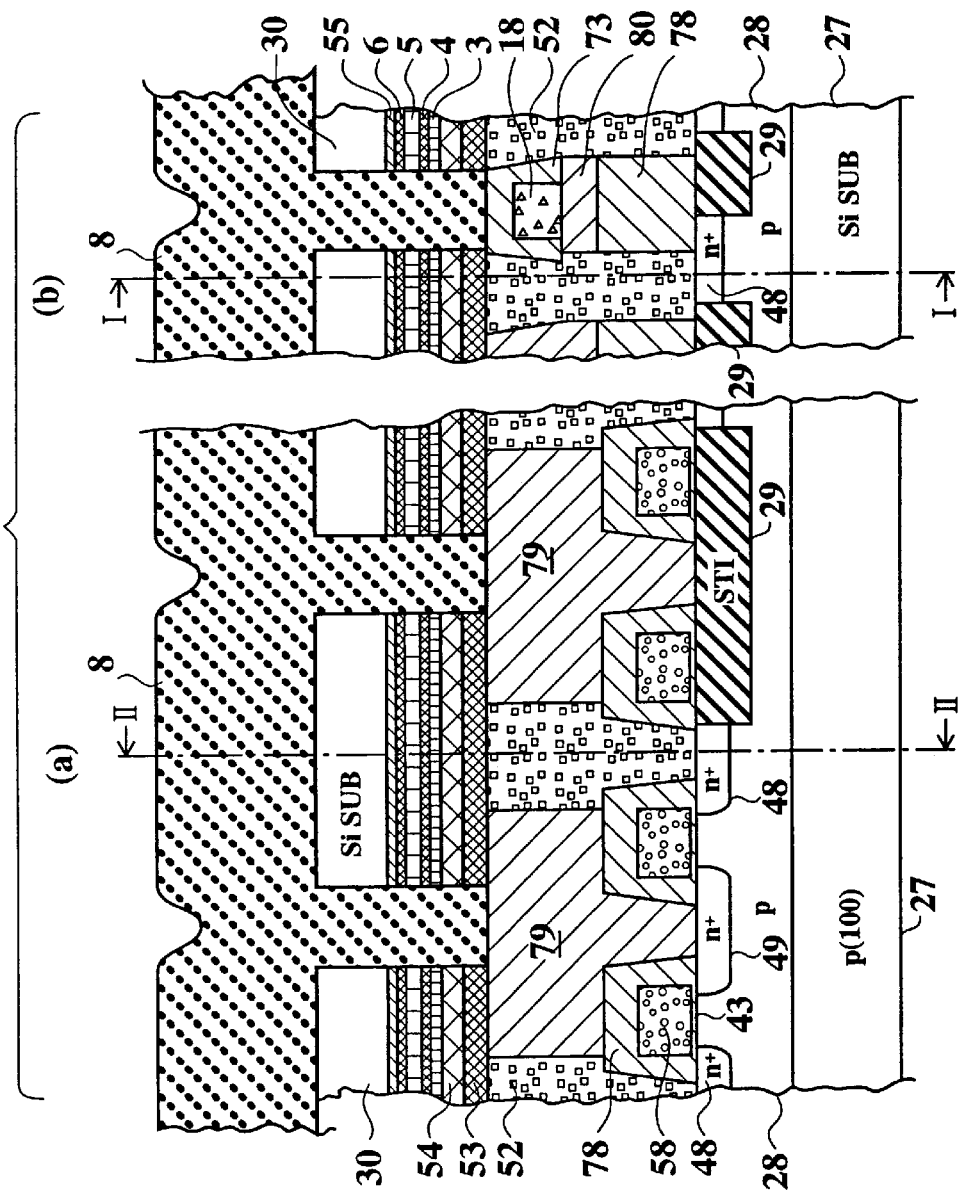
Figure 19H:
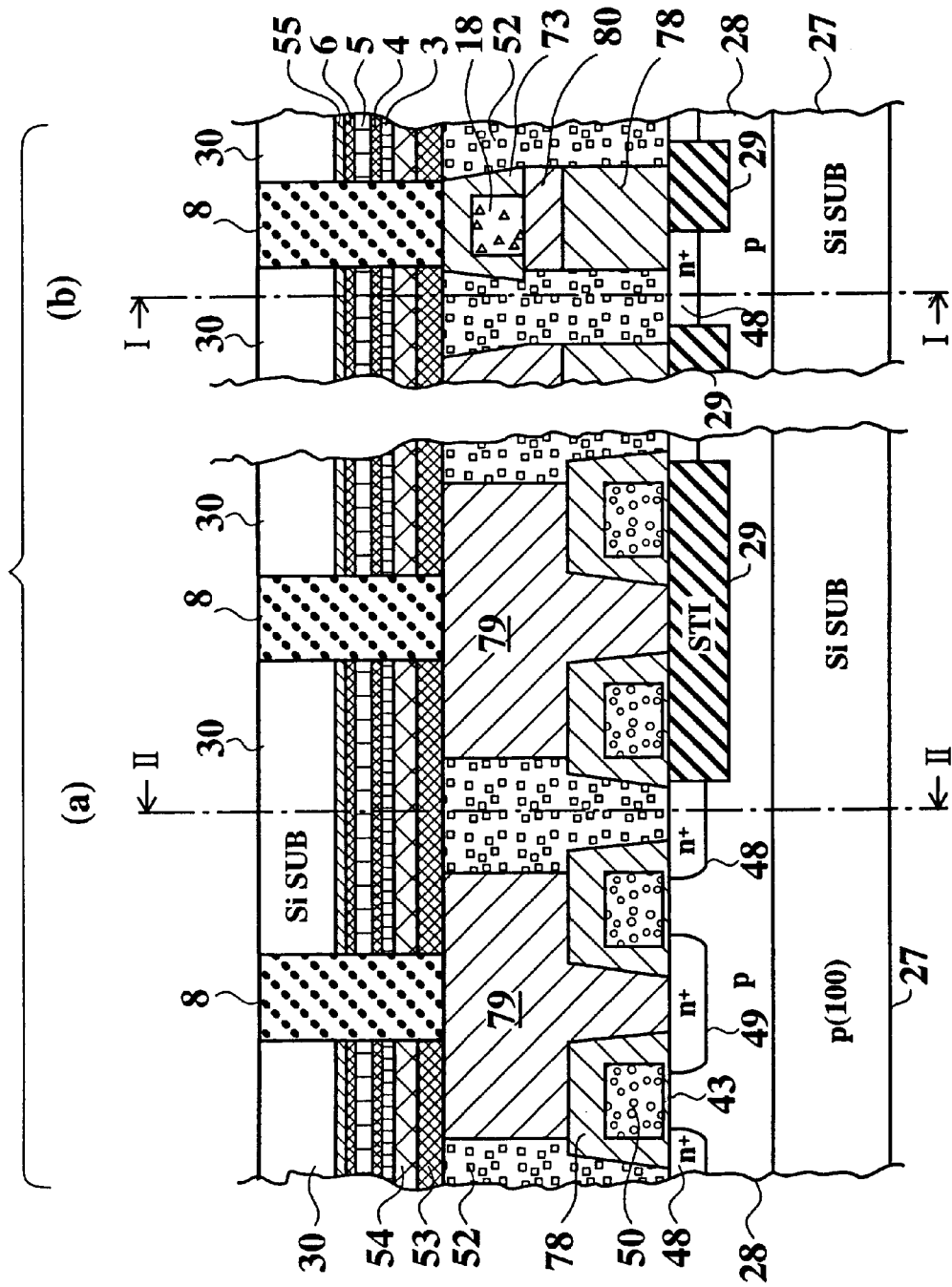

(h) Furthermore, after an insulating film (capacitor isolation region) 8 has been embedded as shown in FIG. 19G by plasma CVD or the like using TEOS gas as the source material, planarizing by CMP or the like is once more carried out as shown in FIG. 19H.

Figure 19I:
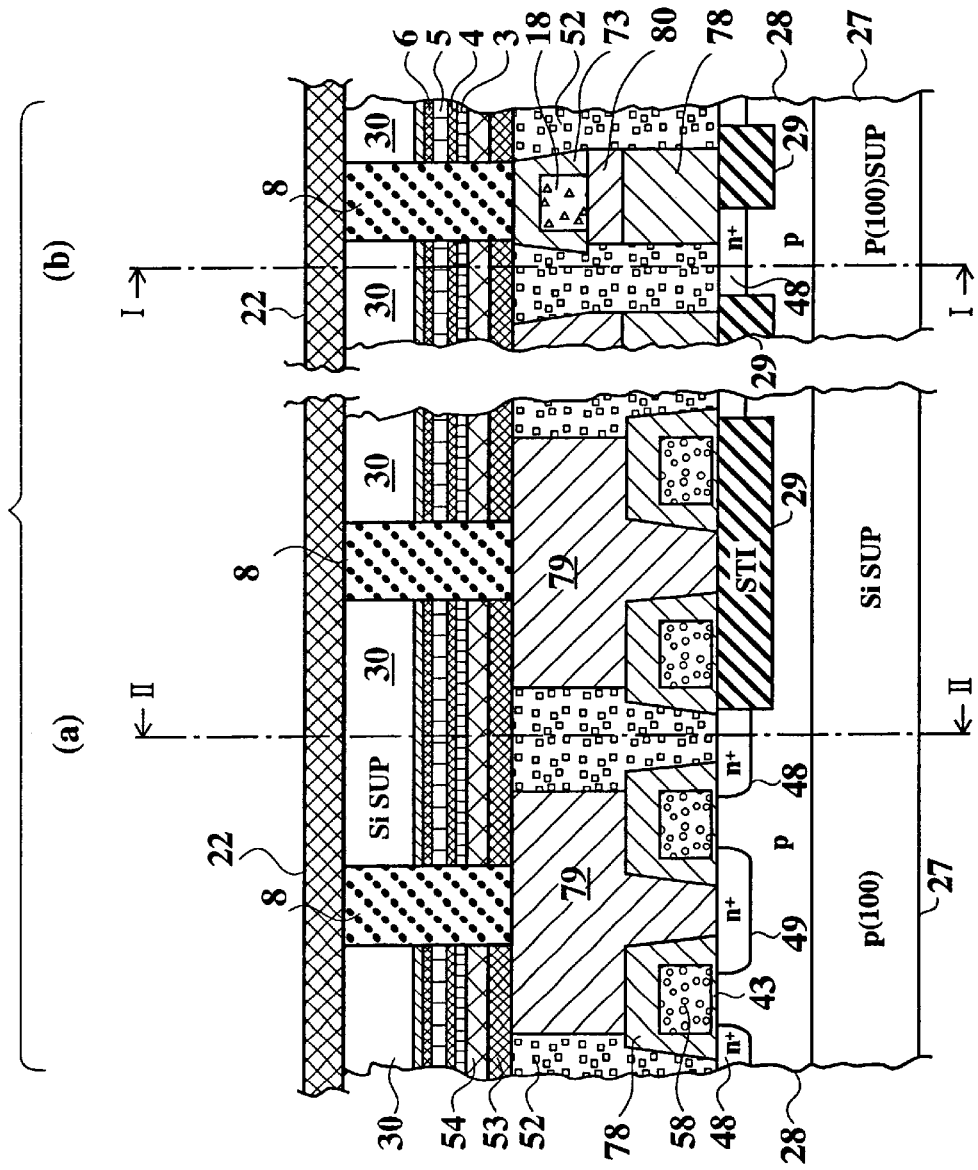

(i) Next, as shown in FIG. 19I, a drive line 22, comprising layers of Ti/TiN/Al, is formed. Finally, turning back to FIG. 18A, the cell is covered with a passivation film 87, comprising oxide film ($SiO_2$ film), PSG film, BPSG film, nitride film ($Si_3N_4$ film), polyimide film or the like.

The steps described above make it possible to fabricate a memory cell, comprising a switching transistor and an epitaxial planar capacitor using perovskite ferroelectric film layers, with good yield, thereby ensuring excellent and highly reliable performance as a FRAM. According to the method for manufacturing a semiconductor memory device of the seventh embodiment of the present invention, there is essentially no problem of misalignment between the upper and lower bonding layers (first and second bonding layers) 53 and 54, due to the fact that the capacitor of each cell is separated and formed in the photolithography step after the first and second semiconductor substrates 27 and 30 have been bonded together. Furthermore, the fact that the flat-faced first bonding layer 53 and the second bonding layer 54 are formed over the entire surface, and they are bonded together guarantees an excellent bonding interface. Consequently, there are no open failures. Moreover, since a new insulating film (capacitor isolation region) 61 is embedded in the isolation grooves 96 around the direct bonding between the first bonding layer 53 and the second bonding layer 54, there is no danger of current leakage paths occurring. Therefore, there is no danger of current leakage and short failures between the first and second bonding layer 53 and 54 of adjacent memory cells.

Figure 23A:
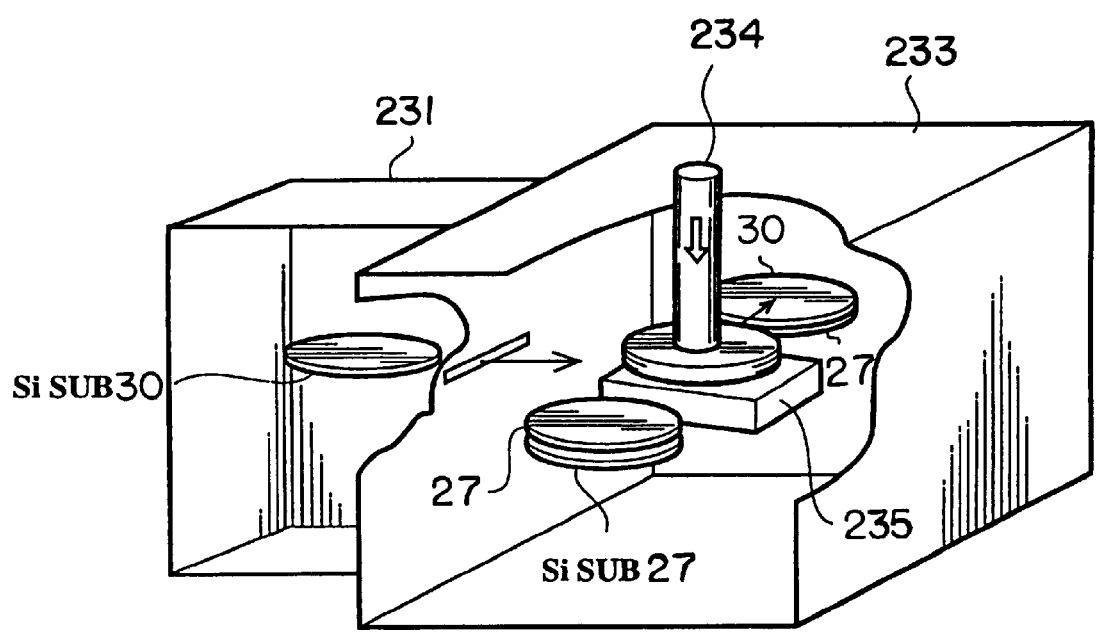
FIG. 23A is a diagram showing a bonding equipment for bonding together two semiconductor substrates after film formation or after surface processing without exposing them to the atmosphere.

FIG. 23A shows a bonding equipment which can be used to conduct a special process of: exposing a new Al face in a ultra-high vacuum, and sticking the semiconductor substrate 27 to the second semiconductor substrate 30 without contacting to the new Al face with the atmosphere in step (e) above. As shown in FIG. 23A, a film deposition chamber 231 is connected to a direct bonding chamber 233 via a gate valve (not shown in the diagram). Furthermore, the film deposition chamber 231 and the direct bonding chamber 233 are connected to an ultra-high vacuum pump such as a cryo pump or a turbomolecular pump (not shown in the diagram), so as to be capable of evacuating to a vacuum of pressure less than $4 \times 10^{-6}$ Pa. A cassette capable of holding a plurality of semiconductor substrates, a stage 235, which the first semiconductor substrate 27 and the second semiconductor substrate 30 are provided upon and which comprises a heater capable of annealing to a predetermined temperature, and a press 234, capable of applying a predetermined pressure to bond the first semiconductor substrate 27 and the second semiconductor substrate 30 together, are provided inside the direct bonding chamber 233. A vacuum preparation chamber is connected to the film deposition chamber 231 via another gate valve which is not shown in the diagram. The first semiconductor substrate 27 and the second semiconductor substrate 30 can be carried from the vacuum preparation chamber in an air-locked state. An Al target is provided inside the film deposition chamber 231 to enable the first bonding layer 53 and the second bonding layer 54 to be deposited by sputtering of Al. Furthermore, a wafer holder, which the first semiconductor substrate 27 and the second semiconductor substrate 30 are mounted upon, can be switched between ground level and high-voltage level. Therefore, after the first bonding layer 53 and the second bonding layer 54 have been deposited by sputtering, the polarity is immediately switched, whereby the oxide layers on the surfaces of the first and second bonding layers 53 and 54 can be removed by sputtering of Ar gas in an ultrahigh vacuum of pressure less than $4 \times 10^{-6}$ Pa, and a new Al face can be formed. Of course, it is better to provide further an etching chamber, in which the oxide layers on the surfaces of the first bonding layer 53 and the second bonding layer 54 are removed, independently to the deposition chamber, in which the first bonding layer 53 and the second bonding layer 54 are deposited—then the etching chamber and the deposition chamber are connected through an gate bulb—so that the first and second semiconductor substrates 27 and 30 are transferred from the deposition chamber to the etching chamber in a vacuum. In either case, once the new Al face has been revealed as a result of sputtering, the gate valve is opened and the first semiconductor substrate 27 and the second semiconductor substrate 30 are vacuum-transferred to the direct bonding chamber 233. More specifically, a sequence is acceptable wherein, firstly, a plurality of first semiconductor substrates 27 are vacuum-transferred into the direct bonding chamber 233 where they are temporarily held in a cassette inside the direct bonding chamber 233, and next, the second semiconductor substrate 30 is vacuum-transferred into the direct bonding chamber 233. Inside the direct bonding chamber 233, the first semiconductor substrate 27 and the second semiconductor substrate 30 are mounted on a stage 235, direct bonded by the press 234 with a predetermined pressure at 400° C. for 30 minutes. According to the method for manufacturing a semiconductor memory device of the seventh embodiment of the present invention, the position of the capacitor of each cell with respect to the main electrode layer of each switching transistor is determined once the first and second semiconductor substrates 27 and 30 have been bonded together, since the capacitor of each cell is delineated and separated in the photolithography step after the first and second semiconductor substrates 27 and 30 have been bonded together. Therefore, a slight deviation in the bonding position between the first and second semiconductor substrates is permissible. In other words, in the SDB process according to the seventh embodiment, it is only required that the positions of the rims of the first and second semiconductor substrates are roughly matched together. Even in the case of a semiconductor memory device having a gigabit-level fine pattern, it is not necessary to mechanically bond the first semiconductor substrate to the second semiconductor substrate while taking care that their positions are aligned to the transistor pattern at the submicrometer to nanometer levels. Therefore, position alignment and bonding can be performed with the simple mechanical control apparatus, whose configuration is shown in FIG. 23A. Since no complex apparatus are required to enter into the vacuum chamber, few outgas elements escape into the vacuum from the apparatus installed in the chamber, so that a vacuum of pressure less than $4\times10^{-6}$ Pa can easily be achieved. Therefore, a highly reliable direct bonding between the first bonding layer 53 and the second bonding layer 54 can be achieved. As a result, the semiconductor memory device has high performance and high reliability.

Figure 20:
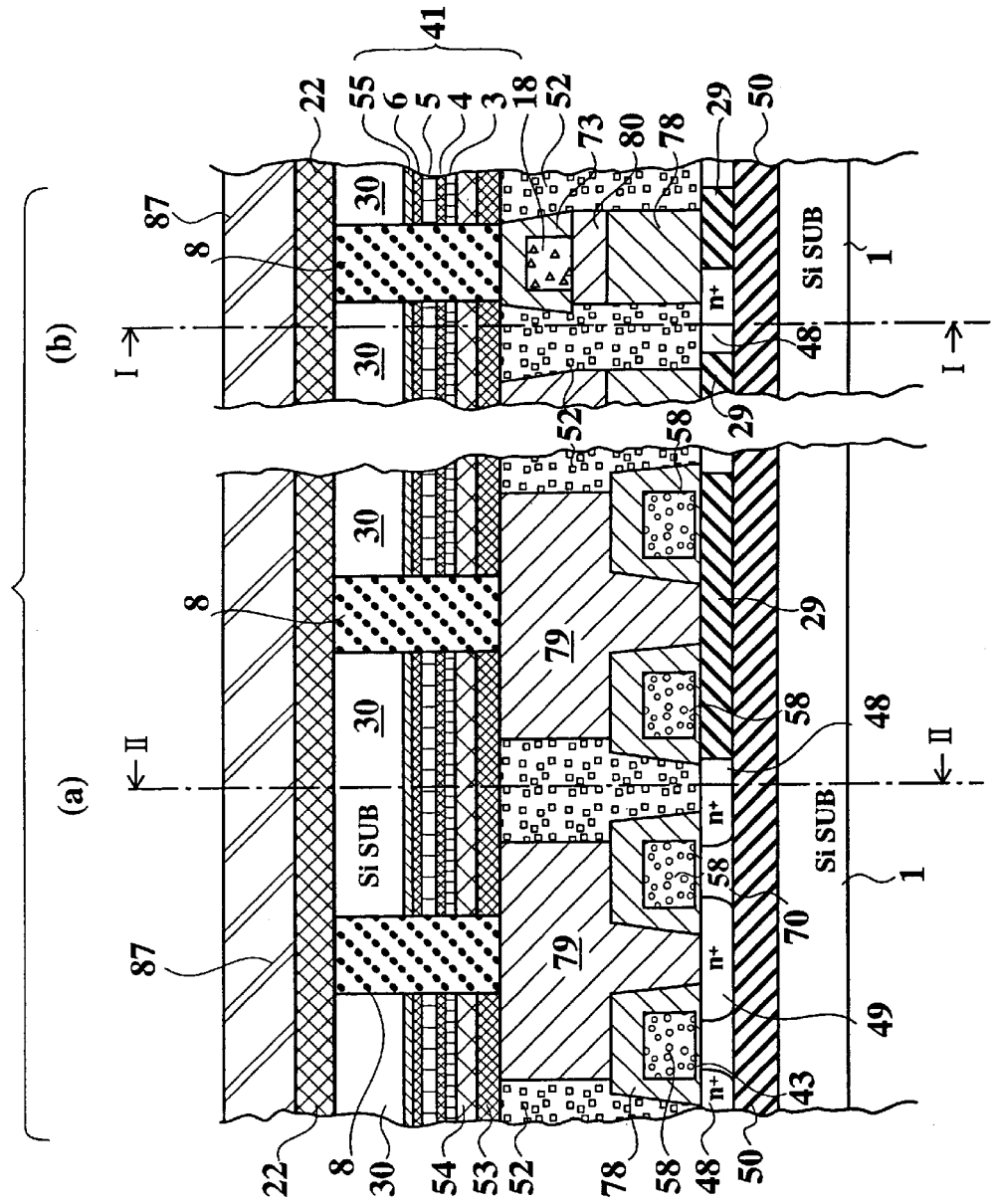
FIG. 20 is a schematic cross-sectional view of an SOI-FRAM memory cell according to the seventh embodiment of the present invention.

FIG. 20 is a schematic cross-sectional view of an SOI-FRAM memory cell according to a modification of the seventh embodiment of the present invention, which has an epitaxial planar capacitor using a Ba-rich BSTO thin film layer (ferroelectric thin film layer). As shown in FIG. 20, in this semiconductor memory device (FRAM), a plurality of switching transistors are provided in a matrix on an SOI substrate (1,50,70). The SOI substrate (1,50,70) comprises a first semiconductor substrate 1 as a supporting substrate, an buried insulating film 50 on the first semiconductor substrate 1 and an SOI film 70 on the buried insulating film 50. The SOI substrate (1,50,70) can be formed by a method such as direct bonding (SDB), SIMOX, epitaxial growth or the like. The SOI-FRAM memory cell according to a modification of the seventh embodiment of the present invention shown in FIG. 20 comprises a first semiconductor substrate 27 wherein a plurality of switching transistors are provided in a matrix, a second semiconductor substrate 30 having a plurality of perovskite epitaxial planar capacitors 41 corresponding to the plurality of switching transistors, and connectors (52, 53 and 54) for electrically connecting the main electrode regions 48 of the switching transistors to their corresponding epitaxial planar capacitors 41. As described above, the "first semiconductor substrate" and "second semiconductor substrate" of the present invention are not restricted to silicon wafers formed by methods such as CZ, FZ, MCZ and the like, but apply also to an epitaxial wafer, which has been epitaxially grown on a silicon wafer formed by a method such as CZ, FZ, MCZ and the like, and an SOI substrate and the like using these silicon wafers.

Then, as shown in FIG. 20, in the SOI-FRAM memory cell according to a modification of the seventh embodiment of the present invention, a plurality of MOS transistors are separated by an STI region 29 which reaches the buried insulating film 50. The plurality of MOS transistors constitute an nMOSFET formed on the surface of a p-type SOI film 70 on the buried insulating film 50. This nMOSFET has an $n^+$ source region 48 and an $n^+$ drain region 49 as main electrode regions inside the p-type SOI film 70. In addition, the control electrode layer of the nMOSFET comprises a gate electrode layer 58 on the gate oxide film 43 on the surface of the p-type SOI film 70. This gate electrode layer 58 forms part of a word line. Furthermore, a bit line contact plug (not shown in the diagram) is provided above the drain region 49 (See FIG. 18B) and connects to a bit line 18. The bit line 18 runs horizontally at a right angle to the word line 58.

As shown in FIG. 20, a capacitor contact plug 52 connects to the $n^+$ source region 48. On the other hand, the epitaxial planar capacitor 41 comprises a first barrier metal layer 3, a first electrode layer 4 such as an SRO, a dielectric thin film 5 such as BSTO thin film with a 70% Ba mole fraction, a second electrode layer 6 such as an SRO and a second barrier metal layer 55. The second semiconductor substrate 30 is a high impurity concentration semiconductor substrate, having impurity concentration of between approximately $2\times10^{18}$ to $1\times10^{20}$ cm$^{-3}$. The second barrier metal layer 55 is connected to a drive line 22, comprising layers of Ti/TiN/Al or the like, with the high impurity concentration second semiconductor substrate 30 in between. Furthermore, a passivation film 87 is provided over the drive line 22. Then, a second bonding layer 54 is connected to the first barrier metal layer 3. As a result, the capacitor contact plug 52, the first bonding layer 53 and the second bonding layer 54 electrically connect the $n^+$ source region 48 to the epitaxial planar capacitor (capacitor portion) 41. Symbols 73, 78, 79 and 80 in FIG. 20 represent insulating films such as oxide film (SiO$_2$ film), PSG film, BPSG film or nitride film (Si$_3$N$_4$ film).

Eighth Embodiment

Figure 21A:
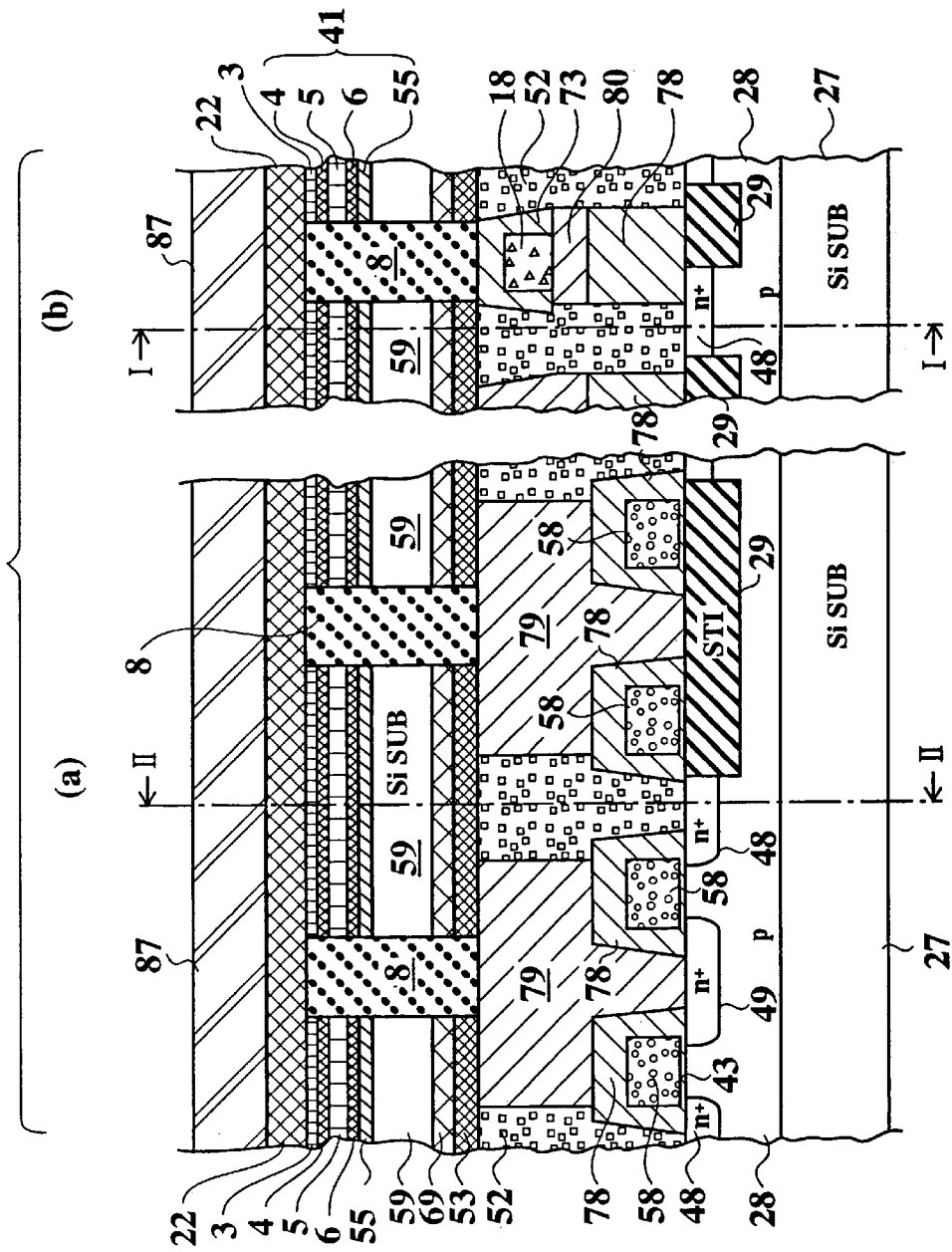
FIG. 21A is a schematic cross-sectional view of a FRAM memory cell according to an eighth embodiment of the present invention.
Figure 21B:
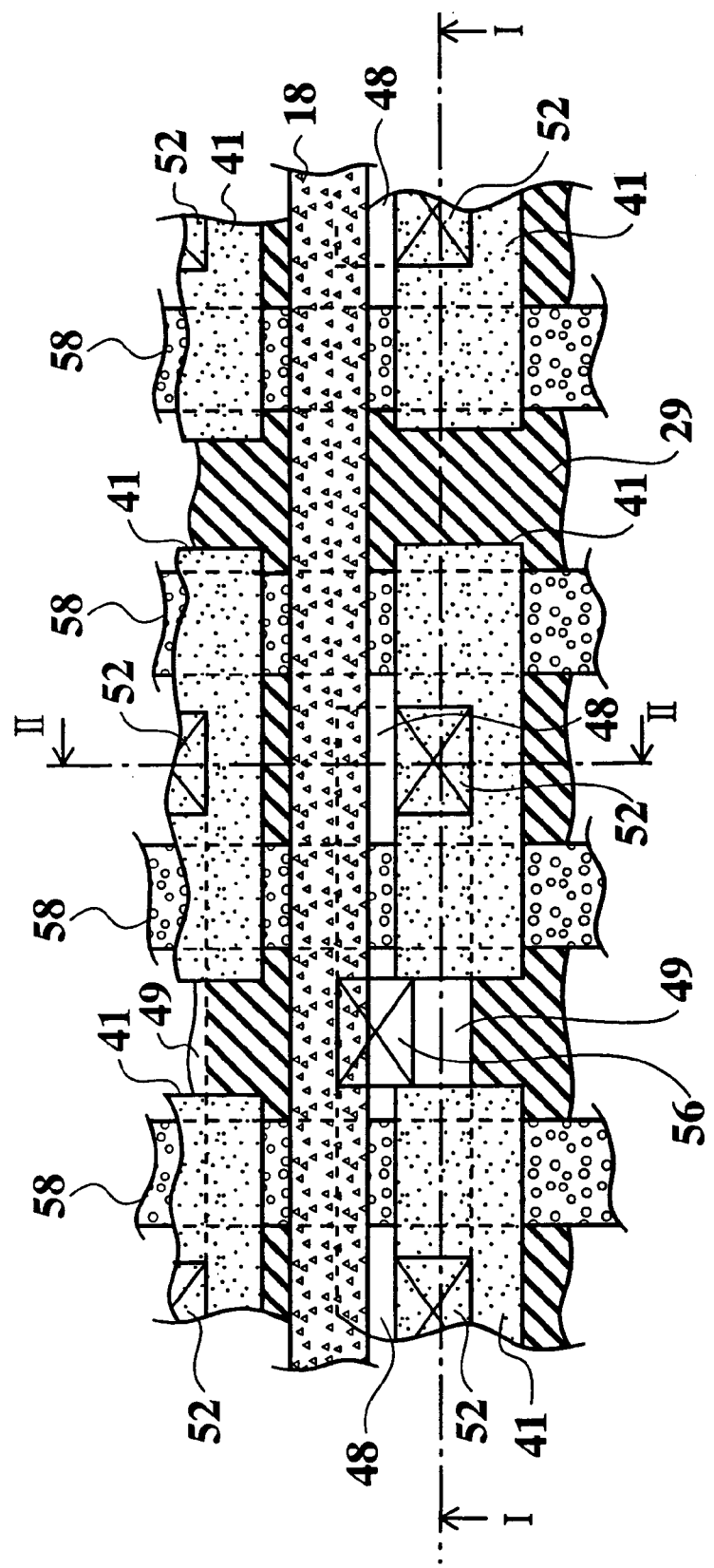
FIG. 21B is a top view of a FRAM memory cell according to the eighth embodiment of the present invention.

FIG. 21A and FIG. 21B respectively show a cross-sectional view and a top view of a semiconductor memory device according to an eighth embodiment of the present invention. The semiconductor memory device according to the eighth embodiment of the present invention is a FRAM having an epitaxial planar capacitor which uses a BSTO thin film with a 70% Ba mole fraction as a ferroelectric thin film layer. FIG. 21A (a) and FIG. 21A (b) are mutually orthogonal cross-sectional views. In other words, FIG. 21A (b) is a cross-sectional view taken along the direction II—II of FIG. 21A (a), and FIG. 21A (a) is a cross-sectional view taken along the direction I—I of FIG. 21A (b). And, FIG. 21B is a corresponding top view.

As shown in FIG. 21A, this semiconductor memory device (FRAM) comprises at least a first semiconductor substrate 27 wherein a plurality of switching transistors are provided in a matrix, a second semiconductor substrate 59 having a plurality of perovskite epitaxial planar capacitors 41 corresponding to the plurality of switching transistors, and connectors (52, 53, 69 and 59) for electrically connecting the main electrode regions 48 of the switching transistors to their corresponding epitaxial planar capacitors 41.

Then, as shown in FIG. 21A, in the semiconductor memory device according to the eighth embodiment of the present invention, a plurality of MOS transistors, separated by an STI region (element isolation region) 29, are provided on the semiconductor substrate 27 in a matrix. These a plurality of MOS transistors form an nMOSFET in and on the surface of a p-well 28 provided on the semiconductor substrate 27. This nMOSFET has a source region 48 and a drain region 49, comprising $n^+$ regions, which constitute the main electrode regions in the p-well 28. Furthermore, the nMOSFET has a control electrode layer comprising a gate electrode layer 58 provided above a gate oxide film 43 on the surface of the p-well 28. This gate electrode layer 58 forms part of a word line. As shown in FIG. 21B, there are a plurality of word lines 58 running vertically.

Furthermore, as shown in FIG. 21B, a bit line contact plug 56, comprising doped polysilicon, refractory metal or refractory metal silicide or the like, is provided above the drain region 49 and connects to a bit line 18. The bit line 18 runs horizontally at a right angle to the word lines 58. For simplification, only one bit line 18 is shown in FIG. 21B, but of course the X-Y matrix is formed from a plurality of bit lines and a plurality of word lines.

As shown in FIG. 21A, a capacitor contact plug 52, comprising doped silicon, refractory metal or refractory metal silicide or the like, is connected to the n$^+$ source region 48. A first bonding layer 53, having the same top pattern as the rectangular epitaxial planar capacitor 41 shown in FIG. 21B, connects to the capacitor contact plug 52.

On the other hand, the epitaxial planar capacitor 41 (capacitor portion) comprises a second barrier metal layer 55, a second electrode layer 6 such as an SRO, a dielectric thin film 5, such as BSTO thin film with a 70% Ba mole fraction, and a first barrier metal layer 3. A drive line 22, such as Ti/TiN/Al layer or the like is provided on the first barrier metal layer 3, and a passivation film 87, comprising oxide film (SiO$_2$ film), PSG film, BPSG film, nitride film (Si$_3$N$_4$ film) or polyimide film or the like, is provided on the drive line 22. The second semiconductor substrate 59 is a heavily doped semiconductor substrate, having impurity concentration of between approximately $2\times10^{18}$ to $1\times10^{20}$ cm$^{-3}$. The second barrier metal layer 55 is connected to a second bonding layer 69 with the high impurity concentration second semiconductor substrate 59 in between. In other words, a multilayered structure which comprises the second barrier metal layer 55, the second electrode layer 6, the dielectric thin film 5 comprising BSTO or the like, the first electrode layer 4 and the first barrier metal layer 3, in addition to the second semiconductor substrate 59 and the first and second bonding layers 53 and 69 are separately formed in the same top pattern as the rectangular epitaxial planar capacitor 41 shown in FIG. 21B. Then, the capacitor contact plug 52, the first bonding layer 53 and the second bonding layer 69 electrically connect the n$^+$ source region 48 to the epitaxial planar capacitor 41. Symbols 73, 78, 79 and 80 in FIG. 21A represent insulating films such as oxide film (SiO$_2$ film), PSG film, BPSG film or nitride film (Si$_3$N$_4$ film).

Next, a method for manufacturing the semiconductor memory device according to the eighth embodiment of the present invention will be explained using the following schematic cross-sectional views of the sequence of manufacturing steps (FIG. 22A to FIG. 22H, and FIG. 19A which was explained in the seventh embodiment). The following steps (a) and (b) are basically identical to the manufacturing method for a semiconductor memory device according to the seventh embodiment already described, with the exception of the fact that a Cu film is used instead of an Al film as the first bonding layer 53. Steps (a) and (b) will be explained with reference to FIG. 19A already described above. In FIG. 22A to FIG. 22H, (a) and (b) are mutually orthogonal cross-sectional views. In other words, (b) are cross-sectional views taken along the line II—II of (a), and (a) are cross-sectional views taken along the line I—I of (b).

(a) Firstly, as shown in FIG. 19A which was described above in the seventh embodiment, a switching transistor, which comprises the n$^+$ source region 48, the n$^+$ drain region 49, the gate oxide film 43 and the word line 58, the element isolation region 29, the bit line 18 and the capacitor contact plug 52 are provided on the first silicon (100) substrate 27 using a conventionally known process. The topmost surface is flattened by a method such as CMP method to produce a substrate surface.

(b) Next, a flat Cu film is deposited over the entire surface of this substrate to form a first bonding layer 53. At this point, the flat first bonding layer 53 is connected to the n$^+$ source region 48, which constitutes the main electrode region of the switching transistor according to the present invention, by the capacitor contact plug 52.

(c) Next, as shown in FIG. 22A, a flat Cu film is deposited over the entire surface of the second silicon (100) substrate 59 to form a second bonding layer 69.

Figure 22B:
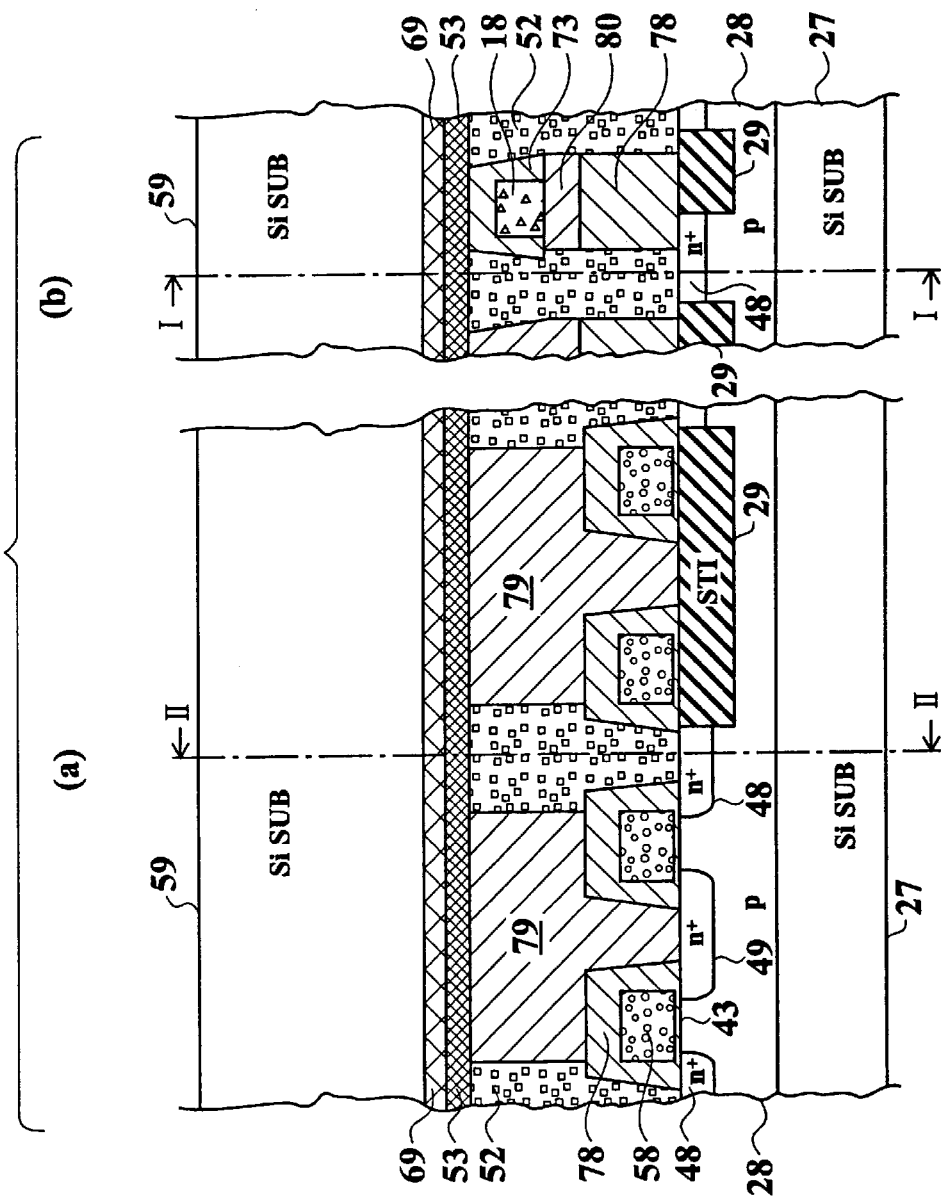

(d) Next, as shown in FIG. 22B, the Cu films over the first bonding layer 53 and the second bonding layer 69 are reduced in hydrogen at 400° C., thereby reducing the surface Cu. Then, the first bonding layer 53 and the second bonding layer 69 are position aligned without being exposed to the atmosphere and direct bonded for 30 minutes at 500° C. A bonding equipment such as the one shown in FIG. 23B may be used in order to direct bond the first bonding layer 53 and the second bonding layer 69 without exposing their surfaces to the atmosphere.

Figure 22C:
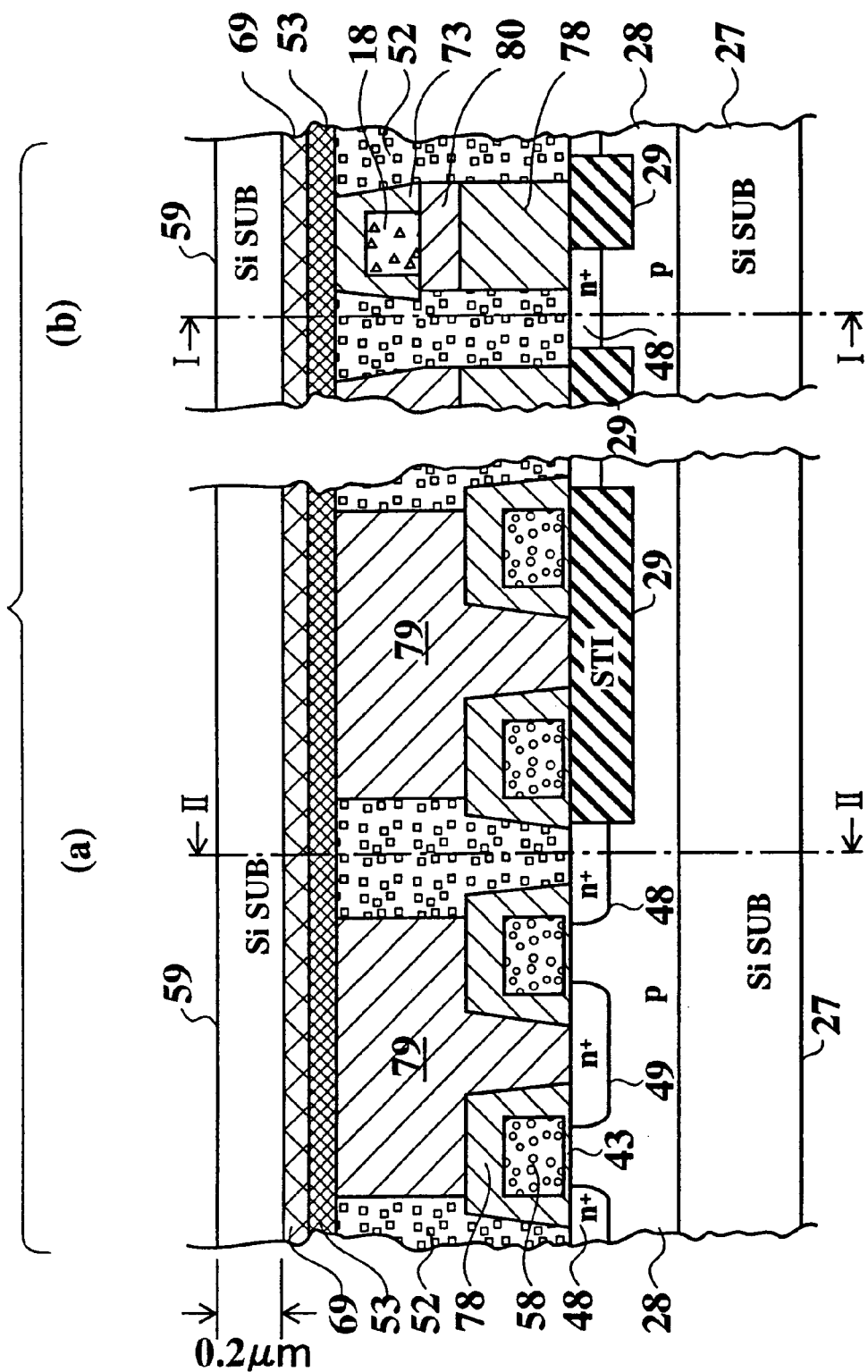

(e) Next, as shown in FIG. 22C, the thickness of the bonded second semiconductor substrate 59 is adjusted to a predetermined thickness. For instance, the bottom surface of the second semiconductor substrate 59 is polished using CMP or the like to produce a thin film which is approximately 0.2 μm thick.

(f) Next, a multilayered structure for capacitor, comprising (Ti, Al) N of thickness 10 nm as the second barrier metal layer 55, SrRuO$_3$ of thickness 20 nm as the bottom electrode layer (second electrode layer) 6, a BSTO thin film with a Ba mole fraction of 70% and thickness 20 nm as the dielectric thin film 5, SrRuO$_3$ of thickness 20 nm as the top electrode layer (first electrode layer) 4, and (Ti, Al) N of thickness 10 nm as the first barrier metal layer 3, is epitaxially grown continually without contacting the atmosphere by RF or DC sputtering at a substrate temperature of 600° C.

Figure 22E:
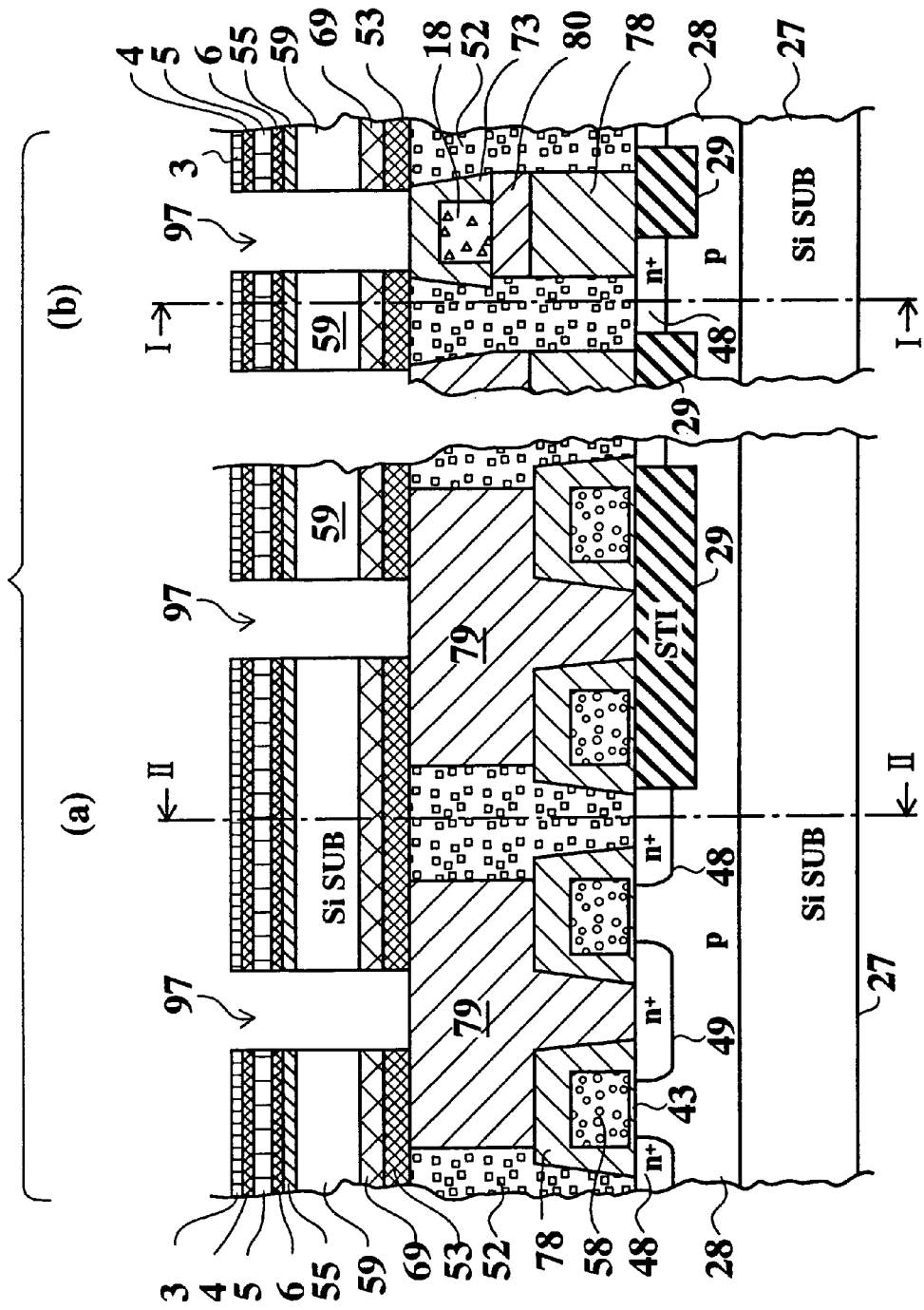

(g) Next, as shown in FIG. 22E, position alignment is carried out, using the switching transistor pattern formed on the first semiconductor substrate 27 as a base substrate, and a photoresist mask pattern for separating is created using photolithography. Isolation grooves 97 are created by using the mask pattern for separating as a mask for etching. It is acceptable for the mask for etching to have a multilayered structure comprising a photoresist and oxide thin film and the like, or other mask material. The isolation grooves 97 separate the multilayered structure for capacitor 3, 4, 5, 6 and 55, the second semiconductor substrate 59 and the first and second bonding layers 53 and 69 into a plurality of patterns, forming capacitors for each of the memory cells. Position alignment during photolithography can be performed using the alignment mark which was used when fabricating the switching transistors on the first semiconductor substrate 27, or by referring to the pattern of the actual switching transistors. A new alignment mark can be formed after bonding. Reactive ion etching (RIE) or the like can be used to create the isolation grooves 97. A condition of etching at this point is that the oxide layer 79 is used as the etching stop layer.

Figure 22F:
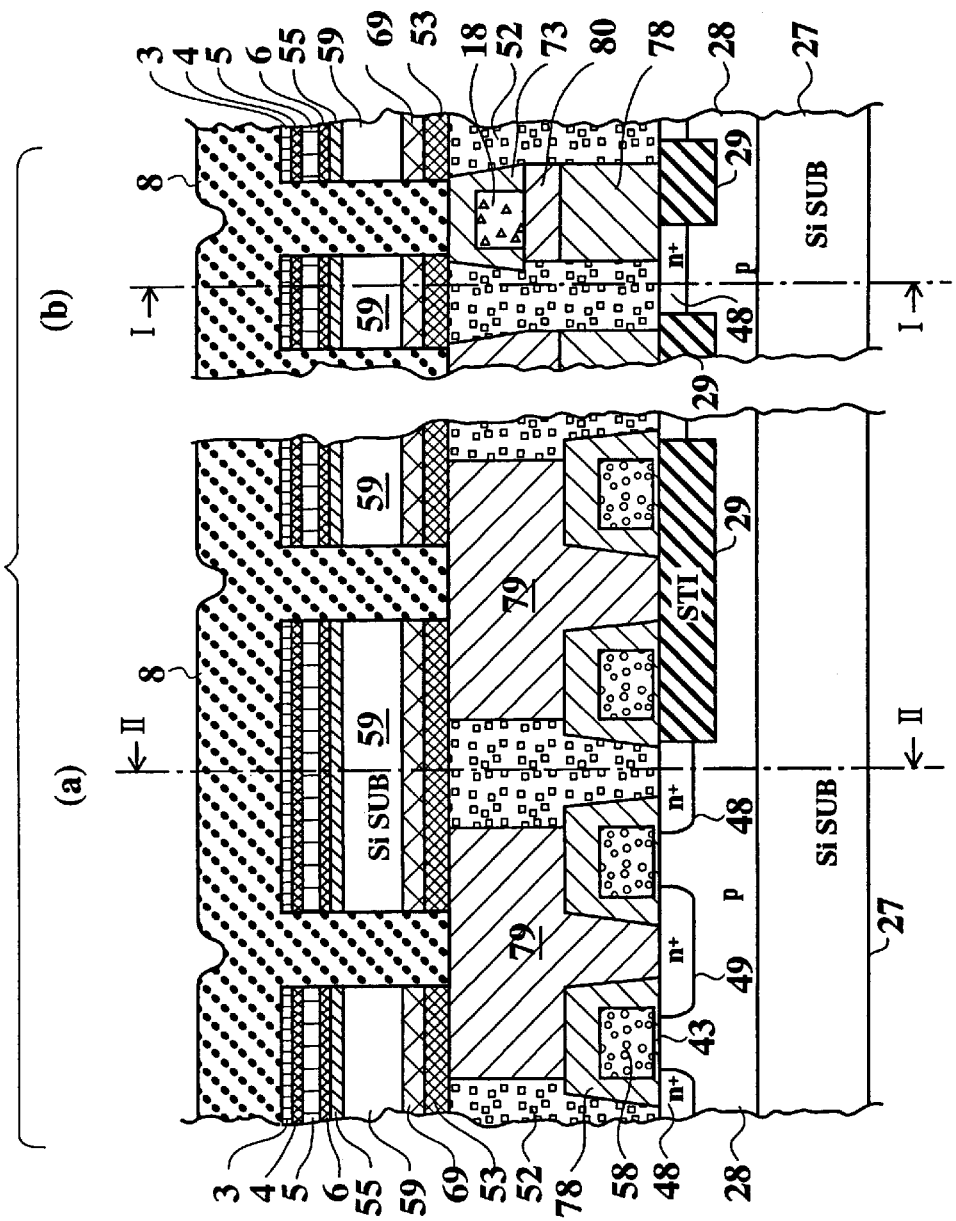
Figure 22G:
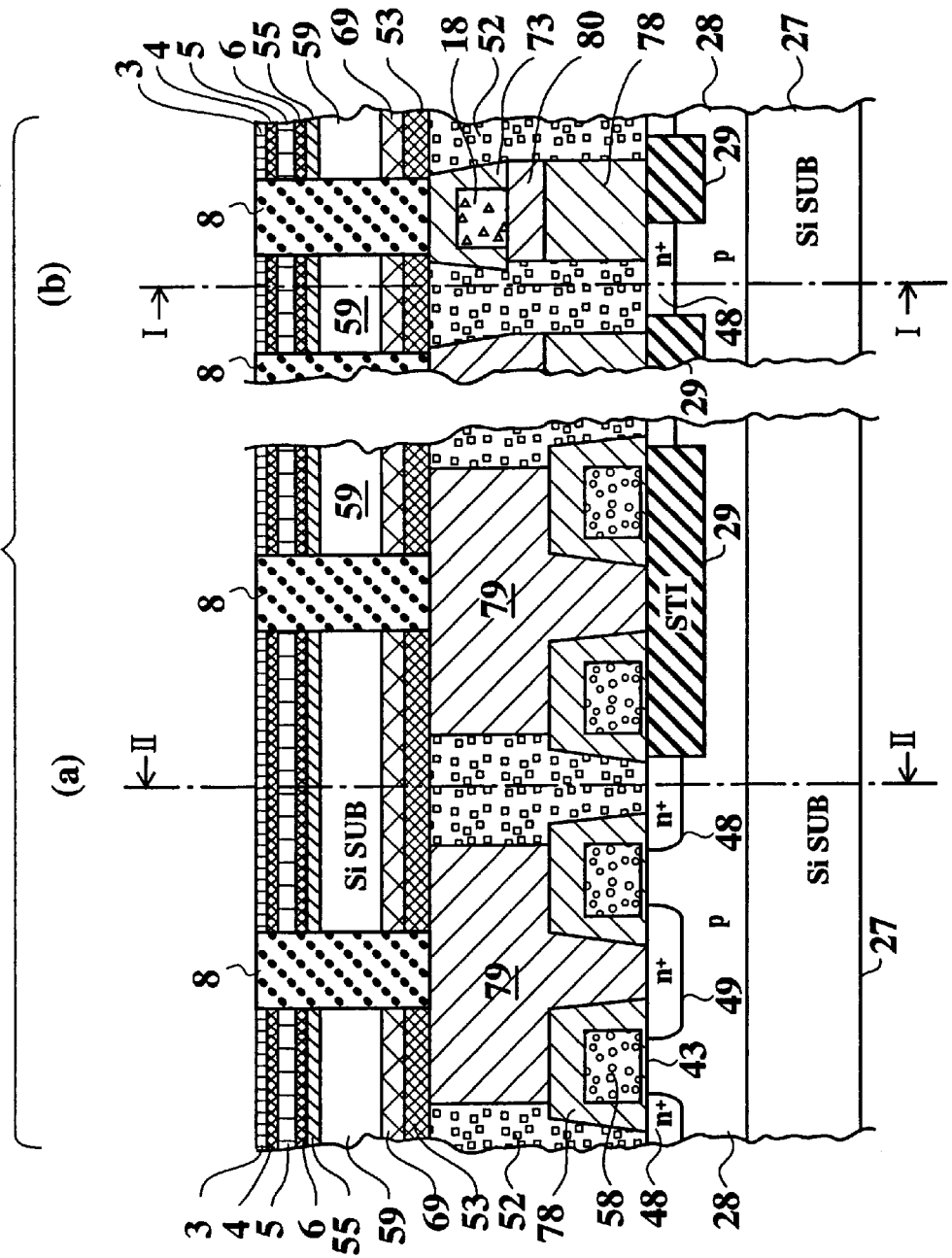
Figure 22H:
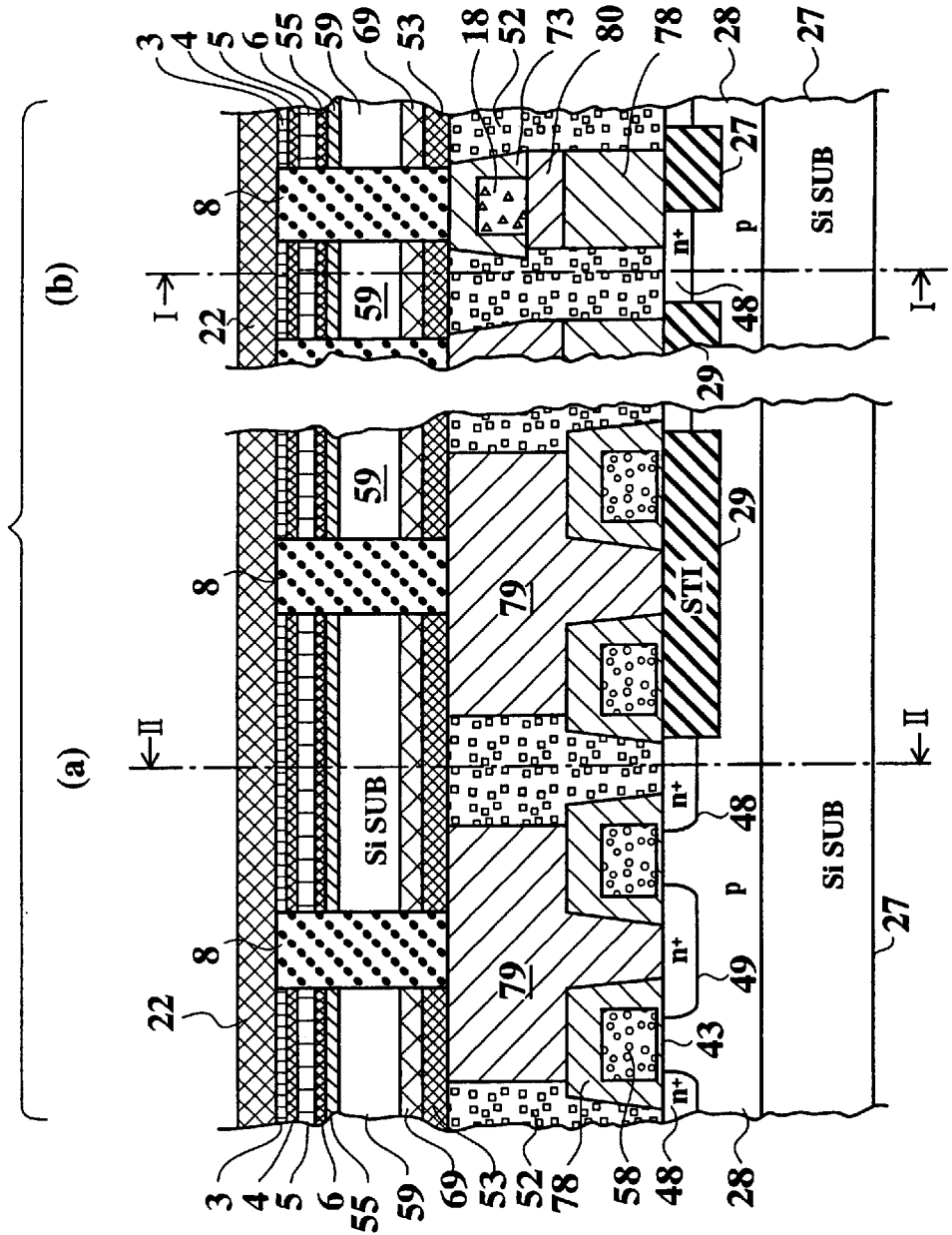

(h) Furthermore, as shown in FIG. 22F, after an insulating film (capacitor isolation region) 8 has been embedded by plasma CVD or the like using TEOS gas as the source gas, planarizing by CMP or the like is once more carried out as shown in FIG. 22G. Thereafter, as shown in FIG. 22H, a drive line 22, comprising layers of Ti/TiN/Al, is formed. Finally, turning back to FIG. 21A, the cell is covered with a passivation film 87, comprising oxide film (SiO$_2$ film), PSG film, BPSG film, nitride film (Si$_3$N$_4$ film), polyimide film or the like.

The steps described above enable a memory cell, comprising switching transistors and epitaxial planar capacitors using the ferroelectric film layer 5, to be manufactured with good yield, ensuring excellent and highly reliable operation as a FRAM.

According to the method for manufacturing a semiconductor memory device of the eighth embodiment of the present invention, there is essentially no problem of misalignment between the upper and lower first bonding layer 53 and second bonding layer 69, due to the fact that the capacitor of each cell is separated and formed in the photolithography steps, which are conducted after the first and second semiconductor substrates 27 and 59 have been bonded together. Furthermore, the flat-faced first bonding layer 53 and the second bonding layer 69 which are formed over the entire surfaces are bonded together to obtain an excellent bonding interface. Consequently, there are no open failures. Moreover, since a new insulating film (capacitor isolation region) 8 is embedded in the isolation grooves 97 around the direct bonding between the first bonding layer 53 and the second bonding layer 69, there is no danger of current leakage paths occurring. Therefore, there is no danger of current leakage and short failures between the first and second bonding layers 53 and 69 of adjacent memory cells.

Figure 23B:
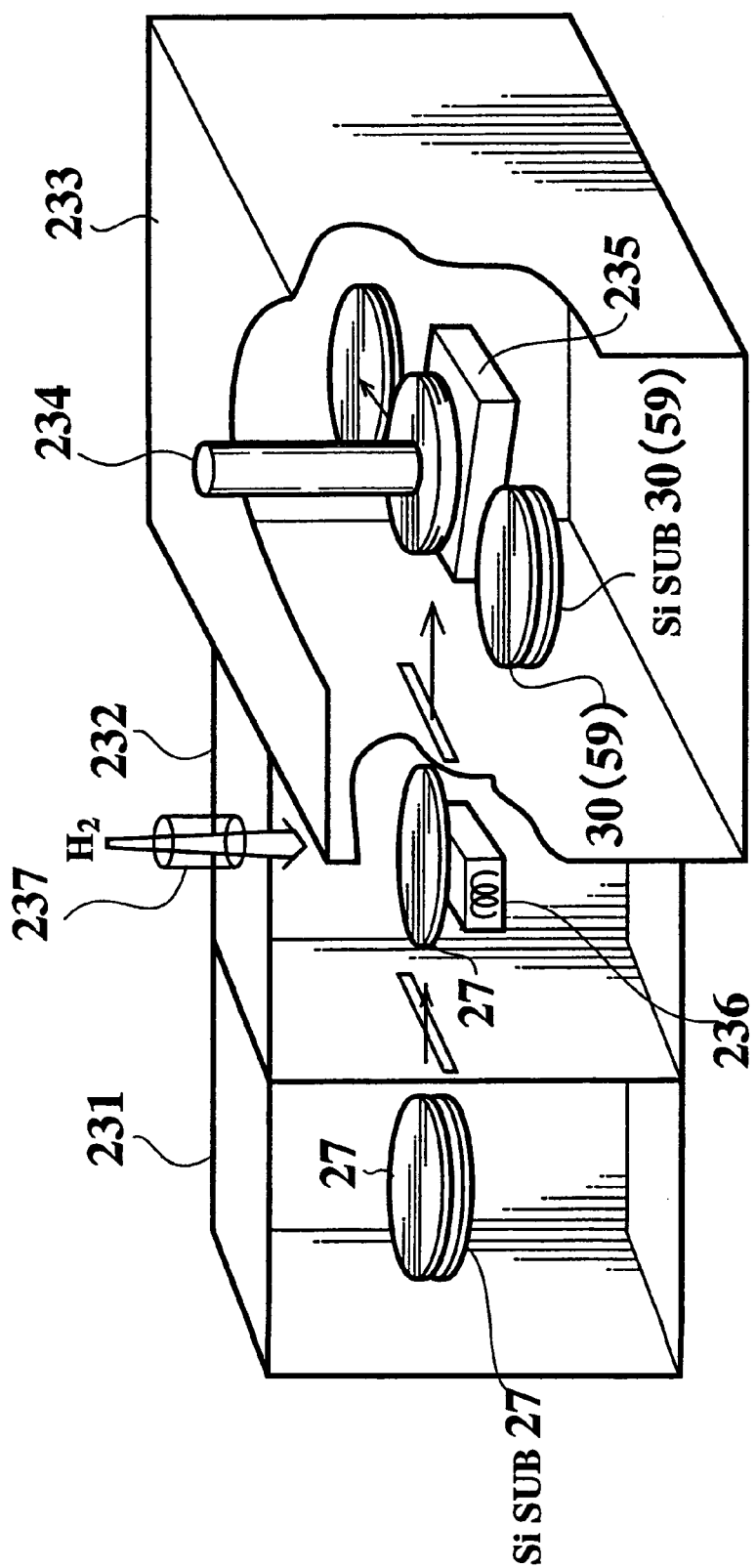
FIG. 23B is a diagram showing a bonding equipment for hydrogen-reducing surface of semiconductor substrates and bonding two semiconductor substrates together without exposing them to the atmosphere.

FIG. 23B shows a bonding equipment which can be used when a new Cu surface is revealed in an ultrahigh vacuum and the semiconductor substrate 27 is bonded to the second semiconductor substrate 59 without exposing the new Cu surface to the atmosphere in step (d) above. As shown in FIG. 23B, a film deposition chamber 231 is connected to a reducing chamber 232, and the reducing chamber 232 is connected to the direct bonding chamber 233, via gate valves (not shown in the diagram). Furthermore, the film deposition chamber 231, the reducing chamber 232 and the direct bonding chamber 233 are connected to an ultra-high vacuum pump such as a cryo pump or a turbomolecular pump (not shown in the diagram), so as to evacuate these chambers 231, 232, 233 to pressure not greater than $4 \times 10^{-6}$ Pa. A hydrogen gas injecting hole for reduction processing 237 is provided in the reducing chamber 232, which can be controlled to a predetermined flow rate by a mass flow controller or the like. Furthermore, a heater 236, capable of annealing the first semiconductor substrate 27 and the second semiconductor substrate 59 to a predetermined temperature, for instance 400° C., is provided inside the reducing chamber 232. Annealing can be either by infrared lamp heating or resistance heating, but cleaner annealing can be achieved by infrared heating. A cassette capable of holding a plurality of semiconductor substrates, a stage 235, which the first semiconductor substrate 27 and the second semiconductor substrate 59 are provided upon and which comprises a heater capable of annealing to a predetermined temperature, and a press 234, capable of applying a predetermined pressure to direct bond the first semiconductor substrate 27 and the second semiconductor substrate 59, are provided inside the direct bonding chamber 233. A vacuum preparation chamber is connected to the film deposition chamber 231 via another gate valve which is not shown in the diagram. The first semiconductor substrate 27 and the second semiconductor substrate 30 can be transferred from the vacuum preparation chamber in an air-locked state. Cu film, as the first bonding layer 53 and the second bonding layer 64, can be deposited in the film deposition chamber 231 by CVD, vacuum deposition or sputtering. After depositing the Cu film, the gate valve is opened and the first semiconductor substrate 27 and the second semiconductor substrate 59 are transferred in a vacuum to the reducing chamber 232. In the reducing chamber 232, the Cu film, comprising the first bonding layer 53 and the second bonding layer 69, is reduced in hydrogen at 400° C. for a predetermined period of time (for instance, 10~30 minutes). When reduction has been completed, the gate valve is opened and the first semiconductor substrate 27 and the second semiconductor substrate 59 are transferred in a vacuum to the direct bonding chamber 233. More specifically, a sequence is acceptable wherein, firstly, a plurality of first semiconductor substrates 27 are processed in sequence while being vacuum-transferred through the film deposition chamber 231, the reducing chamber 232 and the direct bonding chamber 233, where they are temporarily held in a cassette provided inside the direct bonding chamber 233; and next, the second semiconductor substrates 59 are similarly processed in sequence while being vacuum-transferred through the film deposition chamber 231, the reducing chamber 232 and the direct bonding chamber 233. Alternatively, a sequence is acceptable wherein, firstly, the second semiconductor substrates 59 are processed in sequence while being vacuum-transferred through the film deposition chamber 231, the reducing chamber 232 and the direct bonding chamber 233, where they are temporarily held in a cassette provided inside the direct bonding chamber 233; and next, the first semiconductor substrates 27 are similarly processed in sequence while being vacuum-transferred through the film deposition chamber 231, the reducing chamber 232 and the direct bonding chamber 233. Inside the direct bonding chamber 233, the first semiconductor substrate 27 and the second semiconductor substrate 59 are mounted on a stage 235, direct bonded by the press 234 with a predetermined pressure at 400° C. for 30 minutes, and thereby bonded (directly bonded) together. According to the method for manufacturing a semiconductor memory device of the eighth embodiment of the present invention, the position of the capacitor of each cell with respect to the main electrode layer of each switching transistor is determined after the first and second semiconductor substrates 27 and 59 have been bonded together, since the capacitor of each cell is separated and formed in the photolithography step after the first and second semiconductor substrates 27 and 59 have been bonded together. Therefore, a slight deviation in the bond between the first and second semiconductor substrates is permissible. In other words, position alignment needs only to be sufficiently precise so that the positions of the rims of the first and second semiconductor substrates are aligned together. Therefore, as shown in FIG. 23B, since no complex apparatus are included in the vacuum chamber, few out gas elements escape from these apparatus into the vacuum, so that a vacuum of pressure lower than $4 \times 10^{-6}$ Pa can easily be achieved. Therefore, a highly reliable direct bonding between the first bonding layer 53 and the second bonding layer 69 can be achieved. As a result, the semiconductor memory device has high performance and high reliability.

Other Embodiments

As above-mentioned, the present invention has been described in connection with the first to the eighth embodiments. Descriptions and drawings in a part of the present disclosure should not be understood to limit the present invention. Various modifications will become possible for those skilled in the art after receiving the teachings of the present disclosure without departing from the scope thereof.

For example, in above-mentioned embodiments, the case of using p-type Si {100} substrate and n-channel MOSFET as a switching transistor has been described. However, reversing n-type and p-type in above-mentioned description, use of p-channel MOSFET as a switching transistor may be possible. A CMOS configuration is also possible. Though the case of using SrRuO$_3$ films as the first and the second electrode layers of an epitaxial planar capacitor has been described in above-mentioned description, the electrode layer material is not limited to SrRuO$_3$ film. Similar function, result or effectiveness can be obtained in the case where at least a part of the first electrode layer or the second electrode layer is formed by {100} plane of a cubic crystal or {001} plane of a tetragonal crystal such as SrMoO$_3$, SrNiO$_3$, (La, Sr)CuO$_3$ or another material besides SrRuO$_3$.

Though the case of using BSTO thin film layer as a dielectric thin film has been described, it is not necessary to be BSTO thin film layer provided that at least a part of the dielectric thin film is formed by {100} plane of a perovskite crystal or {001} plane of a tetragonal or of a layered perovskite crystal. Namely, the dielectric thin film can be a perovskite crystal represented by a general formula ABO$_3$. Here A is at least one selected from a group of Ba, Sr and Ca. And B is at least one selected from a group of Ti, Zr, Hf, Sn, $(Mg_{1/3}Nb_{2/3})$, $(Mg_{1/3}Ta_{2/3})$, $(Zn_{1/3}Nb_{2/3})$, $(Zn_{1/3}Ta_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Nb_{1/2})$, $(Mn_{1/2}Nb_{1/2})$, $(Sc_{1/2}Ta_{1/2})$, $(Fe_{1/2}Nb_{1/2})$, $(In_{1/2}Nb_{1/2})$, $(Fe_{1/2}Ta_{1/2})$, $(Cd_{1/3}Nb_{2/3})$, $(Co_{1/3}Ta_{2/3})$, $(Ni_{1/3}Nb_{2/3})$, $(Co_{1/3}Ta_{2/3})$ and $(Ni_{1/3}Ta_{2/3})$.

As above-mentioned, the present invention should be understood to comprise various other embodiments and other materials. Consequently, the present invention is construed broadly within its sprit and scope as set out in the accompanying claims.

What is claimed is:

1. A method for manufacturing semiconductor memory device comprising the steps of:
   (a) growing epitaxially a first electrode layer of capacitor above a first main surface of a semiconductor substrate having first and second main surfaces facing each other;
   (b) growing epitaxially a dielectric thin film on the first electrode layer;
   (c) forming a second electrode layer of a capacitor on the dielectric thin film;
   (d) preparing a supporting substrate and bonding a surface formed above the first main surface of the semiconductor substrate with the supporting substrate through a bonding layer;
   (e) adjusting thickness of the semiconductor substrate by removing a part of the second main surface of the semiconductor substrate; and
   (f) forming a switching transistor in the second main surface of the semiconductor substrate.

2. The method of claim 1, after growing epitaxially said first electrode layer, comprising the additional steps of:
   digging first and second grooves penetrating said first electrode layer and further, selectively removing a part of a first main surface of the semiconductor substrate;
   burying the first groove with a first insulating film to form a capacitor isolation region; and,
   burying the second groove with a second insulating film to form an element isolation region.

3. The method of claim 2, wherein said step of adjusting thickness exposes the element isolation region, and, after said step of adjusting thickness, comprising the additional steps of;
   forming a contact plug adjacently to the element isolation region to connect the switching transistor with the first electrode layer.

4. The method of claim 1, after growing epitaxially said second electrode layer, comprising the additional steps of:
   forming a first and a second groove penetrating said second electrode layer, said dielectric thin film and said first electrode layer and further removing selectively a part of the first main surface of said semiconductor substrate;
   burying the first groove with an insulating film to form a capacitor isolation region; and
   burying the second groove with another insulating film to form an element isolation region.

5. The method of claim 4, wherein said step of adjusting thickness exposes the element isolation region, and, after said step of adjusting thickness, comprising the additional steps of;
   forming a contact plug adjacently to the element isolation region to connect the switching transistor with the first electrode layer.

6. The method of claim 4, after burying said first and said second groove, comprising the additional steps of:
   forming a conductive thin film above the second electrode layer; and
   forming a drive line by patterning the conductive thin film.

7. The method of claim 1, after adjusting the thickness of said semiconductor substrate, comprising the additional steps of:
   forming a groove from a second main surface of said semiconductor substrate down to said dielectric thin film; and
   burying the groove with an insulating film to form an element isolation region.

8. The method of claim 7, after forming the groove, comprising the additional steps of:
   forming a contact plug adjacently to said element isolation region to connect said switching transistor with said first electrode layer.

9. The method of claim 1, after adjusting the thickness of said semiconductor substrate, comprising the additional steps of:
   forming a groove from a second main surface of said semiconductor substrate down to said dielectric thin film;
   burying the groove with an insulating film to form a capacitor isolation region;
   etching back a part of the upper portion of the insulating film buried in the groove; and
   burying a semiconductor single crystal into the etched back portion.

10. The method of claim 1, before growing epitaxially said first electrode layer, comprising the additional steps of:
    forming a second groove in the first main surface of said semiconductor substrate; and
    burying the second groove with an insulating film to form an element isolation region.

11. The method of claim 10, after epitaxially growing said second electrode layer, comprising the additional steps of:
    forming a first groove penetrating said second electrode layer, said dielectric thin film and said first electrode layer and further selectively removing a part of the first main surface of said semiconductor substrate;
    burying the first groove with a first insulating film to form a capacitor isolation region; and,
    burying the second groove with a second insulating film to form an element isolation region.

12. The method of claim 1, further comprising the steps of:
   forming an buried insulating film on the first main surface of the semiconductor substrate, before growing epitaxially the first electrode layer;
   forming a first groove removing a part of the first electrode layer and exposing the buried insulating film, after growing epitaxially the first electrode layer;
   forming a second groove penetrating the first electrode layer and the buried insulating film and further selectively removing a part of the first main surface of the semiconductor substrate;
   burying the first groove with an insulating film to form a capacitor isolation region; and,
   burying the second groove with another insulating film to form an element isolation region.

13. The method of claim 1, wherein said dielectric thin film is a perovskite crystal represented by a general formula $ABO_3$, wherein A is at least one selected from the group consisting of Ba, Sr and Ca, and B is at least one selected from the group consisting of Ti, Zr, Hf, Sn, $(Mg_{1/3}Nb_{2/3})$, $(Mg_{1/3}Ta_{2/3})$, $(Zn_{1/3}Nb_{2/3})$, $(Zn_{1/3}Ta_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Nb_{1/2})$, $(Mn_{1/2}Nb_{1/2})$, $(Sc_{1/2}Ta_{1/2})$, $(Fe_{1/2}Nb_{1/2})$, $(In_{1/2}Nb_{1/2})$, $(Fe_{1/2}Ta_{1/2})$, $(Cd_{1/3}Nb_{2/3})$, $(Co_{1/3}Nb_{2/3})$, $(Ni_{1/3}Nb_{2/3})$, $(Co_{1/3}Ta_{2/3})$, $(Ni_{1/3}Ta_{2/3})$.

14. The method of claim 13, wherein said perovskite crystal is barium strontium titanate ($Ba_xSr_{1-x}TiO_3$).

15. A method for manufacturing a semiconductor memory device comprising the steps of:
   (a) fabricating a switching transistor on a first semiconductor substrate, planarizing a topmost surface thereof and preparing the topmost surface as a substrate surface;
   (b) forming a flat first bonding layer, connected to a main electrode region of said switching transistor, over the entire substrate surface;
   (c) forming a flat second bonding layer over the entire surface of a second semiconductor substrate;
   (d) aligning said second bonding layer with said first bonding layer;
   (e) bonding said first and said second semiconductor substrates together;
   (f) after said step of bonding, adjusting thickness of said second semiconductor substrate to a thickness;
   (g) forming at least one part of a multilayered structure, comprising a first electrode layer, a dielectric thin film and a second electrode layer, on said second semiconductor substrate by epitaxial growth; and
   (h) separating said first, second bonding layers and said at least one part of the multilayered structure into a plurality of patterns so that a separate capacitor is available for each memory cell.

* * * * *